(12) United States Patent
Kimura et al.

(10) Patent No.: US 11,515,873 B2
(45) Date of Patent: Nov. 29, 2022

(54) SEMICONDUCTOR DEVICE AND ELECTRONIC DEVICE

(71) Applicant: Semiconductor Energy Laboratory Co., Ltd., Atsugi (JP)

(72) Inventors: Hajime Kimura, Atsugi (JP); Yoshiyuki Kurokawa, Sagamihara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 790 days.

(21) Appl. No.: 16/449,595

(22) Filed: Jun. 24, 2019

(65) Prior Publication Data

US 2020/0007114 A1   Jan. 2, 2020

(30) Foreign Application Priority Data

Jun. 29, 2018   (JP) .............................. JP2018-124122

(51) Int. Cl.
*H03K 17/693*   (2006.01)
*H03K 3/037*   (2006.01)
(Continued)

(52) U.S. Cl.
CPC ............ *H03K 17/693* (2013.01); *G06N 3/04* (2013.01); *G06N 3/08* (2013.01); *H03K 3/037* (2013.01);
(Continued)

(58) Field of Classification Search
CPC .. H03K 17/002; H03K 17/284; H03K 17/687; H03K 17/6871; H03K 17/693; H03K 2017/6878; G06N 3/04
See application file for complete search history.

(56) References Cited

U.S. PATENT DOCUMENTS 8,710,505 B2   4/2014   Kimura
8,803,591 B1   8/2014   Roy et al.
(Continued)

FOREIGN PATENT DOCUMENTS

JP           5885719        3/2016
JP     2017-228295 A      12/2017

OTHER PUBLICATIONS

Miyashita.D et al., "Time-Domain Neural Network:A 48.5 TSOp/s/W Neuromorphic Chip Optimized for Deep Learning and CMOS Technology", IEEE ASSCC 2016 (IEEE Asian Solid-State Circuits Conference), Nov. 7, 2016, pp. 25-28.

(Continued)

*Primary Examiner* — Patrick O Neill
(74) *Attorney, Agent, or Firm* — Robinson Intellectual Property Law Office; Eric J. Robinson

(57) ABSTRACT

A semiconductor device that can perform product-sum operation with low power is provided. The semiconductor device includes a switching circuit. The switching circuit includes first to fourth terminals. The switching circuit has a function of selecting one of the third terminal and the fourth terminal as electrical connection destination of the first terminal, and selecting the other of the third terminal and the fourth terminal as electrical connection destination of the second terminal, on the basis of first data. The switching circuit includes a first transistor and a second transistor each having a back gate. The switching circuit has a function of determining a signal-transmission speed between the first terminal and one of the third terminal and the fourth terminal and a signal-transmission speed between the second terminal and the other of the third terminal and the fourth terminal on the basis of potentials of the back gates. The potentials are determined by second data. When signals are input to the first terminal and the second terminal, a time lag between the signals output from the third terminal (Continued)

and the fourth terminal is determined by the first data and the second data.

12 Claims, 41 Drawing Sheets

(51) Int. Cl.
*G06N 3/08* (2006.01)
*H03K 17/687* (2006.01)
*H03K 17/00* (2006.01)
*G06N 3/04* (2006.01)

(52) U.S. Cl.
CPC ......... *H03K 17/002* (2013.01); *H03K 17/687* (2013.01); *H03K 2017/6878* (2013.01)

(56) References Cited

U.S. PATENT DOCUMENTS

| | | | |
|---|---|---|---|
| 8,866,510 B2 | 10/2014 | Tanabe et al. | |
| 8,878,589 B2 | 11/2014 | Kimura | |
| 8,988,152 B2 | 3/2015 | Ohmaru et al. | |
| 9,136,287 B2 | 9/2015 | Kimura | |
| 9,142,683 B2 | 9/2015 | Yamazaki et al. | |
| 9,344,037 B2 | 5/2016 | Okamoto et al. | |
| 9,361,577 B2 | 6/2016 | Miyashita | |
| 9,397,637 B2 | 7/2016 | Kozuma et al. | |
| 9,461,126 B2 | 10/2016 | Yamazaki et al. | |
| 9,508,759 B2 | 11/2016 | Kimura | |
| 9,666,606 B2 | 5/2017 | Matsuzaki et al. | |
| 9,742,419 B2 | 8/2017 | Okamoto et al. | |
| 9,843,308 B2 | 12/2017 | Kozuma et al. | |
| 9,887,299 B2 | 2/2018 | Yamazaki et al. | |
| 9,899,424 B2 | 2/2018 | Matsuzaki et al. | |
| 9,935,143 B2 | 4/2018 | Ohmaru et al. | |
| 10,038,402 B2 | 7/2018 | Okamoto et al. | |
| 10,224,906 B2 | 3/2019 | Yamamoto | |
| 10,236,387 B2 | 3/2019 | Shionoiri et al. | |
| 10,333,521 B2 | 6/2019 | Okamoto | |
| 10,651,790 B2 | 5/2020 | Okamoto et al. | |
| 2007/0262793 A1 | 11/2007 | Kapoor | |
| 2013/0003269 A1 | 1/2013 | Kimura | |
| 2013/0032806 A1 | 2/2013 | Kimura | |
| 2015/0074028 A1 | 3/2015 | Miyashita | |
| 2015/0256156 A1 | 9/2015 | Kozuma et al. | |
| 2016/0028347 A1 | 1/2016 | Okamoto et al. | |
| 2016/0343452 A1 | 11/2016 | Ikeda et al. | |
| 2017/0126176 A1 | 5/2017 | Okamoto et al. | |
| 2017/0154909 A1 | 6/2017 | Ishizu | |
| 2017/0331479 A1 | 11/2017 | Okamoto | |
| 2017/0364791 A1* | 12/2017 | Miyashita | G06F 7/48 |
| 2018/0018752 A1 | 1/2018 | Kurokawa | |
| 2018/0039882 A1 | 2/2018 | Ikeda et al. | |
| 2018/0040274 A1 | 2/2018 | Kurokawa | |
| 2018/0061344 A1 | 3/2018 | Kurokawa | |
| 2018/0175074 A1 | 6/2018 | Kurokawa | |
| 2018/0181862 A1 | 6/2018 | Ikeda | |
| 2018/0211620 A1 | 7/2018 | Kurokawa et al. | |
| 2018/0358925 A1 | 12/2018 | Okamoto et al. | |
| 2019/0147329 A1 | 5/2019 | Hekmatshoartabari | |
| 2019/0371226 A1 | 12/2019 | Iwaki | |
| 2019/0371798 A1 | 12/2019 | Yamazaki et al. | |
| 2020/0028498 A1 | 1/2020 | Kimura et al. | |
| 2020/0105176 A1 | 4/2020 | Kurokawa et al. | |
| 2020/0185528 A1 | 6/2020 | Yamazaki et al. | |
| 2020/0266761 A1 | 8/2020 | Okamoto et al. | |
| 2021/0257016 A1 | 8/2021 | Kimura et al. | |
| 2021/0318856 A1* | 10/2021 | Ikeda | H01L 27/1255 |

OTHER PUBLICATIONS

Miyashita.D et al., "A Neuromorphic Chip Optimized for Deep Learning and CMOS Technology With Time-Domain Analog and Digital Mixed-Signal Processing", IEEE Journal of Solid-State Circuits, Oct. 1, 2017, vol. 52, No. 10, pp. 2679-2689.

* cited by examiner

SEMICONDUCTOR DEVICE AND ELECTRONIC DEVICE

BACKGROUND OF THE INVENTION

1. Field of the Invention

Embodiments of the present invention relate to a semiconductor device and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specific examples of the technical field of one embodiment of the present invention disclosed in this specification include a semiconductor device, a display device, a liquid crystal display device, a light-emitting device, a power storage device, an imaging device, a memory device, a signal processing device, a processor, an electronic device, a system, a method for driving any of them, a method for manufacturing any of them, and a method for inspecting any of them.

2. Description of the Related Art

Integrated circuits that imitate the mechanism of the human brain are currently under active development. The integrated circuits incorporate electronic circuits as the brain mechanism and include circuits corresponding to neurons and synapses of the human brain. Thus, such integrated circuits are sometimes referred to as "neuromorphic" or "brain-morphic" circuits. The integrated circuits have a non-von Neumann architecture and are expected to be able to perform parallel processing with extremely low power consumption as compared with a von Neumann architecture that consumes higher power with increasing processing speed.

An information processing model that imitates a biological neural network including neurons and synapses is referred to as an artificial neural network (ANN). For example, Patent Document 1, Patent Document 2, Non-Patent Document 1, and Non-Patent Document 2 each disclose an arithmetic device including an artificial neural network constructed using resistive random access memory (ReRAM). In particular, Non-Patent Document 1 and Non-Patent Document 2 each disclose a circuit that includes the arithmetic device and imitates the brain mechanism.

REFERENCES

Patent Documents

[Patent Document 1] Japanese Patent No. 5885719
[Patent Document 2] Japanese Published Patent Application No. 2017-228295

Non-Patent Documents

[Non-Patent Document 1] D. Miyashita et al., IEEE Asian Solid-State Circuits Conference, Nov. 7-9, 2016, S4-2 (4077), pp. 25-28.
[Non-Patent Document 2] D. Miyashita et al., IEEE Journal of Solid-State Circuits, Vol. 52, No. 10, October 2017, pp. 2679-2689.

SUMMARY OF THE INVENTION

An artificial neural network performs calculations in which the connection strength of the synapse (also referred to as a weight coefficient in some cases) that connects two neurons is multiplied by a signal transmitted between the two neurons. In particular, in a hierarchical artificial neural network, the connection strength of the synapses between a plurality of first neurons in a first layer and one of second neurons in a second layer and signals input from the plurality of first neurons in the first layer to the one of the second neurons in the second layer need to be multiplied and summed. The number of connection strengths and the number of parameters indicating the signals are determined by the scale of the artificial neural network. That is, in the artificial neural network, as the numbers of layers and neurons increase, the number of circuits corresponding to neurons and synapses also increase, which sometimes makes the amount of calculation enormous.

An increase in the number of circuits included in a chip increases the power consumption and the amount of heat generation during the driving of a device. In particular, as the amount of heat generation increases, the influence on the characteristics of circuit components included in a chip increases; thus, the circuit components included in the chip are preferably less affected by temperatures.

An object of one embodiment of the present invention is to provide a semiconductor device or the like including a hierarchical artificial neural network. Another object of one embodiment of the present invention is to provide a semiconductor device or the like with low power consumption. Another object of one embodiment of the present invention is to provide a semiconductor device or the like that is less affected by the ambient temperature. Another object of one embodiment of the present invention is to provide a novel semiconductor device or the like.

Note that the objects of one embodiment of the present invention are not limited to those listed above. The objects listed above do not preclude the existence of other objects. The other objects are the ones that are not described above and will be described below. The other objects that are not described above will be apparent from and can be derived from the description of the specification, the drawings, and the like by those skilled in the art. One embodiment of the present invention achieves at least one of the above objects and the other objects. One embodiment of the present invention does not necessarily achieve all the above objects and the other objects.

(1) One embodiment of the present invention is a semiconductor device including a circuit that includes a first transistor, a second transistor, a third transistor, a fourth transistor, and a first inverter circuit and a holding unit. The holding unit includes a fifth transistor and a capacitor. The first transistor includes a first gate and a second gate. The second transistor includes a third gate and a fourth gate. A first terminal of the first transistor is electrically connected to a first terminal of the third transistor. A first terminal of the fourth transistor is electrically connected to a first terminal of the second transistor. A second terminal of the first transistor is electrically connected to a second terminal of the second transistor. A second terminal of the fourth transistor is electrically connected to a second terminal of the third transistor. An input terminal of the first inverter circuit is electrically connected to the first gate of the first transistor and a gate of the fourth transistor. An output terminal of the first inverter circuit is electrically connected to the third gate of the second transistor and a gate of the third transistor. A first terminal of the fifth transistor is electrically connected to the second gate of the first transistor, the fourth gate of the second transistor, and the capacitor.

(2) Another embodiment of the present invention is a semiconductor device including a first circuit that includes a first input terminal, a second input terminal, a first output terminal, a second output terminal, a second inverter circuit, a third inverter circuit, a fourth inverter circuit, a fifth inverter circuit, and a switching circuit. The switching circuit includes a first transistor, a second transistor, and a first inverter circuit. The first transistor includes a first gate and a second gate. The second transistor includes a third gate and a fourth gate. The switching circuit includes a third input terminal. The first gate of the first transistor is electrically connected to the third input terminal. The third gate of the second transistor is electrically connected to an output terminal of the first inverter circuit. An input terminal of the first inverter circuit is electrically connected to the third input terminal. The first input terminal is electrically connected to an input terminal of the second inverter circuit. The second input terminal is electrically connected to an input terminal of the third inverter circuit. The first output terminal is electrically connected to an output terminal of the fourth inverter circuit. The second output terminal is electrically connected to an output terminal of the fifth inverter circuit. The switching circuit is configured to establish electrical continuity between an output terminal of the second inverter circuit and an input terminal of one of the fourth inverter circuit and the fifth inverter circuit, and between an output terminal of the third inverter circuit and the input terminal of the other of the fourth inverter circuit and the fifth inverter circuit in response to a signal input to the third input terminal. The switching circuit is also configured to change time from output of a signal from the output terminal of the second inverter circuit to input of the signal to the input terminal of the fourth inverter circuit in response to a potential of the second gate of the first transistor. The switching circuit is also configured to change time from output of a signal from the output terminal of the third inverter circuit to input of the signal to the input terminal of the fourth inverter circuit in response to a potential of the fourth gate of the second transistor.

(3) Another embodiment of the present invention is a semiconductor device including a first circuit that includes a first input terminal, a second input terminal, a first output terminal, a second output terminal, a second circuit, a third circuit, and a switching circuit. The switching circuit includes a first transistor, a second transistor, and a first inverter circuit. The first transistor includes a first gate and a second gate. The second transistor includes a third gate and a fourth gate. The switching circuit includes a third input terminal. The first gate of the first transistor is electrically connected to the third input terminal. The third gate of the second transistor is electrically connected to an output terminal of the first inverter circuit. An input terminal of the first inverter circuit is electrically connected to the third input terminal. The first input terminal is electrically connected to an input terminal of the second circuit. The second input terminal is electrically connected to an input terminal of the third circuit. The second circuit is configured to correct a signal input to the input terminal of the second circuit and output the corrected signal from an output terminal of the second circuit. The third circuit is configured to correct a signal input to the input terminal of the third circuit and output the corrected signal from an output terminal of the third circuit. The switching circuit is configured to establish electrical continuity between the output terminal of the second circuit and one of the first output terminal and the second output terminal and between the output terminal of the third circuit and the other of the first output terminal and the second output terminal in response to a signal input to the third input terminal. The switching circuit is also configured to change time from output of a signal from the output terminal of the second circuit to input of the signal to the first output terminal in response to a potential of the second gate of the first transistor. The switching circuit is also configured to change time from output of a signal from the output terminal of the third circuit to input of the signal to the first output terminal in response to a potential of the fourth gate of the second transistor.

(4) Another embodiment of the present invention is the semiconductor device according to (2) or (3), in which the switching circuit includes a first holding unit. The first holding unit is configured to hold the potential of the second gate of the first transistor and the potential of the fourth gate of the second transistor.

(5) Another embodiment of the present invention is the semiconductor device according to (2) or (3), in which the switching circuit includes a first holding unit and a second holding unit. The first holding unit is configured to hold the potential of the second gate of the first transistor. The second holding unit is configured to hold the potential of the fourth gate of the second transistor.

(6) Another embodiment of the present invention is the semiconductor device according to (2) or (3), in which the switching circuit includes a first holding unit, a second holding unit, a first switch, and a second switch. The first holding unit is electrically connected to the second gate of the first transistor and the fourth gate of the second transistor through the first switch. The second holding unit is electrically connected to the second gate of the first transistor and the fourth gate of the second transistor through the second switch. The switching circuit is configured to establish electrical continuity between one of the first holding unit and the second holding unit and the second gate of the first transistor and the fourth gate of the second transistor when one of the first switch and the second switch is turned on and the other is turned off.

(7) Another embodiment of the present invention is the semiconductor device according to any one of (1) to (6), in which a plurality of first circuits are included. The switching circuit included in each of the plurality of first circuits includes a fourth input terminal. The first output terminal of the first circuit in one stage is electrically connected to the first input terminal of the first circuit in the subsequent stage. The second output terminal of the first circuit in one stage is electrically connected to the second input terminal of the first circuit in the subsequent stage. When potentials corresponding to first data are held in the second gates of the first transistors and the fourth gates of the second transistors in all the first circuits, signals corresponding to second data are input to the third input terminals of all the switching circuits, and input signals are input to the first input terminal and the second input terminal of the first circuit in the first stage, a time lag between output signals from the first output terminal and the second output terminal of the first circuit in the last stage corresponds to the sum of products of the first data and the second data.

(8) Another embodiment of the present invention is the semiconductor device according to (7), in which a fourth circuit is included. The fourth circuit is electrically connected to the first output terminal and the second output terminal of the first circuit in the last stage and is configured to generate a signal based on the time lag between the output signals.

(9) Another embodiment of the present invention is the semiconductor device according to any one of (1) to (8), in which at least one of the first transistor and the second transistor includes a metal oxide in a channel formation region.

(10) Another embodiment of the present invention is a semiconductor device including a first circuit that includes a first input terminal, a second input terminal, a first output terminal, a second output terminal, a first load circuit, a second load circuit, a second inverter circuit, a third inverter circuit, a fourth inverter circuit, a fifth inverter circuit, and a switching circuit. The first input terminal is electrically connected to an input terminal of the second inverter circuit. The second input terminal is electrically connected to an input terminal of the third inverter circuit. The first output terminal is electrically connected to an output terminal of the fourth inverter circuit. The second output terminal is electrically connected to an output terminal of the fifth inverter circuit. An output terminal of the second inverter circuit is electrically connected to a first terminal of the first load circuit. An output terminal of the third inverter circuit is electrically connected to a first terminal of the second load circuit. The switching circuit includes a third input terminal. The first load circuit includes a fifth input terminal and is configured to change a resistance between the first terminal and a second terminal of the first load circuit in response to a signal input to the fifth input terminal. The switching circuit is configured to establish electrical continuity between the second terminal of the first load circuit and an input terminal of one of the fourth inverter circuit and the fifth inverter circuit, and between a second terminal of the second load circuit and the input terminal of the other of the fourth inverter circuit and the fifth inverter circuit in response to a signal input to the third input terminal.

(11) Another embodiment of the present invention is the semiconductor device according to (10), in which the second load circuit includes a sixth input terminal and is configured to change a resistance between the first terminal and the second terminal of the second load circuit in response to a signal input to the sixth input terminal.

(12) Another embodiment of the present invention is the semiconductor device according to (11) or (12), in which the first load circuit includes any one of a variable resistor, an MTJ device, and a phase change memory.

(13) Another embodiment of the present invention is the semiconductor device according to (10) or (11), in which the first load circuit includes a first load element, a second load element, and a seventh input terminal. The first load circuit is configured to select one of the first load element and the second load element in response to a signal input to the seventh input terminal, and establish electrical continuity between the first terminal and the second terminal of the first load circuit through the selected load element.

(14) Another embodiment of the present invention is the semiconductor device according to any one of (10) to (13), in which a plurality of first circuits are included. The first output terminal of the first circuit in one stage is electrically connected to the first input terminal of the first circuit in the subsequent stage. The second output terminal of the first circuit in one stage is electrically connected to the second input terminal of the first circuit in the subsequent stage. When potentials corresponding to first data are input to the fifth input terminals of the first load circuits in all the first circuits, signals corresponding to second data are input to the third input terminals of all the switching circuits, and input signals are input to the first input terminal and the second input terminal of the first circuit in the first stage, a time lag between output signals from the first output terminal and the second output terminal of the first circuit in the last stage corresponds to the sum of products of the first data and the second data.

(15) Another embodiment of the present invention is the semiconductor device according to (14), in which a fourth circuit is included. The fourth circuit is electrically connected to the first output terminal and the second output terminal of the first circuit in the last stage and is configured to generate a signal based on the time lag between the output signals.

(16) Another embodiment of the present invention is an electronic device including the semiconductor device according to any one of (1) to (15) and a housing. The semiconductor device performs arithmetic operation of a neural network.

In this specification and the like, a semiconductor device means a device that utilizes semiconductor characteristics and refers to a circuit including a semiconductor element (e.g., a transistor, a diode, or a photodiode), a device including the circuit, and the like. The semiconductor device also means devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves might be semiconductor devices, or might each include a semiconductor device.

For example, in this specification and the like, description "X and Y are connected" means that X and Y are electrically connected, X and Y are functionally connected, and X and Y are directly connected. Accordingly, without limitation to a predetermined connection relationship, for example, a connection relationship shown in drawings or text, another connection relationship is disclosed in the drawings or the text. Each of X and Y denotes an object (e.g., a device, an element, a circuit, a wiring, an electrode, a terminal, a conductive film, or a layer).

For example, in the case where X and Y are electrically connected, at least one element that enables electrical connection between X and Y (e.g., a switch, a transistor, a capacitor, an inductor, a resistor, a diode, a display element, a light-emitting element, or a load) can be connected between X and Y. Note that a switch is controlled to be turned on or off. That is, a switch is conducting or not conducting (is turned on or off) to determine whether current flows therethrough or not.

For example, in the case where X and Y are functionally connected, at least one circuit that enables functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, or a buffer circuit; a signal generator circuit; a memory circuit; and/or a control circuit) can be connected between X and Y. For example, even when another circuit is provided between X and Y, X and Y are functionally connected when a signal output from X is transmitted to Y.

Note that an explicit description "X and Y are electrically connected" means that X and Y are electrically connected (i.e., X and Y are connected with another element or circuit provided therebetween), X and Y are functionally connected (i.e., X and Y are functionally connected with another circuit provided therebetween), and X and Y are directly connected (i.e., X and Y are connected without another element or circuit provided therebetween). That is, the explicit description "X and Y are electrically connected" is the same as the explicit simple description "X and Y are connected".

Examples of the expressions include "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X and Y each denote an object (e.g., a device, an element, a circuit, a wiring, an electrode, a terminal, a conductive film, or a layer).

Even when a circuit diagram shows that independent components are electrically connected to each other, one component sometimes has functions of a plurality of components. For example, when part of a wiring also serves as an electrode, one conductive film serves as the wiring and the electrode. Thus, the term "electrical connection" in this specification also means such a case where one conductive film has functions of a plurality of components.

In this specification and the like, a transistor includes three terminals: a gate, a source, and a drain. The gate is a control terminal for controlling the on/off state of the transistor. Two terminals functioning as a source and a drain are input/output terminals of the transistor. Functions of the two input/output terminals depend on the conductivity type (n-channel type or p-channel type) of the transistor and the levels of potentials supplied to the three terminals, and one of the two terminals serves as a source and the other serves as a drain. Therefore, the terms "source" and "drain" can be replaced with each other in this specification and the like. In this specification and the like, the terms "one of a source and a drain" (or a first electrode or a first terminal) and "the other of the source and the drain" (or a second electrode or a second terminal) are used to describe the connection relationship of a transistor. Depending on transistor structures, a transistor may have a back gate in addition to the three terminals.

In this specification and the like, a node can be referred to as a terminal, a wiring, an electrode, a conductive layer, a conductor, an impurity region, or the like depending on a circuit configuration, a device structure, or the like. Furthermore, a terminal, a wiring, or the like can be referred to as a node.

In this specification and the like, "voltage" and "potential" can be replaced with each other as appropriate. The term "voltage" refers to a potential difference from a reference potential. When the reference potential is a ground potential, for example, "voltage" can be replaced with "potential". A ground potential does not necessarily mean 0 V. Note that a potential is a relative value, and for example, a potential supplied to a wiring, a potential supplied to a circuit or the like, or a potential output from a circuit or the like changes with a change in a reference potential.

Current means a charge transfer (electrical conduction); for example, the description "electrical conduction of positively charged particles is caused" can be rephrased as "electrical conduction of negatively charged particles is caused in the opposite direction". Therefore, unless otherwise specified, current in this specification and the like refers to a charge transfer (electrical conduction) caused by carrier movement. Examples of a carrier here include an electron, a hole, an anion, a cation, and a complex ion, and the type of carrier differs between current flow systems (e.g., a semiconductor, a metal, an electrolyte solution, and a vacuum). The direction of current in a wiring or the like refers to the direction in which a positive carrier moves, and is expressed as a positive current amount. In other words, the direction in which a negative carrier moves is opposite to the direction of current, and is expressed as a negative current amount. Thus, in the case where the polarity of current (or the direction of current) is not specified in this specification and the like, the description "current flows from an element A to an element B" can be rephrased as "current flows from an element B to an element A", for example. In addition, the description "current is supplied to an element A" can be rephrased as "current is output from an element A", for example.

In this specification and the like, ordinal numbers such as first, second, and third are used in order to avoid confusion among components. Thus, the terms do not limit the number or order of components. In this specification and the like, for example, a "first" component in one embodiment can be referred to as a "second" component in other embodiments or claims. Furthermore, in this specification and the like, for example, a "first" component in one embodiment can be omitted in other embodiments or claims.

In this specification and the like, terms for describing arrangement, such as "over", "above", "under", and "below" are used for convenience to describe the positional relationship between components with reference to drawings in some cases. Furthermore, the positional relationship between components changes as appropriate in accordance with the direction in which each component is described. Thus, the terms are not limited to those used in this specification and the like, and the description can be changed appropriately depending on the situation. For example, the expression "an insulator over (on) a top surface of a conductor" can be replaced with the expression "an insulator on a bottom surface of a conductor" when the direction of a drawing showing these components is rotated by 180°.

The term such as "over", "above", "under", or "below" does not necessarily mean that a component is placed directly on or under and directly in contact with another component. For example, the expression "electrode B over insulating layer A" does not necessarily mean that the electrode B is on and in direct contact with the insulating layer A and can mean the case where another component is provided between the insulating layer A and the electrode B.

In this specification and the like, the terms "film", "layer", and the like can be interchanged with each other depending on the circumstances. For example, in some cases, the term "conductive layer" can be changed into the term "conductive film", and the term "insulating film" can be changed into the term "insulating layer". Moreover, such terms can be replaced with a word not including the term "film" or "layer" depending on the case or circumstances. For example, in some cases, the term "conductive layer" or "conductive film" can be changed into the term "conductor", and the term "insulating layer" or "insulating film" can be changed into the term "insulator".

In this specification and the like, the term such as "electrode" or "wiring" does not limit a function of a component. For example, an "electrode" is used as part of a "wiring" in some cases, and vice versa. Furthermore, the term "electrode" or "wiring" can also mean a combination of a plurality of electrodes or wirings formed in an integrated manner.

In this specification and the like, the terms "wiring", "signal line", "power supply line", and the like can be replaced with each other depending on the case or circumstances. For example, in some cases, the term "signal line" or "power supply line" can be changed into the term "wiring", and vice versa. In some cases, the term "signal line" can be changed into "power supply line", and vice versa. As another example, the term "signal" can be changed into "potential" that is supplied to a wiring and vice versa, depending on the case or circumstances.

In this specification and the like, an impurity in a semiconductor refers to, for example, elements other than the main components of a semiconductor layer. For example, an element with a concentration of lower than 0.1 atomic % is an impurity. When impurities are contained in a semiconductor, the density of states (DOS) may be formed in the semiconductor, the carrier mobility may be decreased, or the crystallinity may be decreased, for example. When the semiconductor is an oxide semiconductor, examples of impurities that change the characteristics of the semiconductor include Group 1 elements, Group 2 elements, Group 13 elements, Group 14 elements, Group 15 elements, and transition metals other than the main components of the semiconductor. Specific examples include hydrogen (included also in water), lithium, sodium, silicon, boron, phosphorus, carbon, and nitrogen. When the semiconductor is an oxide semiconductor, oxygen vacancies may be formed by entry of impurities such as hydrogen, for example. When the semiconductor is a silicon layer, examples of impurities that change the characteristics of the semiconductor include oxygen, Group 1 elements except hydrogen, Group 2 elements, Group 13 elements, and Group 15 elements.

In this specification and the like, a switch is conducting or not conducting (is turned on or off) to determine whether current flows therethrough or not. Alternatively, a switch has a function of selecting and changing a current path. For example, an electrical switch or a mechanical switch can be used. That is, a switch is not limited to a certain element and can be any element capable of controlling current.

Examples of an electrical switch include a transistor (e.g., a bipolar transistor and a MOS transistor), a diode (e.g., a PN diode, a PIN diode, a Schottky diode, a metal-insulator-metal (MIM) diode, a metal-insulator-semiconductor (MIS) diode, and a diode-connected transistor), and a logic circuit in which such elements are combined. In the case of using a transistor as a switch, the on state of the transistor refers to a state in which a source electrode and a drain electrode of the transistor are regarded as being electrically short-circuited. The off state of the transistor refers to a state in which the source electrode and the drain electrode of the transistor are regarded as being electrically disconnected. In the case where a transistor operates just as a switch, there is no particular limitation on the polarity (conductivity type) of the transistor.

An example of a mechanical switch is a switch using a microelectromechanical systems (MEMS) technology. Such a switch includes an electrode that can be moved mechanically, and its conduction and non-conduction is controlled with movement of the electrode.

According to one embodiment of the present invention, a semiconductor device or the like including a hierarchical artificial neural network can be provided. According to another embodiment of the present invention, a semiconductor device or the like with low power consumption can be provided. According to another embodiment of the present invention, a semiconductor device or the like that is less affected by the ambient temperature can be provided. According to another embodiment of the present invention, a novel semiconductor device or the like can be provided.

Note that the effects of one embodiment of the present invention are not limited to the effects listed above. The effects listed above do not preclude the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the above effects in some cases.

BRIEF DESCRIPTION OF THE DRAWINGS

In the accompanying drawings:

FIGS. 2A, 2B1, 2B2, 2C1, and 2C2 are a block diagram and circuit diagrams illustrating configuration examples of circuits in a semiconductor device;

DETAILED DESCRIPTION OF THE INVENTION

Figure 1A:
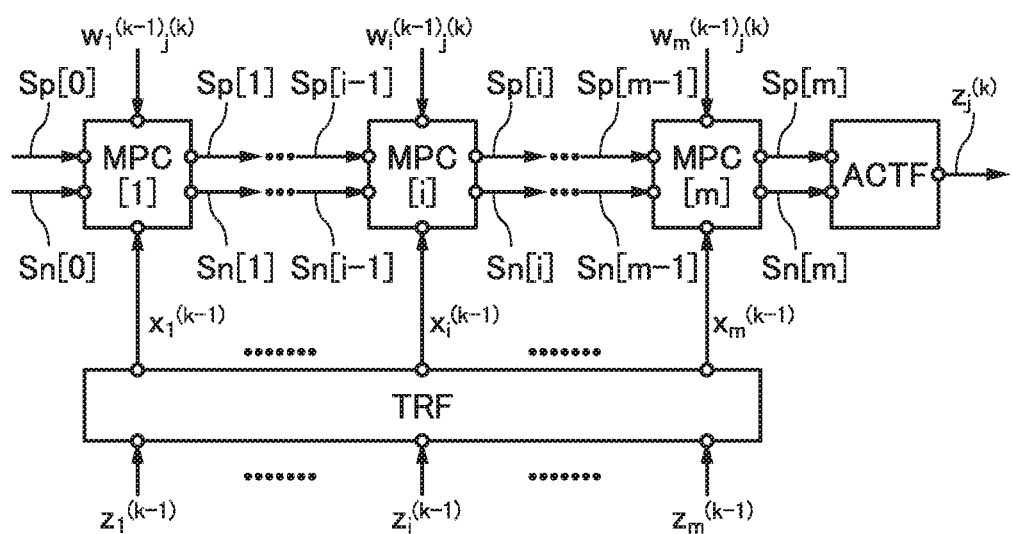
FIGS. 1A to 1C are block diagrams illustrating a configuration example of a semiconductor device.

In an artificial neural network (hereinafter, referred to as a neural network), the connection strength of the synapse can be changed when the neural network is provided with existing information. The processing for determining a connection strength by providing a neural network with existing information in such a manner is called "learning" in some cases.

Furthermore, when a neural network in which "learning" is performed (or a connection strength is determined) is provided with some type of information, new information can be output on the basis of the connection strength. The processing for outputting new information on the basis of provided information and a connection strength in a neural network in such a manner is called "inference" or "recognition" in some cases.

Examples of models of a neural network include a hopfield neural network and a hierarchical neural network. In particular, a multilayer neural network is called a "deep neural network" (DNN), and machine learning using a deep neural network is called "deep learning", in some cases.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. That is, a metal oxide included in a channel formation region of a transistor that has at least one of an amplifying function, a rectifying function, and a switching function can be called a metal oxide semiconductor. An OS FET or an OS transistor refers to a transistor including a metal oxide or an oxide semiconductor.

In this specification and the like, a metal oxide containing nitrogen is also called a metal oxide in some cases. Moreover, a metal oxide containing nitrogen may be called a metal oxynitride.

In this specification and the like, one embodiment of the present invention can be constituted by appropriately combining the structure described in an embodiment with any of the structures described in the other embodiments. In the case where a plurality of structure examples are described in one embodiment, some of the structure examples can be combined as appropriate.

Note that a content (or part thereof) described in one embodiment can be applied to, combined with, or replaced with another content (or part thereof) described in the same embodiment and/or a content (or part thereof) described in another embodiment or other embodiments.

Note that in each embodiment, a content described in the embodiment is a content described with reference to a variety of drawings or a content described with text disclosed in this specification.

By combining a drawing (or part thereof) described in one embodiment with another part of the drawing, a different drawing (or part thereof) described in the embodiment, and/or a drawing (or part thereof) described in another embodiment or other embodiments, much more drawings can be created.

The embodiments in this specification are described with reference to the drawings. Note that the embodiments can be implemented in many different modes, and it will be readily appreciated by those skilled in the art that modes and details can be changed in various ways without departing from the spirit and scope of the present invention. Thus, the present invention should not be interpreted as being limited to the description of the embodiments. Note that in the structures of the invention described in the embodiments, the same portions or portions having similar functions are denoted by the same reference numerals in different drawings, and the description of such portions is omitted in some cases. In perspective views and the like, some of components might not be illustrated for clarity of the drawings.

In this specification and the like, when a plurality of components denoted by the same reference numerals need to be distinguished from each other, "_1", "[n]", "[m, n]", or the like is sometimes added to the reference numerals.

In the drawings in this specification, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes, values, or the like shown in the drawings. For example, the following can be included: variation in signal, voltage, or current due to noise or difference in timing.

Embodiment 1

In this embodiment, an arithmetic circuit that performs arithmetic operation of a neural network and is a semiconductor device of one embodiment of the present invention will be described.

<Hierarchical Neural Network>

Figure 4A:
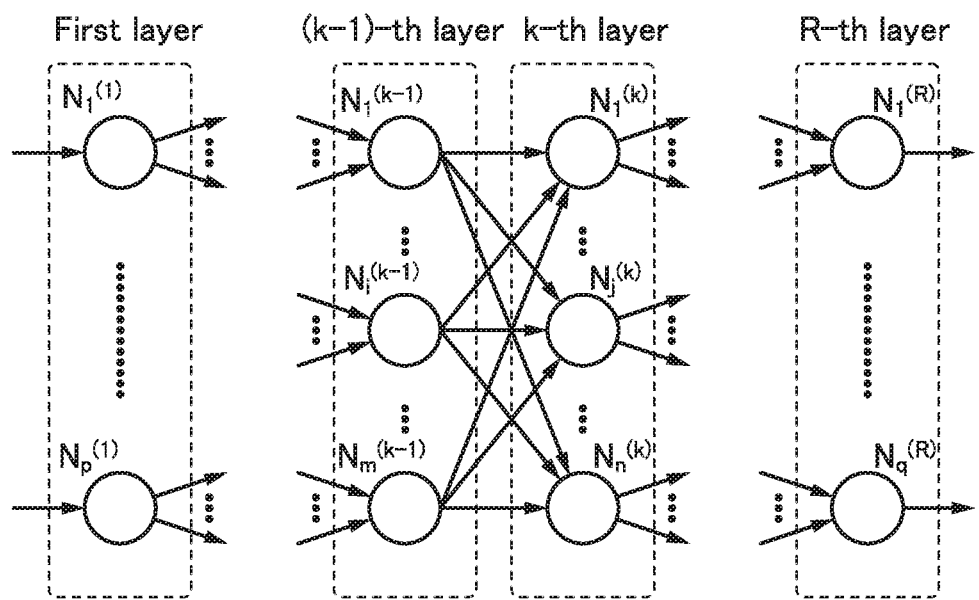
FIGS. 4A and 4B illustrate a hierarchical neural network.

First, a hierarchical neural network is described. The hierarchical neural network includes three or more layers of one input layer, one or more intermediate layers (hidden layers), and one output layer, for example. FIG. 4A illustrates an example of the hierarchical neural network, and a neural network 100 includes first to R-th layers (here, R is an integer greater than or equal to 4). In particular, the first layer is the input layer, the R-th layer is the output layer, and the other layers are the intermediate layers. Note that FIG. 4A illustrates the (k−1)-th layer and the k-th layer (here, k is an integer greater than or equal to 3 and less than or equal to R−1) as the intermediate layers, and the other intermediate layers are not illustrated.

The layers of the neural network 100 each include one or more neurons. In FIG. 4A, the first layer includes neurons $N_1^{(1)}$ to $N_p^{(1)}$ (here, p is an integer greater than or equal to 1). The (k−1)-th layer includes neurons $N_1^{(k-1)}$ to $N_m^{(k-1)}$ (here, m is an integer greater than or equal to 1). The k-th layer includes neurons $N_1^{(k)}$ to $N_n^{(k)}$ (here, n is an integer greater than or equal to 1). The R-th layer includes neurons $N_1^{(R)}$ to $N_q^{(R)}$ (here, q is an integer greater than or equal to 1).

FIG. 4A illustrates, in addition to the neurons $N_1^{(1)}$, $N_p^{(1)}$, $N_1^{(k-1)}$, $N_m^{(k-1)}$, $N_1^{(k)}$, $N_n^{(k)}$, $N_1^{(R)}$, and $N_q^{(R)}$, a neuron $N_i^{(k-1)}$ (here, i is an integer greater than or equal to 1 and less than or equal to m) in the (k−1)-th layer and a neuron $N_j^{(k)}$ (here, j is an integer greater than or equal to 1 and less than or equal to n) in the k-th layer, and the other neurons are not illustrated.

Next, signal transmission from a neuron in one layer to a neuron in the next layer, and signals input to and output from neurons are described. Note that description here is made with a focus on the neuron $N_j^{(k)}$ in the k-th layer.

Figure 4B:
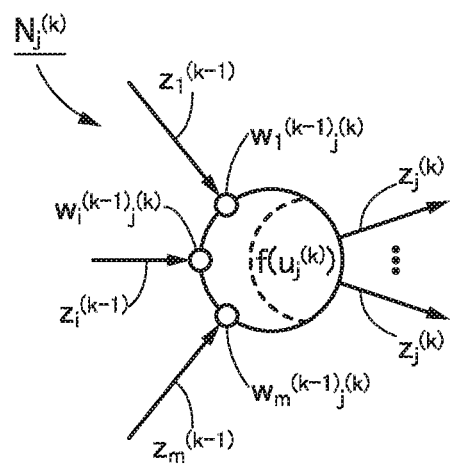

FIG. 4B illustrates the neuron $N_j^{(k)}$ in the k-th layer, signals input to the neuron $N_j^{(k)}$, and a signal output from the neuron $N_j^{(k)}$.

Specifically, output signals $z_1^{(k-1)}$ to $z_m^{(k-1)}$ from the neurons $N_1^{(k-1)}$ to $N_m^{(k-1)}$ in the (k−1)-th layer are input to the neuron $N_j^{(k)}$. Then, the neuron $N_j^{(k)}$ generates an output signal $z_j^{(k)}$ in response to the output signals $z_1^{(k-1)}$ to $z_m^{(k-1)}$, and outputs the output signal $z_j^{(k)}$ to the neurons in the (k+1)-th layer (not illustrated).

The degree of signal transmission from a neuron in one layer to a neuron in the next layer depends on the connection strength (hereinafter, referred to as a weight coefficient) of the synapse that connects the neurons to each other. In the neural network 100, a signal output from a neuron in one layer is multiplied by a corresponding weight coefficient and then is input to a neuron in the next layer. When i is an integer greater than or equal to 1 and less than or equal to m and a weight coefficient of the synapse between the neuron $N_i^{(k-1)}$ in the (k−1)-th layer and the neuron $N_j^{(k)}$ in the k-th layer is $w_i{}^{(k-1)}{}_j{}^{(k)}$, a signal input to the neuron $N_j^{(k)}$ in the k-th layer can be expressed by Formula (1.1).

$$w_i{}^{(k-1)}{}_j{}^{(k)} \cdot z_i^{(k-1)} \tag{1.1}$$

That is, when the signals $z_1^{(k-1)}$ to $z_m^{(k-1)}$ are transmitted from the neurons $N_1^{(k-1)}$ to $N_m^{(k-1)}$ in the (k−1)-th layer to the neuron $N_j^{(k)}$ in the k-th layer, the signals $z_1^{(k-1)}$ to $z_m^{(k-1)}$ are multiplied by respective weight coefficients $w_1{}^{(k-1)}{}_j{}^{(k)}$ to $w_m{}^{(k-1)}{}_j{}^{(k)}$. Then, $w_1{}^{(k-1)}{}_j{}^{(k)} \cdot z_1^{(k-1)}$ to $w_m{}^{(k-1)}{}_j{}^{(k)} \cdot z_m^{(k-1)}$ are input to the neuron $N_j^{(k)}$ in the k-th layer. At that time, the total sum $u_j^{(k)}$ of the signals input to the neuron $N_j^{(k)}$ in the k-th layer is expressed by Formula (1.2).

$$u_j^{(k)} = \sum_{i=1}^{m} w_i{}^{(k-1)}{}_j{}^{(k)} \cdot z_i^{(k-1)} \tag{1.2}$$

The neuron $N_j^{(k)}$ generates the output signal $z_j^{(k)}$ in response to $u_j^{(k)}$. Note that the output signal $z_j^{(k)}$ from the neuron $N_j^{(k)}$ is defined by the following formula.

$$z_j^{(k)} = f(u_j^{(k)}) \tag{1.3}$$

A function $f(u_j^{(k)})$ is an activation function in a hierarchical neural network. A step function, a linear ramp function, a sigmoid function, or the like can be used as the function $f(u_j^{(k)})$. Note that the activation function may be the same among all neurons or may be different among neurons. Furthermore, the neuron activation function in one layer may be the same as or different from that in another layer.

The signals output from the neurons in the layers may each have an analog value or a binary value. In the case of the analog value, the linear ramp function or the sigmoid function is used as the activation function. In the case of the binary value, the step function in which the output is −1 or 1 is used.

In the neural network 100, operation is performed in which an input signal is input to the first layer (input layer), output signals are sequentially generated in the layers from the first layer (input layer) to the last layer (output layer) using the signals input from the previous layers and Formulae (1.1) to (1.3), and the output signals are output to the next layers. The signal output from the last layer (output layer) corresponds to the calculation results of the neural network 100.

<Arithmetic Circuit>

Here, description is made on an arithmetic circuit that can calculate Formulae (1.2) and (1.3) in the neural network 100 using the step function in which the output is −1 or 1 as the activation function of the neuron.

An arithmetic circuit 110 in FIG. 1A is a semiconductor device including circuits MPC[1] to MPC[m], a circuit ACTF, and a converter circuit TRF. The arithmetic circuit 110 processes the signals input to the neuron $N_j^{(k)}$ in the k-th layer in FIGS. 4A and 4B and generates the signal $z_j^{(k)}$ output from the neuron $N_j^{(k)}$. In this specification and the like, in the case where the circuits MPC[1] to MPC[m] are not distinguished from each other, they are referred to as the circuits MPC.

<<Circuit MPC>>

Figure 1B:
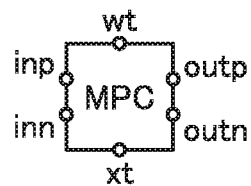

FIG. 1B illustrates terminals included in the circuit MPC. The circuit MPC includes, for example, a terminal inp, a terminal inn, a terminal outp, a terminal outn, a terminal wt, and a terminal xt.

The circuit MPC has a function of outputting a signal input to the terminal inp to one of the terminal outp and the terminal outn and outputting a signal input to the terminal inn to the other. The output destinations of the signals input to the terminal inp and the terminal inn can be determined by a signal input to the terminal xt, for example.

The circuit MPC has a function of changing time from the input of a signal to the terminal inp to the output of the signal from one of the terminal outp and the terminal outn, for example. The time can be determined by a signal input to the terminal wt. In the following description, time from the input of a signal to an input terminal of a circuit to the output of the signal from an output terminal of the circuit is referred to as input/output time.

Figure 2A:
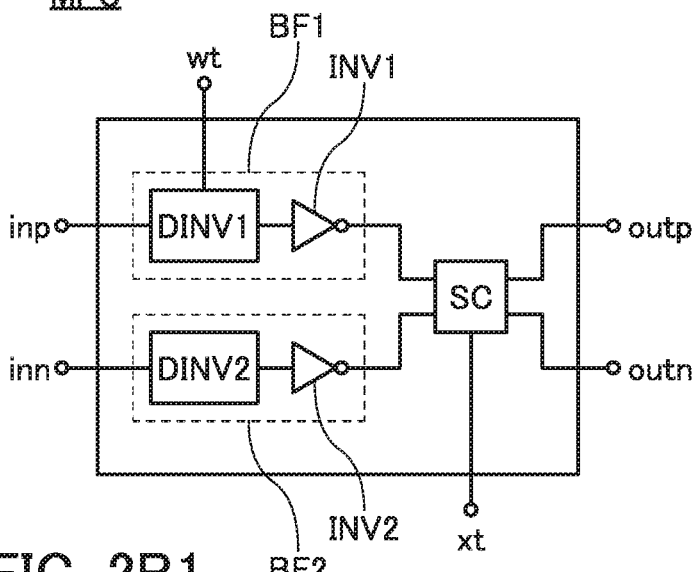
Figure 2A:
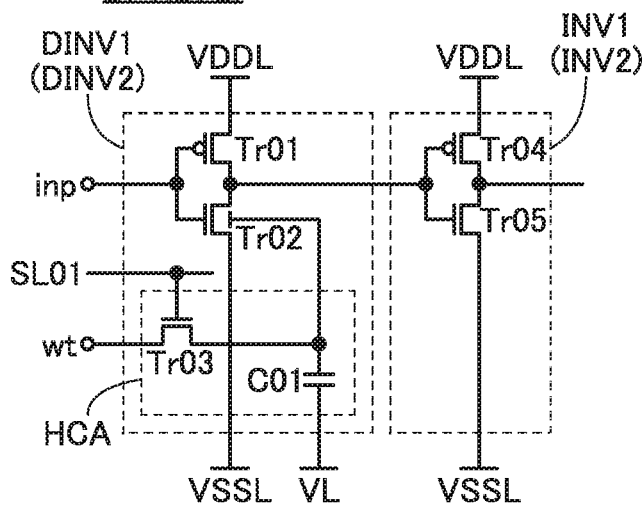
Figure 2A:
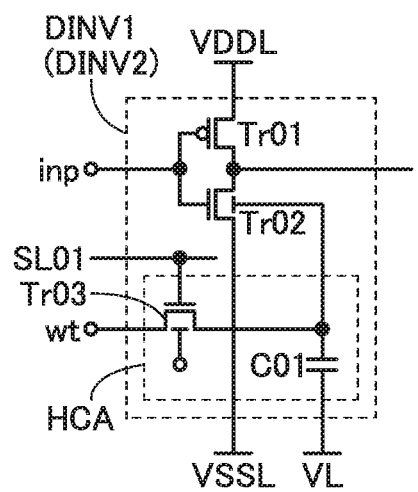
Figure 2A:
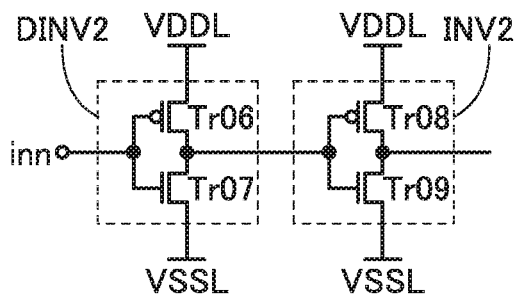
Figure 2A:
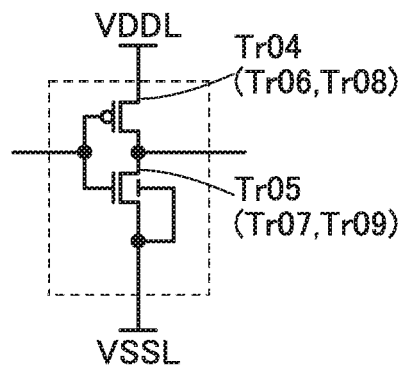

FIG. 2A illustrates a configuration example of the circuit MPC. The circuit MPC in FIG. 2A includes a circuit BF1, a circuit BF2, and a switching circuit SC.

An input terminal of the circuit BF1 is electrically connected to the terminal inp, and an output terminal of the circuit BF1 is electrically connected to one of two input terminals of the switching circuit SC. An input terminal of the circuit BF2 is electrically connected to the terminal inn, and an output terminal of the circuit BF2 is electrically connected to the other input terminal of the switching circuit SC. One of two output terminals of the switching circuit SC is electrically connected to the terminal outp, and the other is electrically connected to the terminal outn.

[Circuit BF1]

The circuit BF1 has a function of correcting a signal input to the input terminal of the circuit BF1 and outputting the signal from the output terminal of the circuit BF1. A circuit in which two inverter circuits are connected in series (a buffer circuit), for example, can be used as the circuit BF1. The number of inverter circuits is not limited to two and is desirably two or more because the input and the output having the same logical value enable the circuit to be configured more easily. The inverter circuit can be replaced with a NAND circuit, a NOR circuit, or the like. Furthermore, a logic circuit, a signal converter circuit, a potential level converter circuit, or the like can sometimes be used as the circuit BF1, for example. The circuit BF1 in FIG. 2A includes an inverter circuit DINV1 and an inverter circuit INV1.

The inverter circuit DINV1 and the inverter circuit INV1 each have a function of outputting an inverted signal of an input signal. In particular, the inverter circuit DINV1 is electrically connected to the terminal wt, and the driving speed of the inverter circuit DINV1 can be determined by the signal input to the terminal wt. In other words, the input/output time of the inverter circuit DINV1 can be changed.

FIG. 2B1 illustrates a specific configuration example of the circuit BF1. For example, the inverter circuit DINV1 includes a transistor Tr01, a transistor Tr02, a transistor Tr03, and a capacitor C01, and the inverter circuit INV1 includes a transistor Tr04 and a transistor Tr05. The transistor Tr01 and the transistor Tr04 are p-channel transistors, and the transistor Tr02, the transistor Tr03, and the transistor Tr05 are n-channel transistors, for example. The transistor Tr02 has a back gate, for example. For another example, the transistor Tr03 may have a back gate. The transistor Tr03 preferably has a low off-state current, for example. Specifically, the transistor Tr03 is preferably an OS transistor. The n-channel transistors other than the transistor Tr03 may also be an OS transistor.

In this specification and the like, for example, transistors with a variety of structures can be used as a transistor, without limitation to a certain type. For example, a transistor including single-crystal silicon or a non-single-crystal semiconductor film typified by amorphous silicon, polycrystalline silicon, microcrystalline (also referred to as microcrystal, nanocrystal, or semi-amorphous) silicon, or the like can be used as a transistor. Alternatively, a thin film transistor (TFT) whose semiconductor film is thinned or the like can be used. In the case of using the TFT, there are various advantages. For example, since the TFT can be formed at a temperature lower than that of the case of using single-crystal silicon, the manufacturing cost can be reduced or a manufacturing apparatus can be made larger. Since the manufacturing apparatus is made larger, the TFT can be formed using a large substrate. Therefore, many display devices can be formed at the same time at low cost. In addition, a substrate having low heat resistance can be used because of low manufacturing temperature. Therefore, the transistor can be formed using a light-transmitting substrate. Transmission of light in a display element can be controlled by using the transistor formed using a light-transmitting substrate. In addition, part of a film included in the transistor can transmit light because the thickness of the transistor is small. Therefore, the aperture ratio can be improved.

Examples of the transistor include a transistor including a compound semiconductor (e.g., SiGe or GaAs) or an oxide semiconductor (e.g., Zn—O, In—Ga—Zn—O, In—Zn—O, In—Sn—O (ITO), Sn—O, Ti—O, Al—Zn—Sn—O, or In—Sn—Zn—O) and a thin film transistor including a thin film of such a compound semiconductor or oxide semiconductor. Since manufacturing temperature can be lowered, such a transistor can be formed at room temperature, for example. Accordingly, the transistor can be formed directly on a substrate having low heat resistance, such as a plastic substrate or a film substrate. Note that such a compound semiconductor or oxide semiconductor can be used not only for a channel portion of the transistor but also for other applications. For example, such a compound semiconductor or oxide semiconductor can be used for a wiring, a resistor, a pixel electrode, a light-transmitting electrode, or the like. Since such an element can be formed at the same time as the transistor, cost can be reduced.

Note that for example, a transistor or the like formed by an ink-jet method or a printing method can be used as the transistor. Accordingly, the transistor can be formed at room temperature, can be formed at a low vacuum, or can be formed using a large substrate. Therefore, the transistor can be formed without use of a mask (reticle), so that the layout of the transistor can be easily changed. Alternatively, since the transistor can be formed without use of a resist, the material cost is reduced, and the number of steps can be reduced. Furthermore, since a film can be formed where needed, a material is not wasted compared to a manufacturing method by which etching is performed after the film is formed over the entire surface; thus, the cost can be reduced.

Note that for example, a transistor or the like including an organic semiconductor or a carbon nanotube can be used as the transistor. Such a transistor can be formed using a flexible substrate. A device that includes a transistor including an organic semiconductor or a carbon nanotube can resist an impact.

Note that a transistor with any of a variety of other structures can also be used as the transistor. For example, a MOS transistor, a junction transistor, a bipolar transistor, or the like can be used as the transistor. By using a MOS transistor as the transistor, the size of the transistor can be reduced. Thus, a large number of transistors can be mounted. By using a bipolar transistor as the transistor, a large amount of current can flow. Thus, a circuit can operate at high speed. Note that a MOS transistor and a bipolar transistor may be formed over one substrate. Thus, a reduction in power consumption, a reduction in size, high-speed operation, and the like can be realized.

Note that for example, a transistor with a structure in which gate electrodes are formed above and below a channel can be used as the transistor. With the structure in which the gate electrodes are formed above and below the channel, a circuit configuration in which a plurality of transistors are connected in parallel is provided. Thus, a channel region is increased, so that the amount of current can be increased. When the structure in which the gate electrodes are formed above and below the channel is employed, a depletion layer is easily formed; thus, the subthreshold swing can be improved.

Note that as the transistor, for example, it is possible to use a transistor with a structure in which a gate electrode is formed above a channel region, a structure in which a gate electrode is formed below a channel region, a staggered structure, an inverted staggered structure, a structure in which a channel region is divided into a plurality of regions, a structure in which channel regions are connected in parallel or in series, or the like. A transistor with any of a variety of structures such as a planar type, a FIN-type, a Tri-Gate type, a top-gate type, a bottom-gate type, a double-gate type (with gates above and below a channel), and the like can be used.

Note that for example, a transistor with a structure in which a source electrode or a drain electrode overlaps with a channel region (or part of it) can be used as the transistor. By using the structure in which the source electrode or the drain electrode overlaps with the channel region (or part of it), unstable operation due to accumulation of electric charge in part of the channel region can be prevented.

Note that for example, a transistor with a structure in which an LDD region is provided can be used as the transistor. Provision of the LDD region enables a reduction in off-state current or an increase in the withstand voltage of the transistor (an improvement in the reliability). By providing the LDD region, the drain current does not change so much even when the drain-source voltage changes when the transistor operates in a saturation region, so that a flat slope of the voltage-current characteristics can be obtained.

In this specification and the like, a transistor can be formed using any of a variety of substrates, for example. The type of substrate is not limited to a certain type. Examples of the substrate include a semiconductor substrate (e.g., a single-crystal substrate or a silicon substrate), an SOI substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, and a base film. Examples of a glass substrate include a barium borosilicate glass substrate, an aluminoborosilicate glass substrate, and a soda lime glass substrate. Examples of a flexible substrate, an attachment film, a base film, and the like include substrates of plastics typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Alternatively, polyamide, polyimide, aramid, epoxy, an inorganic vapor deposition film, and paper can be used. Specifically, the use of a semiconductor substrate, a single-crystal substrate, an SOI substrate, or the like enables the manufacture of small-sized transistors with a small variation in characteristics, size, shape, or the like and with high current capability. A circuit using such transistors achieves lower power consumption or higher integration.

Alternatively, a flexible substrate may be used as the substrate, and the transistor may be formed directly over the flexible substrate. Further alternatively, a separation layer may be provided between the substrate and the transistor. The separation layer can be used when part or the whole of a semiconductor device formed over the separation layer is separated from the substrate and transferred to another substrate. In such a case, the transistor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

In other words, a transistor may be formed using one substrate and then transferred to another substrate. Examples of a substrate to which a transistor is transferred include, in addition to the above substrate over which the transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. When such a substrate is used, a transistor with excellent properties or a transistor with low power consumption can be formed, a device with high durability and high heat resistance can be provided, or a reduction in weight or thickness can be achieved.

Note that all the circuits which are necessary to realize a predetermined function can be formed using one substrate (e.g., a glass substrate, a plastic substrate, a single-crystal substrate, or an SOI substrate). In this manner, the cost can be reduced by a reduction in the number of components or reliability can be improved by a reduction in the number of connection points to circuit components.

Note that not all the circuits which are necessary to realize the predetermined function are needed to be formed using one substrate. That is, part of the circuits which are necessary to realize the predetermined function may be formed using a substrate and another part of the circuits which are necessary to realize the predetermined function may be formed using another substrate. For example, part of the circuits which are necessary to realize the predetermined function can be formed using a glass substrate and another part of the circuits which are necessary to realize the predetermined function can be formed using a single-crystal substrate (or an SOI substrate). The single-crystal substrate over which the another part of the circuits which are necessary to realize the predetermined function (such a substrate is also referred to as an IC chip) can be connected to the glass substrate by chip on glass (COG), and the IC chip can be provided over the glass substrate. Alternatively, the IC chip can be connected to the glass substrate by tape automated bonding (TAB), chip on film (COF), surface mount technology (SMT), a printed circuit board, or the like. When part of the circuits is formed over the same substrate as a pixel portion in this manner, the cost can be reduced by a reduction in the number of components or reliability can be improved by a reduction in the number of connection points to circuit components. In particular, a circuit in a portion where a driving voltage is high, a circuit in a portion where a driving frequency is high, or the like consumes much power in many cases. In view of the above, such a circuit is formed over a substrate (e.g., a single-crystal substrate) different from a substrate over which a pixel portion is formed, whereby an IC chip is formed. The use of this IC chip prevents an increase in power consumption.

In the inverter circuit DINV1, gates of the transistor Tr01 and the transistor Tr02 are electrically connected to the terminal inp, a first terminal of the transistor Tr01 is electrically connected to a wiring VDDL, and a second terminal of the transistor Tr01 is electrically connected to a first terminal of the transistor Tr02. A second terminal of the transistor Tr02 is electrically connected to a wiring VSSL, and the back gate of the transistor Tr02 is electrically connected to a first terminal of the transistor Tr03 and a first terminal of the capacitor C01. A second terminal of the transistor Tr03 is electrically connected to the terminal wt, and a gate of the transistor Tr03 is electrically connected to a wiring SL01. A second terminal of the capacitor C01 is electrically connected to a wiring VL. The second terminal of the transistor Tr01 and the first terminal of the transistor Tr02 are electrically connected to an input terminal of the inverter circuit INV1.

In the inverter circuit INV1, gates of the transistor Tr04 and the transistor Tr05 are electrically connected to the input terminal of the inverter circuit INV1, a first terminal of the transistor Tr04 is electrically connected to the wiring VDDL, and a second terminal of the transistor Tr04 is electrically connected to a first terminal of the transistor Tr05. A second terminal of the transistor Tr05 is electrically connected to the wiring VSSL. The second terminal of the transistor Tr04 and the first terminal of the transistor Tr05 are electrically connected to an output terminal of the inverter circuit INV1.

The wiring VDDL functions as a voltage line for supplying a voltage VDD that is a high-level potential. The wiring VSSL functions as a voltage line for supplying a voltage VSS that is a low-level potential. Note that the wiring VSSL may be supplied with a negative potential, a positive potential, or a potential of 0 V (GND). The wiring VL functions as a voltage line for supplying a constant voltage. The constant voltage can be VDD, VSS, a ground potential, or the like.

In the inverter circuit DINV1, the transistor Tr03 and the capacitor C01 are included in a holding unit HCA. The holding unit HCA has a function of holding a potential corresponding to a signal input from the terminal wt.

The transistor Tr03 included in the holding unit HCA functions as a switching element. Supply of a potential to the gate of the transistor Tr03 from the wiring SL01 can turn on or off the transistor Tr03.

The transistor Tr03 is turned on by supplying a high-level potential to the wiring SL01, whereby electrical continuity can be established between the terminal wt and the first terminal of the capacitor C01. At that time, the circuit MPC receives a signal from the terminal wt, and then can supply a potential corresponding to the signal to the first terminal of the capacitor C01. After the potential is supplied to the first terminal of the capacitor C01, the transistor Tr03 is turned off by supplying a low-level potential to the wiring SL01, whereby the potential can be held in the holding unit HCA.

To hold the potential supplied to the first terminal of the capacitor C01 in the holding unit HCA for a long time, the transistor Tr03 is preferably an OS transistor. In addition, a channel formation region of the transistor Tr03 is preferably formed using an oxide containing at least one of indium, an element M (the element M is aluminum, gallium, yttrium, tin, or the like), and zinc. The transistor Tr03 further preferably has a structure of a transistor described in Embodiment 4.

The OS transistor has an extremely low off-state current because a metal oxide functioning as its channel formation region has a wide band gap. Thus, with the use of the OS transistor as the transistor Tr03, leakage current from the first terminal of the capacitor C01 to the terminal wt in the off state of the transistor Tr03 can be extremely low. That is, the frequency of refreshing the potential of the first terminal of the capacitor C01 can be decreased, reducing the power consumed to hold the potential of the first terminal of the capacitor C01.

Since the transistor Tr02 has the back gate, the threshold voltage of the transistor Tr02 can be changed with the potential supplied to the back gate. In the circuit MPC, the back gate of the transistor Tr02 is connected to the first terminal of the capacitor C01; thus, the threshold voltage of the transistor Tr02 depends on the potential of the first terminal of the capacitor C01.

For example, in the case where the potential of the first terminal of the capacitor C01 is high, the threshold voltage of the transistor Tr02 is shifted negatively; thus, the amount of current flowing between the source and the drain of the transistor Tr02 increases. This shortens the input/output time from the input of a signal to the input terminal of the inverter circuit DINV1 to the output of the signal from the output terminal.

For another example, in the case where the potential of the first terminal of the capacitor C01 is low, the threshold voltage of the transistor Tr02 is shifted positively; thus, the amount of current flowing between the source and the drain of the transistor Tr02 decreases. This lengthens the input/output time from the input of a signal to the input terminal of the inverter circuit DINV1 to the output of the signal from the output terminal.

Specifically, when the transistor Tr02 operates with a potential, which is supplied to the gate of the transistor Tr02, in the range of −0.8 V to 2.5 V inclusive, a high-level potential of 1.5 V or higher and a low-level potential of lower than 1.5 V are supplied to the back gate of the transistor Tr02, for example.

The transistor Tr03 may also have a back gate. FIG. 2B2 illustrates a configuration in which the inverter circuit DINV1 in FIG. 2B1 includes the transistor Tr03 having a back gate. Note that the back gate of the transistor Tr03 can be electrically connected to, for example, the gate of the transistor Tr03. When the gate and the back gate of the transistor Tr03 are electrically connected to each other, the amount of current flowing through the transistor Tr03 in the on state can be increased. For example, the back gate of the transistor Tr03 may be provided with a wiring for electrically connecting to an external circuit, and the threshold voltage of the transistor Tr03 may be increased by supplying a potential to the back gate of the transistor Tr03 from the external circuit. With such a configuration, the off-state current of the transistor Tr03 can be reduced owing to the external circuit.

[Circuit BF2]

FIG. 2A illustrates a configuration in which the circuit BF2 includes an inverter circuit DINV2 and an inverter circuit INV2. Like the circuit BF1, the circuit BF2 functions as an amplifier circuit that amplifies a signal input to the input terminal of the circuit BF2 and outputs the signal from the output terminal of the circuit BF2. Thus, the circuit BF2 can have a configuration similar to that of the circuit BF1 in FIG. 2B1. In that case, the first terminal of the capacitor C01 in the inverter circuit DINV2 preferably holds an intermediate potential between a high-level potential and a low-level potential. The potential of the first terminal of the capacitor C01 in the inverter circuit DINV1 is set to a high-level potential or a low-level potential, whereby the input/output time of the circuit BF1 can be shorter or longer than that of the circuit BF2.

The circuit BF2 may have a configuration illustrated in FIG. 2C1. In FIG. 2C1, the inverter circuit DINV2 includes a transistor Tr06 and a transistor Tr07, and the inverter circuit INV2 includes a transistor Tr08 and a transistor Tr09. The transistors Tr06 and Tr08 are p-channel transistors and the transistors Tr07 and Tr09 are n-channel transistors.

In the inverter circuit DINV2, gates of the transistor Tr06 and the transistor Tr07 are electrically connected to the terminal inn, a first terminal of the transistor Tr06 is electrically connected to the wiring VDDL, and a second terminal of the transistor Tr06 is electrically connected to a first terminal of the transistor Tr07. A second terminal of the transistor Tr07 is electrically connected to the wiring VSSL. The second terminal of the transistor Tr06 and the first terminal of the transistor Tr07 are electrically connected to an input terminal of the inverter circuit INV2.

In the inverter circuit INV2, gates of the transistor Tr08 and the transistor Tr09 are electrically connected to the input terminal of the inverter circuit INV2, a first terminal of the transistor Tr08 is electrically connected to the wiring VDDL, and a second terminal of the transistor Tr08 is electrically connected to a first terminal of the transistor Tr09. A second terminal of the transistor Tr09 is electrically connected to the wiring VSSL. The second terminal of the transistor Tr08 and the first terminal of the transistor Tr09 are electrically connected to an output terminal of the inverter circuit INV2.

That is, the inverter circuit DINV2 can have the same configuration as the inverter circuit INV2. Alternatively, the transistor Tr07 may have a back gate, and the back gate may be connected to the wiring VSSL.

The inverter circuit INV1, the inverter circuit INV2, and the inverter circuit DINV2 may each have a configuration of an inverter circuit INV1A illustrated in FIG. 2C2, for example. The inverter circuit INV1A is different from the inverter circuit INV1, the inverter circuit INV2, and the inverter circuit DINV2 in that the transistor Tr05 (the transistor Tr07 or the transistor Tr09) has a back gate, and the back gate is electrically connected to the second terminal of the transistor Tr05 (the transistor Tr07 or the transistor Tr09).

[Switching Circuit SC]

The switching circuit SC has a function of selecting one of the terminal outp and the terminal outn as the output destination of the signal input to the terminal inp or the terminal inn in the circuit MPC. The switching circuit SC is electrically connected to the terminal xt, and the output destination can be determined by the signal input to the terminal xt (signals $x_1^{(k-1)}$ to $x_m^{(k-1)}$ in FIG. 1A).

Figure 3A:
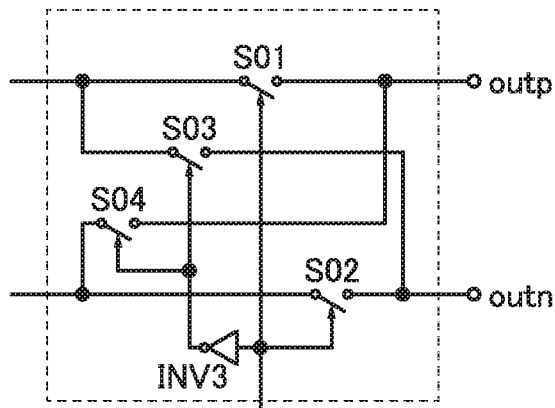
FIGS. 3A to 3D are circuit diagrams illustrating configuration examples of a circuit in a semiconductor device.

FIG. 3A illustrates a configuration example of the switching circuit SC. The switching circuit SC includes switches S01 to S04 and an inverter circuit INV3.

A first terminal of the switch S01 is electrically connected to the output terminal of the circuit BF1 and a first terminal of the switch S03, and a second terminal of the switch S01 is electrically connected to the terminal outp. A first terminal of the switch S02 is electrically connected to the output terminal of the circuit BF2 and a first terminal of the switch S04, and a second terminal of the switch S02 is electrically connected to the terminal outn. A second terminal of the switch S03 is electrically connected to the terminal outn, and a second terminal of the switch S04 is electrically connected to the terminal outp. The terminal xt is electrically connected to control terminals of the switches S01 and S02 and an input terminal of the inverter circuit INV3. An output terminal of the inverter circuit INV3 is electrically connected to control terminals of the switches S03 and S04.

In this specification and the like, the switches S01 to S04 are turned on by supplying a high-level potential to their control terminals, and turned off by supplying a low-level potential to their control terminals.

An operation of the switching circuit SC is described next. For example, the switches S01 and S02 are turned on and the switches S03 and S04 are turned off by supplying a high-level potential to the terminal xt; thus, in the switching circuit SC, the output terminal of the circuit BF1 is electrically connected to the terminal outp and the output terminal of the circuit BF2 is electrically connected to the terminal outn. For another example, the switches S03 and S04 are turned on and the switches S01 and S02 are turned off by supplying a low-level potential to the terminal xt; thus, in the switching circuit SC, the output terminal of the circuit BF1 is electrically connected to the terminal outn and the output terminal of the circuit BF2 is electrically connected to the terminal outp.

Figure 3B:
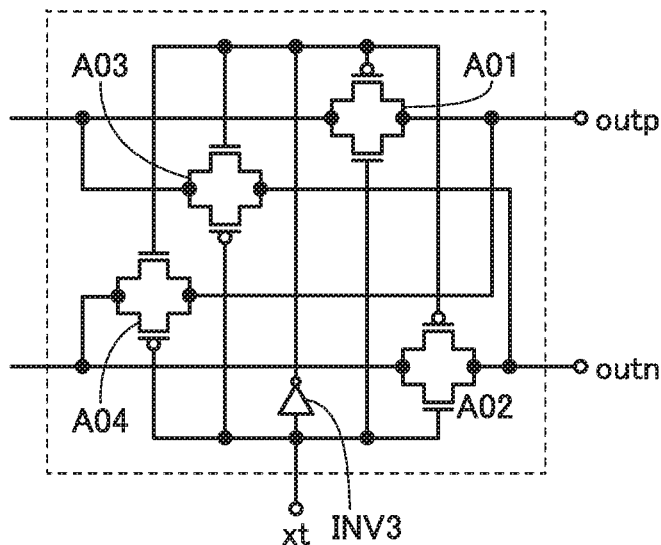

Next, a specific configuration example of the switching circuit SC is described. FIG. 3B illustrates a circuit configuration in which the switches S01 to S04 included in the switching circuit SC in FIG. 3A are replaced with analog switches A01 to A04.

Figure 3C:
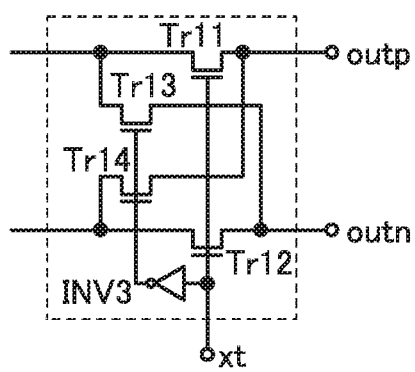

FIG. 3C illustrates a specific configuration example of the switching circuit SC in FIG. 3A, which is different from the configuration in FIG. 3B. The switching circuit SC in FIG. 3C includes transistors Tr11 to Tr14 and the inverter circuit INV3. The transistors Tr11 to Tr14 are n-channel transistors. Note that the control terminals of the switches S01 to S04 correspond to gates of the transistors Tr11 to Tr14.

A first terminal of the transistor Tr11 is electrically connected to the output terminal of the circuit BF1 and a first terminal of the transistor Tr13, and a second terminal of the transistor Tr11 is electrically connected to the terminal outp. A first terminal of the transistor Tr12 is electrically connected to the output terminal of the circuit BF2 and a first terminal of the transistor Tr14, and a second terminal of the transistor Tr12 is electrically connected to the terminal outn. A second terminal of the transistor Tr13 is electrically connected to the terminal outn, and a second terminal of the transistor Tr14 is electrically connected to the terminal outp. The terminal xt is electrically connected to the gates of the transistors Tr11 to Tr14.

Figure 3D:
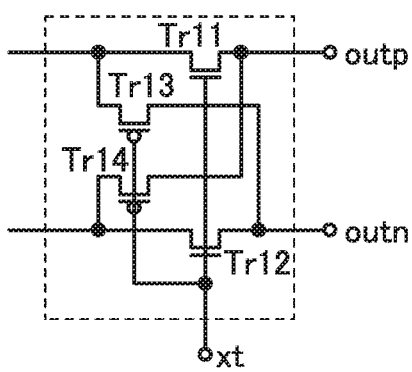

FIG. 3D illustrates a specific configuration example of the switching circuit SC in FIG. 3A, which is different from the configurations in FIGS. 3B and 3C. The switching circuit SC in FIG. 3D includes the transistors Tr11 to Tr14, as in FIG. 3C. The transistors Tr11 and Tr12 are n-channel transistors, and the transistors Tr13 and Tr14 are p-channel transistors. Note that the control terminals of the switches S01 to S04 correspond to the gates of the transistors Tr11 to Tr14. Since the transistors Tr11 and Tr12 have a different polarity from the transistors Tr13 and Tr14, the switching circuit SC in FIG. 3D does not include the inverter circuit INV3.

When the switching circuit SC has any of the configurations in FIGS. 3A to 3D, the signals $x_1^{(k-1)}$ to $x_m^{(k-1)}$ input to the terminal xt can each be a signal with a low-level potential or a signal with a high-level potential.

The configuration of the switching circuit SC used in the circuit MPC can be selected from the configurations in FIGS. 3A to 3D depending on the circumstances. Alternatively, the switching circuit SC used in the circuit MPC may have a configuration different from the configurations in FIGS. 3A to 3D.

<<Circuit ACTF>>

Figure 1C:

FIG. 1C illustrates terminals included in the circuit ACTF. The circuit ACTF includes a terminal inpa, a terminal inna, and a terminal outa.

The circuit ACTF has a function of generating a signal on the basis of the order of and/or a time lag between signals input to the terminal inpa and the terminal inna (signals Sp[m] and Sn[m] in FIG. 1A), and outputting the signal from the terminal outa. Note that the signal corresponds to the signal $z_j^{(k)}$ in FIG. 4B.

For example, the circuit ACTF outputs a signal with a low-level potential from the terminal outa in the case where the signal is input to the terminal inpa after the signal is input to the terminal inna, and outputs a signal with a high-level potential from the terminal outa in the case where the signal is input to the terminal inpa before the signal is input to the terminal inna. In other words, the circuit ACTF outputs a signal with a low-level potential from the terminal outa in the case where the transition of the potential input to the terminal inpa occurs after the transition of the potential input to the terminal inna, and outputs a signal with a high-level potential from the terminal outa in the case where the transition of the potential input to the terminal inpa occurs before the transition of the potential input to the terminal inna. At that time, with the signal $z_j(k)$ with a low-level potential corresponding to −1 and a high-level potential corresponding to 1, the circuit ACTF corresponds to a circuit that performs the arithmetic operation of the step function.

For example, the circuit ACTF may output an analog value using the sigmoid function, the linear ramp function, or the like. Alternatively, the circuit ACTF may have a function of outputting a digital value or an analog value depending on a difference in timing between the signal input to the terminal inpa and the signal input to the terminal inna. That is, the circuit ACTF has a function of performing the arithmetic operation of the activation function of the neuron in the neural network 100.

In the following description of this embodiment, the circuit ACTF is described as a circuit that performs the arithmetic operation of the step function.

In the case where the circuit ACTF performs the arithmetic operation of the step function, a flip-flop circuit can be used as the circuit ACTF. In such a case, the circuit ACTF reads a signal input to the terminal inpa when the transition of a signal input to the terminal inna occurs, and outputs the read signal to the terminal outa.

<<Converter Circuit TRF>>

The converter circuit TRF in the neural network 100 has a function of appropriately converting the signals $z_1^{(k-1)}$ to $z_m^{(k-1)}$ output from the neurons $N_1^{(k-1)}$ to $N_m^{(k-1)}$ in the (k−1)-th layer, and transmitting the converted signals to the circuits MPC[1] to MPC[m].

In FIG. 1A, the signals $z_1^{(k-1)}$ to $z_m^{(k-1)}$ are converted into the signals $x_1^{(k-1)}$ to $x_m^{(k-1)}$, and the signals $x_1^{(k-1)}$ to $x_m^{(k-1)}$ are transmitted to the circuits MPC[1] to MPC[m].

Since the signals $z_1^{(k-1)}$ to $z_m^{(k-1)}$ each have a value of −1 or 1 as described above and the signals $x_1^{(k-1)}$ to $x_m^{(k-1)}$ can each be the signal with a low-level potential or the signal with a high-level as in the description of the switching circuit SC, the converter circuit TRF can serve as a logic circuit.

Conversion of the signals $z_1^{(k-1)}$ to $z_m^{(k-1)}$ by the converter circuit TRF will be described later.

<<Modification Examples of Circuit MPC, Circuit ACTF, Converter Circuit TRF, and the Like>>

Figure 5A:
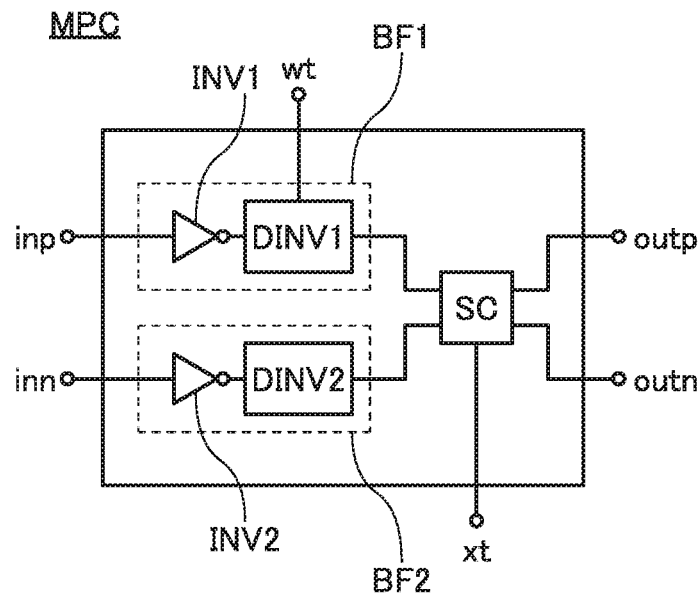
FIGS. 5A and 5B are block diagrams illustrating configuration examples of a circuit in a semiconductor device.
Figure 5B:
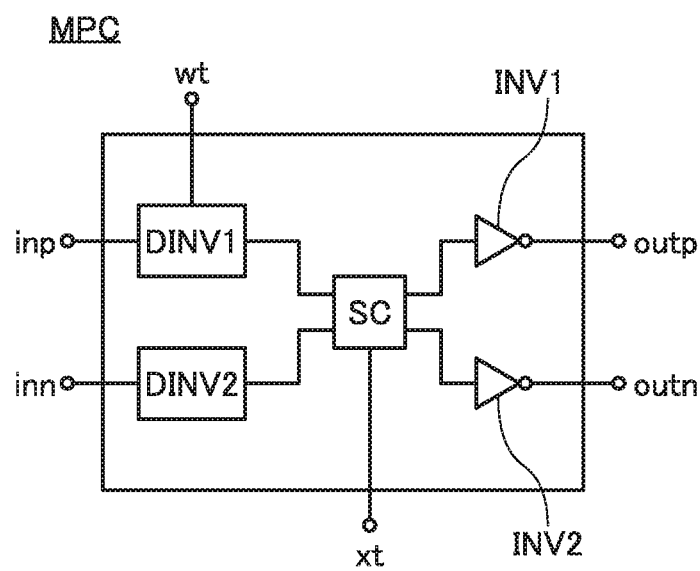

The configuration of the circuit MPC included in the arithmetic circuit 110 in FIG. 1A is not limited to the above and may be changed depending on the circumstances. For example, as a semiconductor device of one embodiment of the present invention, the circuit MPC can have any of configurations in FIGS. 5A and 5B. The circuit MPC in FIG. 5A is different from that in FIG. 2A in the order of electrical connection between the inverter circuit DINV1 and the inverter circuit INV1 in the circuit BF1 and in the order of electrical connection between the inverter circuit DINV2 and the inverter circuit INV2 in the circuit BF2. The circuit MPC in FIG. 5B is different from that in FIG. 2A in the order of electrical connection between the inverter circuit INV1 in the circuit BF1 and the switching circuit SC and in the order of electrical connection between the inverter circuit INV2 and the switching circuit SC.

The transistors included in the circuit MPC, the circuit ACTF, the converter circuit TRF, and the like are preferably OS transistors. In the description of the holding unit HCA, the OS transistor is preferably used as the transistor Tr03. The OS transistor is also preferably used as the other transistors. In particular, in the case where the OS transistor is used as the other transistors, the OS transistor preferably has a structure described in Embodiment 4. Note that one embodiment of the present invention is not limited thereto.

Alternatively, the transistors included in the circuit MPC, the circuit ACTF, the converter circuit TRF, and the like may each be a transistor containing silicon in a channel formation region (hereinafter, referred to as a Si transistor) instead of the OS transistor. As silicon, hydrogenated amorphous silicon, microcrystalline silicon, or polycrystalline silicon can be used, for example. Examples of a transistor other than the OS transistor or the Si transistor include a transistor containing Ge in an active layer, a transistor containing a compound semiconductor such as ZnSe, CdS, GaAs, InP, GaN, or SiGe in an active layer, a transistor containing a carbon nanotube in an active layer, and a transistor containing an organic semiconductor in an active layer.

Note that among the metal oxides contained in the semiconductor layer of the OS transistor, a metal oxide containing indium (e.g., In oxide) and a metal oxide containing zinc (e.g., Zn oxide) that are n-type semiconductors have been manufactured but those that are p-type semiconductors are difficult to manufacture in terms of the mobility and the reliability. Thus, the arithmetic circuit 110 may include the OS transistors as the n-channel transistors and the Si transistors as the p-channel transistors in the circuit MPC, the circuit ACTF, the converter circuit TRF, and the like.

<Operation Method>

An operation method example of the arithmetic circuit 110 is described here.

Figure 6:
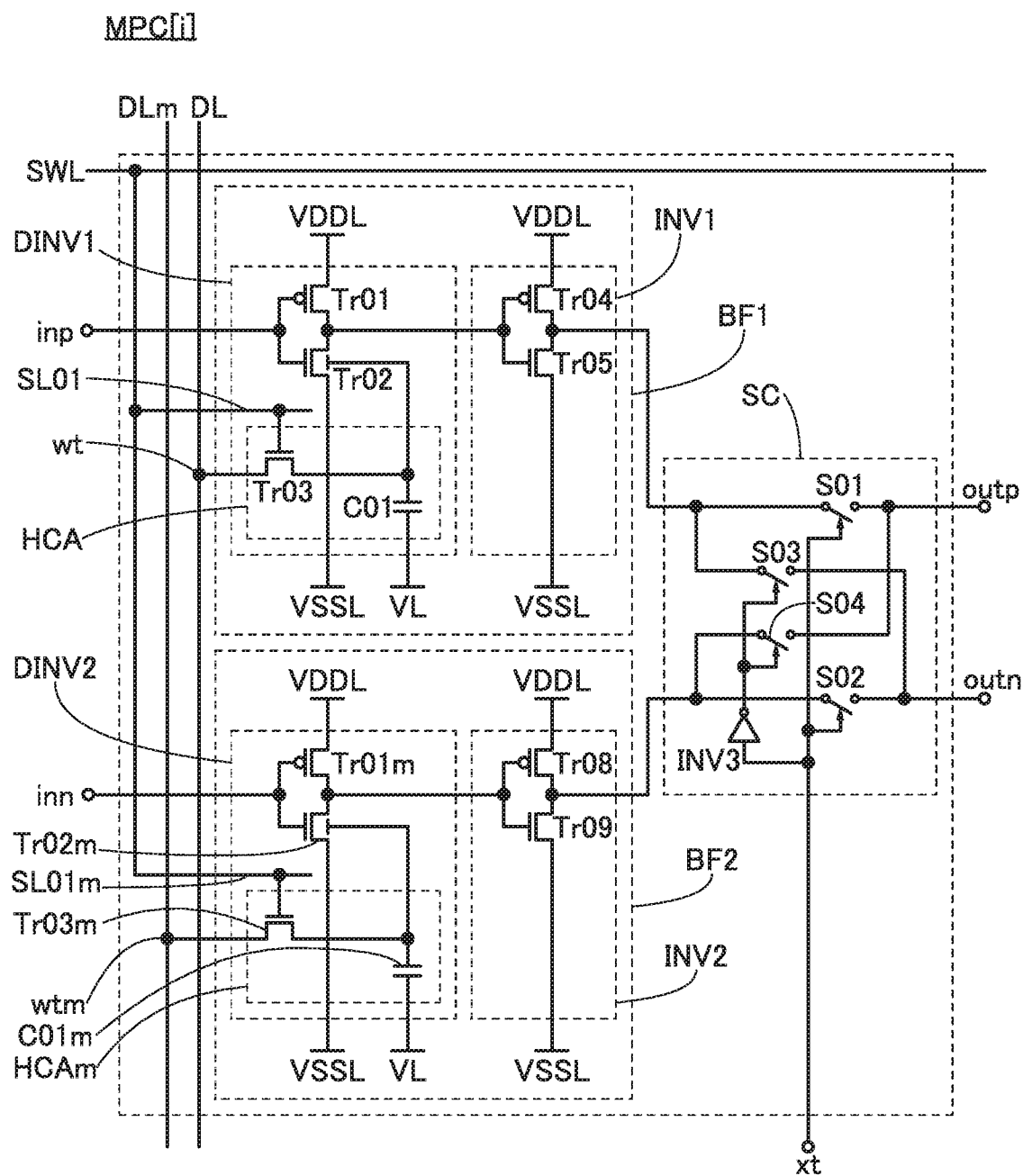
FIG. 6 is a circuit diagram illustrating a configuration example of a circuit in a semiconductor device.

FIG. 6 illustrates a configuration example of the circuit MPC[i] described in this operation example. The circuit MPC[i] includes the circuit BF1 illustrated in FIG. 2B1 as the circuit BF1 and the circuit BF2 and the switching circuit SC illustrated in FIG. 3A.

Note that "m" is added to the end of reference numerals of the circuit components of the inverter circuit DINV2 in the circuit BF2 in FIG. 6 in order to distinguish them from the circuit components of the inverter circuit DINV1 in the circuit BF1. Thus, a holding unit HCAm, a transistor Tr01m, a transistor Tr02m, a transistor Tr03m, a capacitor C01m, and a wiring SL01m in the inverter circuit DINV2 correspond to the holding unit HCA, the transistor Tr01, the transistor Tr02, the transistor Tr03, the capacitor C01, and the wiring SL01 in the inverter circuit DINV1, respectively. A terminal wtm functions as an input terminal for supplying a potential to a first terminal of the capacitor C01m.

In the circuit MPC in FIG. 6, the terminal wt in the holding unit HCA of the circuit BF1 is electrically connected to a wiring DL, and the terminal wtm in the holding unit HCAm of the circuit BF2 is electrically connected to a wiring DLm. In addition, in the circuit MPC in FIG. 6, the wiring SL01 in the circuit BF1 and the wiring SL01m in the circuit BF2 are electrically connected to a wiring SWL.

In this specification and the like, unless otherwise specified, the transistors Tr01 to Tr05, the transistors Tr01m to Tr03m, the transistor Tr08, the transistor Tr09, and the transistors Tr11 to Tr14 may lastly operate in a linear region in the on state. In other words, the gate voltage, the source voltage, and the drain voltage of each of the transistors may be biased as appropriate so that the transistors operate in the linear region.

In this specification and the like, a low-level potential and a high-level potential do not represent any fixed potentials, and specific potentials may vary depending on wirings. For example, a low-level potential and a high-level potential corresponding to signals input to or output from the circuit MPC may be different from a low-level potential and a high-level potential supplied to the wiring SL01.

<<Initial Operation>>

In the initial operation, a potential corresponding to the signal $x_i^{(k-1)}$ is input to the terminal xt. Thus, the transistors Tr11 to Tr14 are turned on or off in response to the potential corresponding to the signal $x_i^{(k-1)}$.

A potential corresponding to the weight coefficient $w_i^{(k-1)}{}_j^{(k)}$ is input to the wiring DL, and an intermediate potential is input to the wiring DLm. After that, a high-level potential is supplied to the wiring SWL to turn on the transistor Tr03 and the transistor Tr03m. With this operation, the potential corresponding to the weight coefficient $w_i^{(k-1)}{}_j^{(k)}$ is supplied to the first terminal of the capacitor C01 and the intermediate potential is supplied to the first terminal of the capacitor C01m. Thus, the threshold voltage of the transistor Tr02 changes with the weight coefficient $w_i^{(k-1)}{}_j^{(k)}$, and the threshold voltage of the transistor Tr02m changes with the intermediate potential. Lastly, a low-level potential is supplied to the wiring SWL to turn off the transistor Tr03 and the transistor Tr03m, so that the potentials of the first terminal of the capacitor C01 and the first terminal of the capacitor C01m can be held.

<<Arithmetic Operation>>

After the initial operation, a signal Sp[i−1] and a signal Sn[i−1] are input to the terminal inp and the terminal inn, respectively, of the circuit MPC[i] (here, i is an integer greater than or equal to 1 and less than or equal to m), whereby arithmetic operation starts in the circuit MPC[i]. In particular, when i is 1, a signal Sp[0] and a signal Sn[0] are input to the terminal inp and the terminal inn, respectively, of the circuit MPC[1] with little time lag (substantially at the same time). When i is greater than or equal to 2, the signal Sp[i−1] and the signal Sn[i−1] are output from the circuit MPC[i−1]; thus, a time lag therebetween is sometimes generated. In the description of the arithmetic operation, the signal Sp[i−1] and the signal Sn[i−1] are input to the terminal inp and the terminal inn, respectively, of the circuit MPC[i] with little time lag (substantially at the same time) for convenience.

[Condition 1]

Figure 7A:
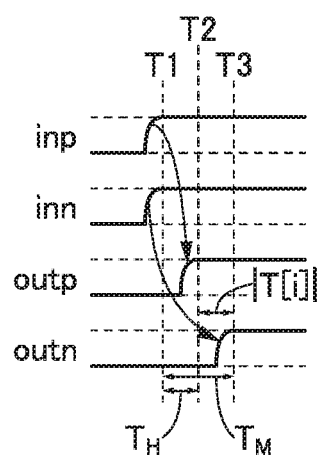
FIGS. 7A to 7D are timing charts showing operation examples of a circuit in a semiconductor device.

Here, the case where the potential corresponding to the weight coefficient $w_i^{(k-1)}{}_j^{(k)}$ is a high-level potential and the potential corresponding to the signal $x_i^{(k-1)}$ is a high-level potential is considered. FIG. 7A is a timing chart showing changes in the potentials of the terminal inp, the terminal inn, the terminal outp, and the terminal outn in such a case. First, high-level potentials are supplied as the signal Sp[i−1] and the signal Sn[i−1] to the terminal inp and the terminal inn, respectively, of the circuit MPC[i]. At Time T1, the potentials of the terminal inp and the terminal inn of the circuit MPC[i] are assumed to become high.

At this time, a high-level potential is supplied as the signal Sp[i−1] to the input terminal of the circuit BF1 in the circuit MPC[i]; thus, the high-level potential is output from the output terminal of the circuit BF1 in the circuit MPC[i]. Similarly, a high-level potential is supplied as the signal Sn[i−1] to the input terminal of the circuit BF2 in the circuit MPC[i]; thus, the high-level potential is output from the output terminal of the circuit BF2 in the circuit MPC[i]. Note that a high-level potential is supplied to the back gate of the transistor Tr02 in the circuit BF1 and an intermediate potential is supplied to the back gate of the transistor Tr02m in the circuit BF2; accordingly, the circuit BF1 operates faster than the circuit BF2. Thus, when signals are input to the terminal inp and the terminal inn at the same time, the circuit BF1 outputs an output signal before the circuit BF2 outputs an output signal.

Since a high-level potential is supplied to the terminal xt in the switching circuit SC, electrical continuity is established between the output terminal of the circuit BF1 and the terminal outp and between the output terminal of the circuit BF2 and the terminal outn. That is, the output signal of the circuit BF1 is output from the terminal outp, and the output signal of the circuit BF2 is output from the terminal outn.

The output signal of the circuit BF1 is output before the output signal of the circuit BF2; thus, as in FIG. 7A, the potential of the terminal outp becomes high at Time T2, and then, the potential of the terminal outn becomes high at Time T3. That is, a signal Sp[i] is output as the output signal from the terminal outp at Time T2, and a signal Sn[i] is output as the output signal from the terminal outn at Time T3. Note that in FIG. 7A, the input/output time from the input of the signal Sp[i−1] to the terminal inp to the output of the signal Sp[i] from the terminal outp is denoted by $T_H$, and the input/output time from the input of the signal Sn[i−1] to the terminal inn to the output of the signal Sn[i] from the terminal outn is denoted by $T_M$.

[Condition 2]

Figure 7B:
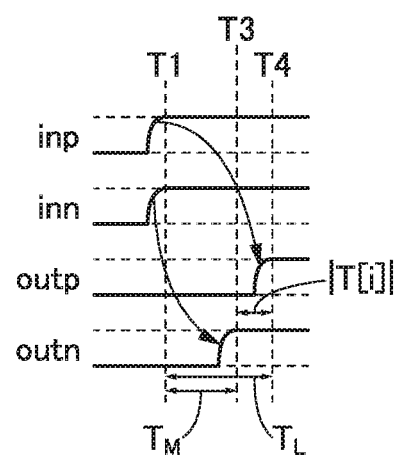

The case where the potential corresponding to the weight coefficient $w_i^{(k-1)}{}_j^{(k)}$ is a low-level potential and the potential corresponding to the signal $x_i^{(k-1)}$ is a high-level potential is considered. FIG. 7B is a timing chart showing changes in the potentials of the terminal inp, the terminal inn, the terminal outp, and the terminal outn in such a case. As in FIG. 7A, first, high-level potentials are supplied as the signal Sp[i−1] and the signal Sn[i−1] to the terminal inp and the terminal inn, respectively, of the circuit MPC[i]. At Time T1, the potentials of the terminal inp and the terminal inn of the circuit MPC[i] are assumed to become high.

At this time, a high-level potential is supplied as the signal Sp[i−1] to the input terminal of the circuit BF1 in the circuit MPC[i]; thus, the high-level potential is output from the output terminal of the circuit BF1 in the circuit MPC[i].

Similarly, a high-level potential is supplied as the signal Sn[i−1] to the input terminal of the circuit BF2 in the circuit MPC[i]; thus, the high-level potential is output from the output terminal of the circuit BF2 in the circuit MPC[i]. Note that a low-level potential is supplied to the back gate of the transistor Tr02 in the circuit BF1 and an intermediate potential is supplied to the back gate of the transistor Tr02m in the circuit BF2; accordingly, the circuit BF1 operates slower than the circuit BF2. Thus, when signals are input to the terminal inp and the terminal inn at the same time, the circuit BF1 outputs an output signal after the circuit BF2 outputs an output signal.

Since a high-level potential is supplied to the terminal xt in the switching circuit SC, electrical continuity is established between the output terminal of the circuit BF1 and the terminal outp and between the output terminal of the circuit BF2 and the terminal outn, as in the case of FIG. 7A. That is, the output signal of the circuit BF1 is output from the terminal outp, and the output signal of the circuit BF2 is output from the terminal outn.

The output signal of the circuit BF1 is output after the output signal of the circuit BF2; thus, as in FIG. 7B, the potential of the terminal outn becomes high at Time T3, and then, the potential of the terminal outp becomes high at Time T4. That is, the signal Sn[i] is output as the output signal from the terminal outn at Time T3, and the signal Sp[i] is output as the output signal from the terminal outp at Time T4. Note that in FIG. 7B, the input/output time from the input of the signal Sp[i−1] to the terminal inp to the output of the signal Sp[i] from the terminal outp is denoted by $T_L$, and the input/output time from the input of the signal Sn[i−1] to the terminal inn to the output of the signal Sn[i] from the terminal outn is denoted by $T_M$.

[Condition 3]

Figure 7C:
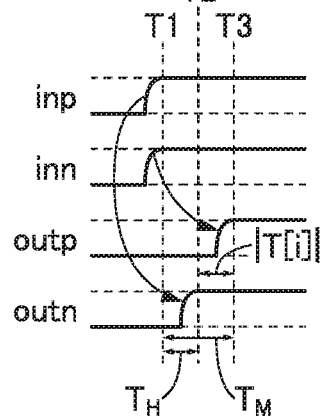

The case where the potential corresponding to the weight coefficient $w_i^{(k-1)}{}_j^{(k)}$ is a high-level potential and the potential corresponding to the signal $x_i^{(k-1)}$ is a low-level potential is considered. FIG. 7C is a timing chart showing changes in the potentials of the terminal inp, the terminal inn, the terminal outp, and the terminal outn in such a case. As in FIG. 7A, first, high-level potentials are supplied as the signal Sp[i−1] and the signal Sn[i−1] to the terminal inp and the terminal inn, respectively, of the circuit MPC[i]. At Time T1, the potentials of the terminal inp and the terminal inn of the circuit MPC[i] are assumed to become high.

At this time, a high-level potential is supplied as the signal Sp[i−1] to the input terminal of the circuit BF1 in the circuit MPC[i]; thus, the high-level potential is output from the output terminal of the circuit BF1 in the circuit MPC[i]. Similarly, a high-level potential is supplied as the signal Sn[i−1] to the input terminal of the circuit BF2 in the circuit MPC[i]; thus, the high-level potential is output from the output terminal of the circuit BF2 in the circuit MPC[i]. Note that a high-level potential is supplied to the back gate of the transistor Tr02 in the circuit BF1 and an intermediate potential is supplied to the back gate of the transistor Tr02m in the circuit BF2; accordingly, the circuit BF1 operates faster than the circuit BF2. Thus, when signals are input to the terminal inp and the terminal inn at the same time, the circuit BF1 outputs an output signal before the circuit BF2 outputs an output signal.

Since a low-level potential is supplied to the terminal xt in the switching circuit SC, electrical continuity is established between the output terminal of the circuit BF1 and the terminal outn and between the output terminal of the circuit BF2 and the terminal outp. That is, the output signal of the circuit BF1 is output from the terminal outn, and the output signal of the circuit BF2 is output from the terminal outp.

The output signal of the circuit BF1 is output before the output signal of the circuit BF2; thus, as in FIG. 7C, the potential of the terminal outn becomes high at Time T2, and then, the potential of the terminal outp becomes high at Time T3. That is, the signal Sn[i] is output as the output signal from the terminal outn at Time T2, and the signal Sp[i] is output as the output signal from the terminal outp at Time T3. Note that in FIG. 7C, the input/output time from the input of the signal Sp[i−1] to the terminal inp to the output of the signal Sn[i] from the terminal outn is denoted by $T_H$, and the input/output time from the input of the signal Sn[i−1] to the terminal inn to the output of the signal Sp[i] from the terminal outp is denoted by $T_M$.

[Condition 4]

Figure 7D:
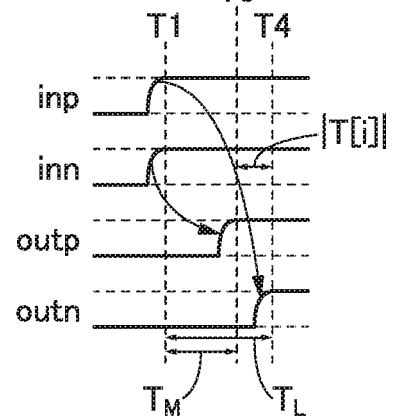

The case where the potential corresponding to the weight coefficient $w_i^{(k-1)}{}_j^{(k)}$ is a low-level potential and the potential corresponding to the signal $x_i^{(k-1)}$ is a low-level potential is considered. FIG. 7D is a timing chart showing changes in the potentials of the terminal inp, the terminal inn, the terminal outp, and the terminal outn in such a case. As in FIG. 7A, first, high-level potentials are supplied as the signal Sp[i−1] and the signal Sn[i−1] to the terminal inp and the terminal inn, respectively, of the circuit MPC[i]. At Time T1, the potentials of the terminal inp and the terminal inn of the circuit MPC[i] are assumed to become high.

At this time, a high-level potential is supplied as the signal Sp[i−1] to the input terminal of the circuit BF1 in the circuit MPC[i]; thus, the high-level potential is output from the output terminal of the circuit BF1 in the circuit MPC[i]. Similarly, a high-level potential is supplied as the signal Sn[i−1] to the input terminal of the circuit BF2 in the circuit MPC[i]; thus, the high-level potential is output from the output terminal of the circuit BF2 in the circuit MPC[i]. Note that a low-level potential is supplied to the back gate of the transistor Tr02 in the circuit BF1 and an intermediate potential is supplied to the back gate of the transistor Tr02m in the circuit BF2; accordingly, the circuit BF1 operates slower than the circuit BF2. Thus, when signals are input to the terminal inp and the terminal inn at the same time, the circuit BF1 outputs an output signal after the circuit BF2 outputs an output signal.

Since a low-level potential is supplied to the terminal xt in the switching circuit SC, electrical continuity is established between the output terminal of the circuit BF1 and the terminal outn and between the output terminal of the circuit BF2 and the terminal outp. That is, the output signal of the circuit BF1 is output from the terminal outn, and the output signal from the circuit BF2 is output from the terminal outp.

The output signal of the circuit BF1 is output after the output signal of the circuit BF2; thus, as in FIG. 7D, the potential of the terminal outp becomes high at Time T3, and then, the potential of the terminal outn becomes high at Time T4. That is, the signal Sp[i] is output as the output signal from the terminal outp at Time T3, and the signal Sn[i] is output as the output signal from the terminal outn at Time T4. Note that in FIG. 7D, the input/output time from the input of the signal Sp[i−1] to the terminal inp to the output of the signal Sn[i] from the terminal outn is denoted by $T_L$, and the input/output time from the input of the signal Sn[i−1] to the terminal inn to the output of the signal Sp[i] from the terminal outp is denoted by $T_M$.

In the conditions 1 to 4, a time lag between the output of the signal Sn[i] from the terminal outn and the output of the signal Sp[i] from the terminal outp is denoted by T[i] (|T[i]| in FIGS. 7A to 7D). As in the description of the conditions 1 to 4, T[i] is determined by the potential corresponding to the weight coefficient $w_i^{(k-1)(k)}_j$ and the potential corresponding to the signal $x_i^{(k-1)}$.

For example, when the potential corresponding to the signal $x_i^{(k-1)}$ is high, T[i] becomes smaller as the weight coefficient $w_i^{(k-1)(k)}_j$ becomes larger (the potential corresponding to the weight coefficient $w_i^{(k-1)(k)}_j$ becomes higher). The signal Sp[i] is output from the terminal outp before the signal Sn[i] is output from the terminal outn; thus, T[i] becomes a negative value. In addition, T[i] becomes larger as the weight coefficient $w_i^{(k-1)(k)}_j$ becomes smaller (the potential corresponding to the weight coefficient $w_i^{(k-1)(k)}_j$ becomes lower). The signal Sp[i] is output from the terminal outp after the signal Sn[i] is output from the terminal outn; thus, T[i] becomes a positive value.

For example, when the potential corresponding to the signal $x_i^{(k-1)}$ is high, a difference in the input/output time between the circuit BF1 and the circuit BF2 in the circuit MPC[i] is output as it is. For another example, when the potential corresponding to the signal $x_i^{(k-1)}$ is low, a difference in the input/output time between the circuit BF1 and the circuit BF2 in the circuit MPC[i] is multiplied by −1 and then is output. Specifically, when a time lag between the output of the signal Sn[i] from the terminal outn and the output of the signal Sp[i] from the terminal outp under the condition 1 (in the timing chart in FIG. 7A) is T[i] ($=T_M-T_H$), a time lag between the output of the signal Sn[i] from the terminal outn and the output of the signal Sp[i] from the terminal outp under the condition 3 (in the timing chart in FIG. 7C) is −T[i] ($=T_M-T_L$).

In an actual situation, there is a delay between the input and the output of a signal in the switching circuit SC; thus, the time lag T[i] between the output of the signal Sn[i] from the terminal outn and the output of the signal Sp[i] from the terminal outp includes the delay. In this embodiment, the description is made without regard to the delay.

As described above, when the signal Sp[i−1] and the signal Sn[i−1] are input to the circuit MPC[i], the circuit MPC[i] outputs the signal Sp[i] and the signal Sn[i] to which the time lag T[i], which is determined by the potential corresponding to the weight coefficient $w_i^{(k-1)(k)}_j$ and the potential corresponding to the signal $x_i^{(k-1)}$, is added.

<<Arithmetic Operation with a Plurality of Connected Circuits MPC>>

Here, the operation of the arithmetic circuit 110 including the m connected circuits MPC as in FIG. 1A is described. In order that the circuit MPC[i] outputs the signal Sp[i] and the signal Sn[i] to which the time lag T[i], which is determined by the weight coefficient $w_i^{(k-1)(k)}_j$ and the signal $x_i^{(k-1)}$, is added, the signal Sp[0] and the signal Sn[0] are input to the circuit MPC[1] at the same time, so that the time lags caused in the circuits MPC[1] to MPC[m] are accumulated.

When the time lag between the output of the signal Sp[i−1] and the output of the signal Sn[i−1] from the circuit MPC[i−1] is T[i−1] and the time lag between the output of the signal Sp[i] and the output of the signal Sn[i] from the circuit MPC[i] is T[i], the relationship between T[i] and T[i−1] is expressed by the following formula.

$$T[i]=\{T[i-1]+g(w_i^{(k-1)(k)}_j)\}\cdot x_i^{(k-1)} \tag{1.4}$$

In the formula, $g(w_i^{(k-1)(k)}_j)$ is a function that outputs the time lag between the signal output from the circuit BF1 and the signal output from the circuit BF2 using the weight coefficient as a variable. When the delay time in the switching circuit SC is taken into consideration, the term representing the delay time is added to Formula (1.4).

In Formula (1.4), $g(w_i^{(k-1)(k)}_j)$, the time lag based on the weight coefficient $w_i^{(k-1)(k)}_j$ held in the circuit MPC[i], is added to the time lag T[i−1] between the output of the signal Sp[i−1] and the output of the signal Sn[i−1] from the circuit MPC[i−1], and the sum is multiplied by the signal $x_i^{(k-1)}$ by the switching circuit SC.

Note that T[1] is expressed by the following formula.

$$T[1]=g(w_1^{(k-1)(k)}_j)\cdot x_1^{(k-1)} \tag{1.5}$$

Here, according to recurrence relations of Formulae (1.4) and (1.5), T[m] is calculated as in Formula (1.6). Note that Π in Formula (1.6) is a polynomial operator representing the infinite product.

$$T[m] = \sum_{i=1}^{m} g(w_i^{(k-1)(k)}_j)\cdot\left(\prod_{h=i}^{m} x_h^{(k-1)}\right) \tag{1.6}$$

Here, $\Pi x_i^{(k-1)}$ is replaced with $z_i^{(k-1)}$.

$$\prod_{h=i}^{m} x_h^{(k-1)} = x_h^{(k-1)}\times\ldots\times x_m^{(k-1)} = z_i^{(k-1)} \tag{1.7}$$

By replacing $\Pi x_i^{(k-1)}$ with $z_i^{(k-1)}$, T[m] can be expressed by the product-sum of the function $g(w_i^{(k-1)(k)}_j)$ based on the weight coefficient and the signal $z_i^{(k-1)}$ according to Formulae (1.6) and (1.7). That is, Formula (1.2) can be calculated with the arithmetic circuit 110.

Next, the relationship between $x_i^{(k-1)}$ and $z_i^{(k-1)}$ for the replacement of $\Pi x_i^{(k-1)}$ with $z_i^{(k-1)}$ and the converter circuit TRF that converts the signals $z_1^{(k-1)}$ to $z_m^{(k-1)}$ into the signals $x_1^{(k-1)}$ to $x_m^{(k-1)}$ are described.

First, $z_{i+1}^{(k-1)}$ is described. According to Formula (1.7), $z_{i+1}^{(k-1)}$ is expressed by the following formula. Note that here, i is an integer greater than or equal to 1 and less than or equal to m−1.

$$x_{i+1}^{(k-1)}\times\ldots\times x_m^{(k-1)}=z_{i+1}^{(k-1)} \tag{1.8}$$

Next, the sides of Formula (1.7) are divided by the corresponding sides of Formula (1.8), so that the following formula can be obtained.

$$x_i^{(k-1)} = \frac{z_i^{(k-1)}}{z_{i+1}^{(k-1)}} \tag{1.9}$$

When i=m, $x_m^{(k-1)}$ is expressed by the following formula according to Formula (1.7).

$$x_m^{(k-1)}=z_m^{(k-1)} \tag{1.10}$$

When Formulae (1.9) and (1.10) are satisfied, $\Pi x_i^{(k-1)}$ can be replaced with $z_i^{(k-1)}$ in Formula (1.6).

Next, the converter circuit TRF that converts the signals $z_1^{(k-1)}$ to $z_m^{(k-1)}$ into the signals $x_1^{(k-1)}$ to $x_m^{(k-1)}$ so that Formulae (1.9) and (1.10) are satisfied is described.

In Formula (1.9), $z_i^{(k-1)}$ and $z_{i+1}^{(k-1)}$ are signals output from the neuron $N_i^{(k-1)}$ and the neuron $N_{i+1}^{(k-1)}$, respectively, in the (k−1)-th layer. In the arithmetic circuit 110, the activation function of the neuron is the step function in which the output is −1 or 1; thus, the signal $x_i^{(k-1)}$ also has a value of −1 or 1. Thus, $x_i^{(k-1)}$ can be expressed by exclusive NOR of $z_i^{(k-1)}$ and $z_{i+1}^{(k-1)}$.

Figure 8A:
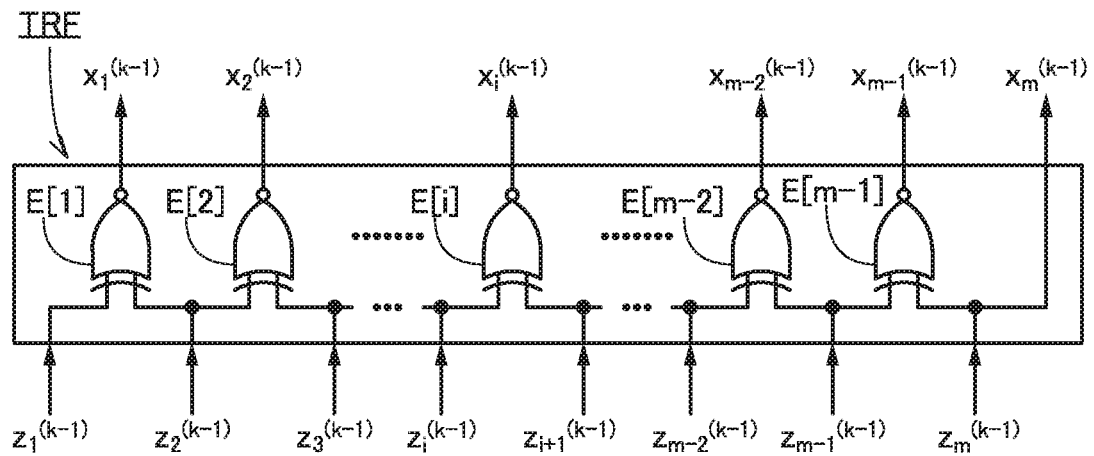
FIGS. 8A and 8B are circuit diagrams illustrating configuration examples of a circuit in a semiconductor device.
Figure 8B:
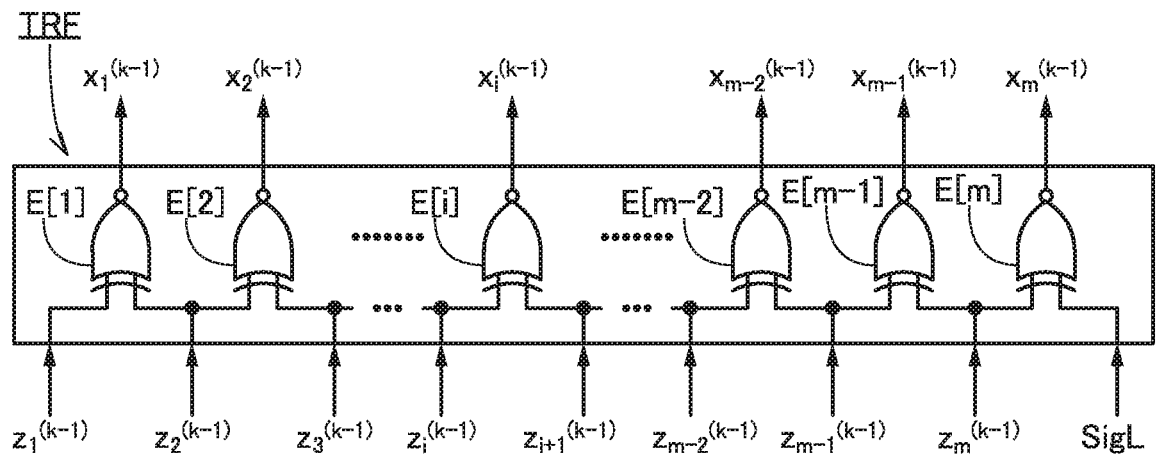

FIGS. 8A and 8B illustrate configuration examples of the converter circuit TRF that converts the signals $z_1^{(k-1)}$ to $z_m^{(k-1)}$ into the signals $x_1^{(k-1)}$ to $x_m^{(k-1)}$.

The converter circuit TRF in FIG. 8A includes coincidence circuits (exclusive NOR circuits) E[1] to E[m−1]. Note that FIG. 8A illustrates only the coincidence circuits E[1], E[2], E[i], E[m−2], and E[m−1], and the other coincidence circuits are not illustrated.

Here, the coincidence circuit E[i] (here, i is an integer greater than or equal to 1 and less than or equal to m−1) is described. The signal $z_i^{(k-1)}$ is input to a first terminal of the coincidence circuit E[i], and the signal $z_{i+1}^{(k-1)}$ is input to a second terminal of the coincidence circuit E[i]. The signal $x_i^{(k-1)}$ is output from an output terminal of the coincidence circuit E[i].

When receiving the signal $z_m^{(k-1)}$, the converter circuit TRF in FIG. 8A outputs the signal $z_m^{(k-1)}$ as it is as the signal $x_m^{(k-1)}$.

The converter circuit TRF in FIG. 8A can convert the signals $z_1^{(k-1)}$ to $z_m^{(k-1)}$ into the signals $x_1^{(k-1)}$ to $x_m^{(k-1)}$ so that Formulae (1.9) and (1.10) are satisfied.

Note that the configuration of the converter circuit TRF in the arithmetic circuit 110 is not limited to that in FIG. 8A and may be changed depending on the circumstances.

For example, the converter circuit TRF illustrated in FIG. 8B may be used as the converter circuit TRF of the arithmetic circuit 110. The converter circuit TRF in FIG. 8B is different from that in FIG. 8A in including a coincidence circuit E[m].

Specifically, the signal $z_m^{(k-1)}$ is input to a first terminal of the coincidence circuit E[m], and a signal SigL corresponding to a low-level potential is input to a second terminal of the coincidence circuit E[m]. The signal $x_m^{(k-1)}$ is output from an output terminal of the coincidence circuit E[m]. The converter circuit TRF in FIG. 8B can perform operation similar to that of the converter circuit TRF in FIG. 8A.

Note that this embodiment can be combined with any of the other embodiments in this specification as appropriate.

Embodiment 2

In this embodiment, another configuration example of the arithmetic circuit 110 described in Embodiment 1 is described.

<Configuration Example of Arithmetic Circuit 110>

Figure 9:
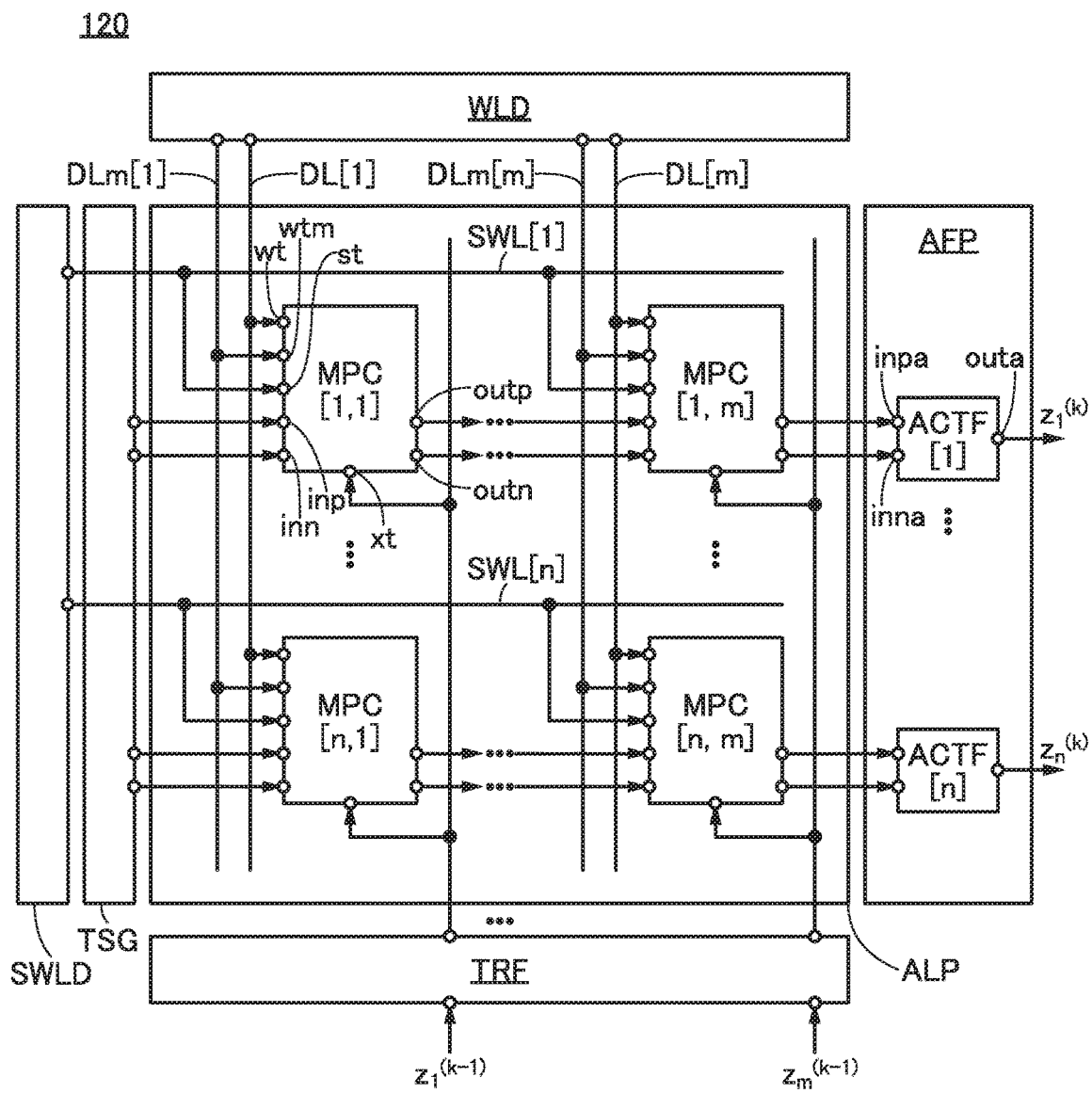
FIG. 9 is a block diagram illustrating a configuration example of a semiconductor device.

In the arithmetic circuit 110 in FIG. 1A, the circuits MPC can be arranged in a matrix, for example. FIG. 9 illustrates a configuration example of such an arithmetic circuit.

An arithmetic circuit 120 includes an array unit ALP including the circuits MPC arranged in a matrix, a circuit AFP including a plurality of circuits ACTF, a circuit TSG, a circuit WLD, a circuit SWLD, and the converter circuit TRF.

The array unit ALP includes n×m circuits MPC, and the circuits MPC are arranged in a matrix of n rows and m columns in the array unit ALP. Note that in FIG. 9, the circuit MPC in the j-th row and the i-th column (here, j is an integer greater than or equal to 1 and less than or equal to n, and i is an integer greater than or equal to 1 and less than or equal to m) is denoted by the circuit MPC[j, i]. Note that FIG. 9 illustrates only the circuits MPC[1, 1], MPC[1, m], MPC[n, 1], and MPC[n, m], and the other circuits MPC are not illustrated.

The circuit AFP includes n circuits ACTF arranged in one column. In FIG. 9, the circuit ACTF in the j-th row is denoted by the circuit ACTF[j]. Note that FIG. 9 illustrates only the circuits ACTF[1] and ACTF[n], and the other circuits ACTF are not illustrated.

When the j-th row in the array unit ALP and the circuit AFP is focused on, in the circuits MPC[j, 1] to MPC[j, m], the terminal outp and the terminal outn are electrically connected to the terminal inp and the terminal inn, respectively, of the adjacent circuits MPC. The terminal outp and the terminal outn of the circuit MPC[j, m] are electrically connected to the terminal inpa and the terminal inna, respectively, of the circuit ACTF[j]. The terminals xt of the circuits MPC[j, 1] to MPC[j, m] are electrically connected to the converter circuit TRF.

In other words, with a focus on the circuit MPC and the circuit ACTF in one row of the array unit ALP of the arithmetic circuit 120, the circuit MPC and the circuit ACTF in the row can be regarded as the arithmetic circuit 110 in FIG. 1A.

The circuit MPC in the array unit ALP includes a terminal st in addition to the terminal wt, the terminal wtm, the terminal xt, the terminal inp, the terminal inn, the terminal outp, and the terminal outn described in Embodiment 1. The terminal st is electrically connected to the wiring SL01 described in Embodiment 1.

The terminals st of the circuits MPC[j, 1] to MPC [j, m] are electrically connected to the wiring SWL[j]. The wiring SWL[j] corresponds to the wiring SWL in Embodiment 1, and FIG. 9 illustrates the wiring SWL[1] and the wiring SWL[n]. The terminals wt of the circuits MPC[1, i] to MPC[n, i] are electrically connected to the wiring DL[i]. The wiring DL[i] corresponds to the wiring DL in Embodiment 1, and FIG. 9 illustrates the wiring DL[1] and the wiring DL[m]. The terminals wtm of the circuits MPC[1, i] to MPC[n, i] are electrically connected to the wiring DLm[i]. The wiring DLm[i] corresponds to the wiring DLm in Embodiment 1, and FIG. 9 illustrates the wiring DLm[1] and the wiring DLm[m].

The circuit TSG generates signals input to the terminals inp and inn of the circuits MPC[1, 1] to MPC[n, 1].

The circuit WLD has a function of supplying potentials corresponding to weight coefficients to the wirings DL[1] to DL[m] and a function of supplying intermediate potentials to the wirings DLm[1] to DLm[m].

The circuit SWLD selects a holding unit for holding the potentials corresponding to the weight coefficients. Specifically, the circuit SWLD has a function of supplying potentials to the gates of the transistors Tr03 and the transistors Tr03m in the holding units HCA and the holding units HCAm, respectively, of the circuits MPC[j, 1] to MPC[j, m] through the wiring SWL[j].

In the case where the potentials are held in the holding unit HCA and the holding unit HCAm of the circuit MPC[j, i], for example, the circuit WLD supplies the potentials to the wiring DL[i] and the wiring DLm[i], and the circuit SWLD supplies a high-level potential to the wiring SWL[j] to turn on the transistor Tr03 and the transistor Tr03m in the holding unit HCA and the holding unit HCAm, respectively, of the circuit MPC[j, i], so that the potentials of the wiring DL[i] and the wiring DLm[i] can be supplied to the first terminals of the capacitor C01 and the capacitor C01m, respectively. After the potentials are supplied to the first terminals of the capacitor C01 and the capacitor C01m, the circuit SWLD supplies a low-level potential to the wiring SWL[j] to turn off the transistor Tr03 and the transistor Tr03m in the holding unit HCA and the holding unit HCAm, respectively, of the circuit MPC[j, i], so that the potentials supplied to the holding unit HCA and the holding unit HCAm can be held.

For the converter circuit TRF, refer to the description thereof in Embodiment 1. Note that in FIG. 9, the signal $z_1^{(k-1)}$ and the signal $z_m^{(k-1)}$ are input to the converter circuit TRF. The signals $z_1^{(k-1)}$ to $z_m^{(k-1)}$ input to the converter circuit TRF are converted into the signals $x_1^{(k-1)}$ to $x_m^{(k-1)}$ and transmitted to the circuits MPC included in the array unit ALP. In particular, the signal $x_i^{(k-1)}$ is transmitted to the terminals xt of the circuits MPC[1, i] to MPC[n, i].

With the arithmetic circuit 120 in FIG. 9, a plurality of arithmetic operations can be performed simultaneously. Although Embodiment 1 describes the arithmetic circuit 110 in FIG. 1A as a circuit for obtaining the signal $z_j^{(k)}$ output from the neuron $N_j^{(k)}$ in FIG. 4B, the use of the arithmetic circuit 120 in FIG. 9 makes it possible to simultaneously obtain the signals $z_1^{(k)}$ to $z_n^{(k)}$ output from the neurons $N_1^{(k)}$ to $N_n^{(k)}$.

Specifically, all the signals $z_1^{(k-1)}$ to $z_m^{(k-1)}$ output from the neurons $N_1^{(k-1)}$ to $N_m^{(k-1)}$ in the (k−1)-th layer are input to each of the neurons $N_1^{(k)}$ to $N_n^{(k)}$ in the k-th layer. This corresponds to the transmission of the signals $x_1^{(k-1)}$ to $x_m^{(k-1)}$ output from the converter circuit TRF to the circuits MPC included in the array unit ALP. The potential corresponding to the weight coefficient between the neuron $N_i^{(k-1)}$ in the (k−1)-th layer and the neuron $N_j^{(k)}$ in the k-th layer is held in the holding unit HCA of the circuit MPC[j, i], whereby the signal $z_j^{(k)}$ from the neuron $N_j^{(k)}$ in the k-th layer can be output from the circuit ACTF[j]. Note that in FIG. 9, the signal $z_1^{(k)}$ is output from the circuit ACTF[1], and the signal $z_n^{(k)}$ is output from the circuit ACTF[n].

Note that the semiconductor device of one embodiment of the present invention is not limited to the arithmetic circuit 120 illustrated in FIG. 9. Although the circuits MPC[i] in FIG. 6 are arranged in a matrix in the arithmetic circuit 120 in FIG. 9, the circuits MPC[i] in FIG. 10 may be arranged in a matrix. The circuit MPC[i] in FIG. 10 is different from that in FIG. 6 in that the terminal wt in the holding unit HCA of the circuit BF1 and the terminal wtm in the holding unit HCAm of the circuit BF2 are electrically connected to the wiring DL, the wiring SL01 in the circuit BF1 is electrically connected to the wiring SWL, and the wiring SL01m in the circuit BF2 is electrically connected to a wiring SWLm.

Figure 10:
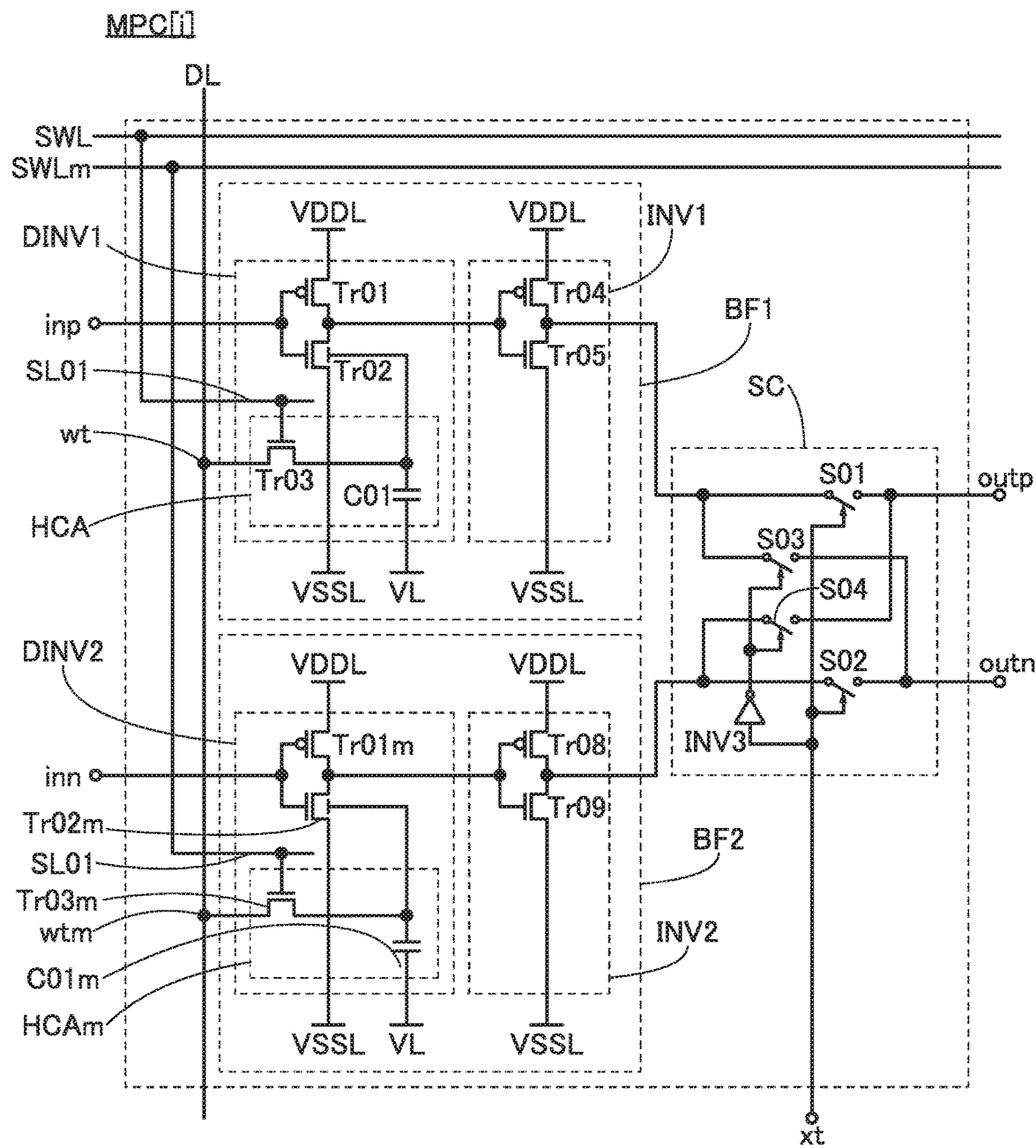
FIG. 10 is a circuit diagram illustrating a configuration example of a circuit in a semiconductor device.
Figure 11:
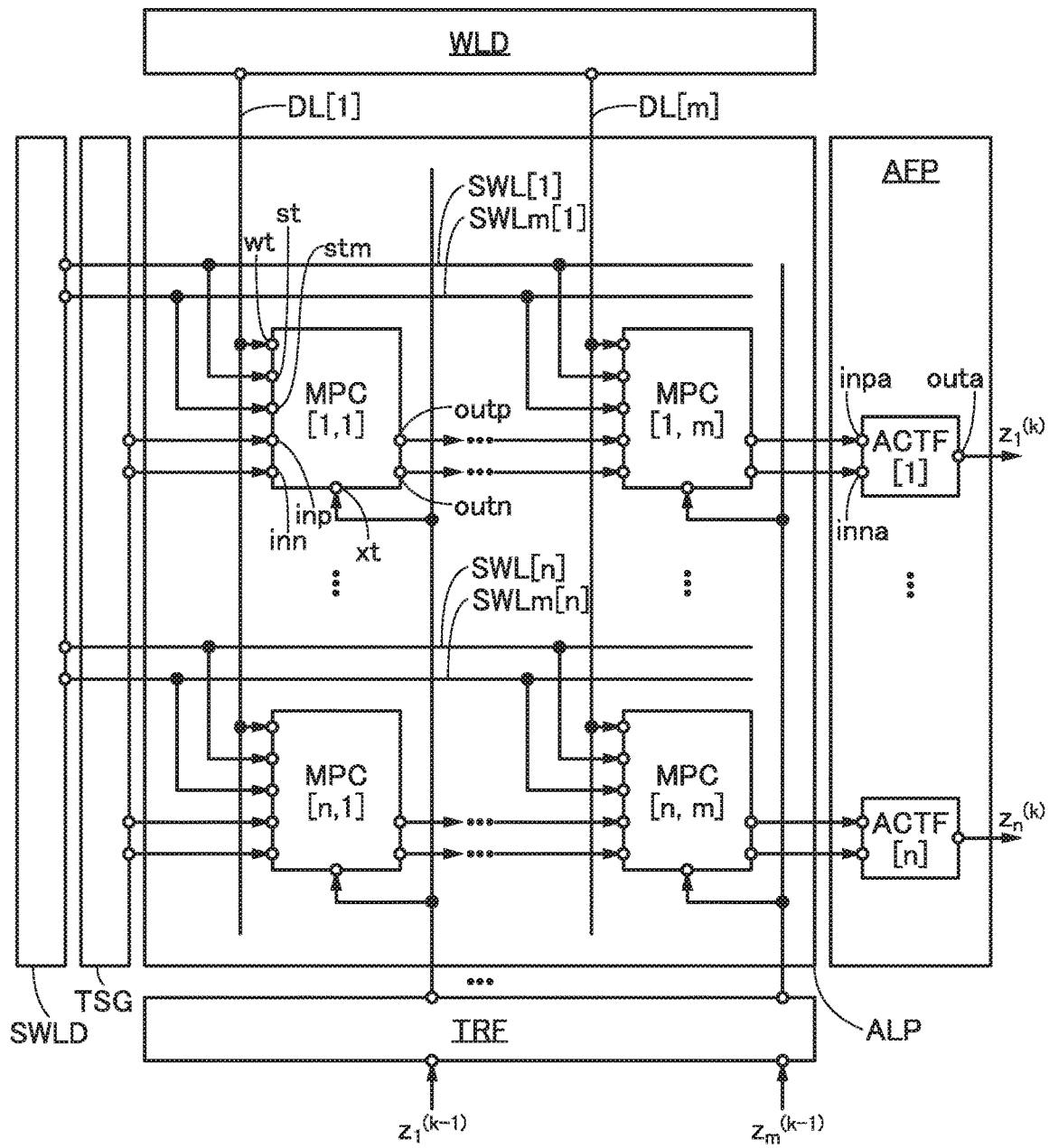
FIG. 11 is a block diagram illustrating a configuration example of a semiconductor device.

FIG. 11 illustrates an example of an arithmetic circuit including the circuits MPC[i] in FIG. 10 arranged in a matrix of n rows and m columns as in the arithmetic circuit 120 in FIG. 9. An arithmetic circuit 130 in FIG. 11 is different from the arithmetic circuit 120 in FIG. 9 in some of the terminals of the circuit MPC and in the wiring connected to those terminals.

Each of the circuits MPC in the array unit ALP includes the terminal st and a terminal stm in addition to the terminal wt, the terminal wtm, the terminal xt, the terminal inp, the terminal inn, the terminal outp, and the terminal outn illustrated in FIG. 10. The terminal st is electrically connected to the wiring SL01 in the circuit BF1, and the terminal stm is electrically connected to the wiring SL01m in the circuit BF2. Since the terminal wt and the terminal wtm are electrically connected to each other in FIG. 10, the terminal wtm is not illustrated in FIG. 11 and the terminal wtm and the terminal wt are regarded as one terminal.

The terminals st of the circuits MPC[j, 1] to MPC[j, m] are electrically connected to the wiring SWL[j]. The wiring SWL[j] corresponds to the wiring SWL in FIG. 10, and FIG. 11 illustrates the wiring SWL[1] and the wiring SWL[n]. The terminals stm of the circuits MPC[j, 1] to MPC[j, m] are electrically connected to the wiring SWLm[j]. The wiring SWLm[j] corresponds to the wiring SWLm in FIG. 10, and FIG. 11 illustrates the wiring SWLm[1] and the wiring SWLm[n]. The terminals wt of the circuits MPC[1, i] to MPC[n, i] are electrically connected to the wiring DL[i]. The wiring DL[i] corresponds to the wiring DL in FIG. 10, and FIG. 11 illustrates the wiring DL[1] and the wiring DL[m].

In other words, the arithmetic circuit 120 has a configuration in which the potentials to be held in two holding units HCA in the circuit MPC are input from different wirings and the on/off switchings of the transistor Tr03 and the transistor Tr03m are performed with one wiring, and the arithmetic circuit 130 has a configuration in which the potentials to be held in two holding units HCA in the circuit MPC are input from one wiring and the on/off switchings of the transistor Tr03 and the transistor Tr03m are performed with different wirings.

Note that this embodiment can be combined with any of the other embodiments in this specification as appropriate.

Embodiment 3

In this embodiment, another configuration example of the circuit MPC described in Embodiment 1 is described.

Figure 12A:
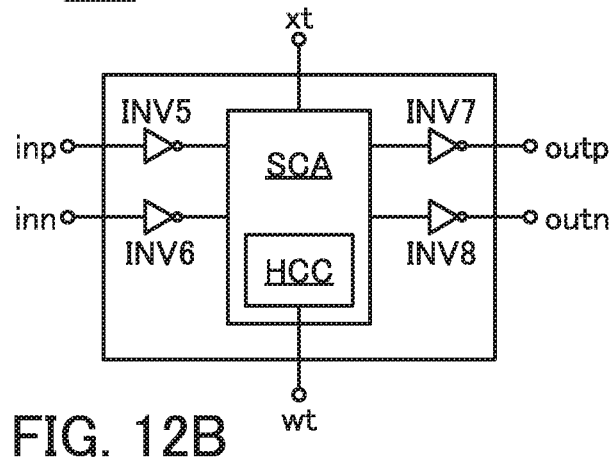
FIGS. 12A to 12C are block diagrams illustrating configuration examples of a circuit in a semiconductor device.

The circuit MPC in FIG. 12A includes inverter circuits INV5 to INV8 and a switching circuit SCA.

An input terminal of the inverter circuit INV5 is electrically connected to the terminal inp, and an output terminal of the inverter circuit INV5 is electrically connected to one of two input terminals of the switching circuit SCA. An input terminal of the inverter circuit INV6 is electrically connected to the terminal inn, and an output terminal of the inverter circuit INV6 is electrically connected to the other input terminal of the switching circuit SCA. One of two output terminals of the switching circuit SCA is electrically connected to an input terminal of the inverter circuit INV7, and the other output terminal of the switching circuit SCA is electrically connected to an input terminal of the inverter circuit INV8. An output terminal of the inverter circuit INV7 is electrically connected to the terminal outp, and an output terminal of the inverter circuit INV8 is electrically connected to the terminal outn.

The switching circuit SCA has a function of selecting one of the terminal outp and the terminal outn as the output destination of the signal input to the terminal inp or the terminal inn in the circuit MPC. In addition, the switching circuit SCA is electrically connected to the terminal xt, and the output destination can be determined by the signal input to the terminal xt (the signals $x_1^{(k-1)}$ to $x_m^{(k-1)}$ in FIG. 1A).

The circuit MPC in FIG. 12A has a function of changing the input/output time from the input of a signal to the terminal inp to the output of the signal from one of the terminal outp and the terminal outn, and a function of changing the input/output time from the input of a signal to the terminal inn to the output of the signal from the other of the terminal outp and the terminal outn. The input/output time can be determined by the signals input to the terminal wt (the weight coefficients $w_1^{(k-1)(k)}_j$ to $w_m^{(k-1)(k)}_j$).

In the circuit MPC in FIG. 12A, the switching circuit SCA includes a holding unit HCC. The holding unit HCC has a function of holding a potential corresponding to the signal input from the terminal wt, and the circuit MPC can change the input/output time on the basis of the potential.

The inverter circuits INV5 to INV8 each have a function of outputting an inverted signal of the input signal, like the inverter circuit INV1 and the inverter circuit INV2 described in Embodiment 1. In the circuit MPC in FIG. 12A, the inverter circuit INV5 and one of the inverter circuits INV7 and INV8 electrically connected to the inverter circuit INV5 through the switching circuit SCA form a first buffer circuit, and the inverter circuit INV6 and the other of the inverter circuits INV7 and INV8 electrically connected to the inverter circuit INV6 through the switching circuit SCA form a second buffer circuit. In other words, the circuit MPC in FIG. 12A has a function of correcting the signal input to the terminal inp, outputting the signal to one of the terminal outp and the terminal outn, correcting the signal input to the terminal inn, and outputting the signal to the other of the terminal outp and the terminal outn. The number of inverter circuits is not limited to two and is desirably two or more because the input and the output having the same logical value enable the circuit to be configured more easily.

The circuit MPC in FIG. 12A may include, instead of the inverter circuits INV5 to INV8, an amplifier circuit configured using a logic circuit, a signal converter circuit (an analog-digital converter circuit, a digital-analog converter circuit, or the like), a potential level converter circuit, and the like.

Figure 12B:
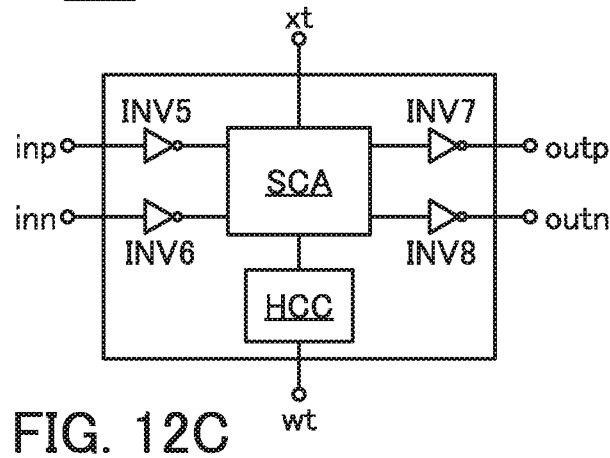

Although the holding unit HCC is included in the switching circuit SCA of the circuit MPC in FIG. 12A, the holding unit HCC may be provided outside the switching circuit SCA as illustrated in FIG. 12B.

Figure 12C:
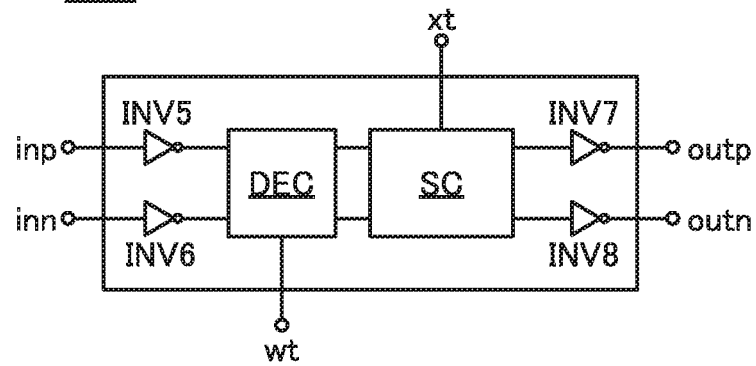

In the circuit MPC in FIGS. 12A and 12B, the potential corresponding to the signal from the terminal wt is held in the holding unit HCC and the input/output time of the circuit MPC is changed in response to the potential; however, the circuit MPC may have a configuration illustrated in FIG. 12C in which a circuit DEC and the switching circuit SC described in Embodiment 1 are provided between the inverter circuits INV5 and INV6 and the inverter circuits INV7 and INV8. The circuit DEC has a function of changing the signal-transmission speed between the terminals inp and inn and the terminals outp and outn in response to the signal from the terminal wt, and the input/output time of the circuit MPC in FIG. 12C is changed by the function.

Configuration Example 1

Figure 13A:
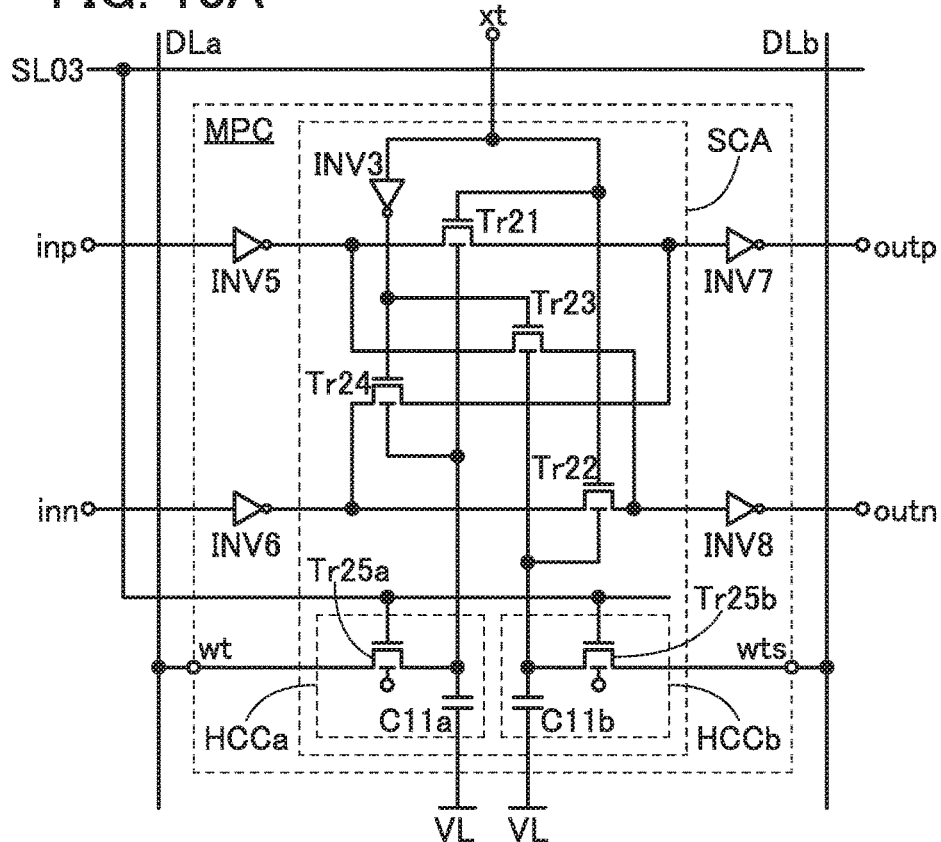
FIGS. 13A and 13B are circuit diagrams illustrating configuration examples of a circuit in a semiconductor device.

FIG. 13A illustrates a specific configuration example of the circuit MPC in FIG. 12A. The switching circuit SCA in the circuit MPC in FIG. 13A includes transistors Tr21 to Tr24 and the inverter circuit INV3. The holding unit HCC in the switching circuit SCA in FIG. 12A is illustrated as a holding unit HCCa and a holding unit HCCb in FIG. 13A. The holding unit HCCa includes a transistor Tr25a and a capacitor C11a, and the holding unit HCCb includes a transistor Tr25b and a capacitor C11b.

Each of the transistors Tr21 to Tr24 has a back gate. The transistors Tr21 to Tr24 are preferably the OS transistors described in the above embodiment. The transistors Tr21 to Tr24 may be Si transistors.

The output terminal of the inverter circuit INV5 is electrically connected to a first terminal of the transistor Tr21 and a first terminal of the transistor Tr23, and the output terminal of the inverter circuit INV6 is electrically connected to a first terminal of the transistor Tr22 and a first terminal of the transistor Tr24. The input terminal of the inverter circuit INV7 is electrically connected to a second terminal of the transistor Tr21 and a second terminal of the transistor Tr24, and the input terminal of the inverter circuit INV8 is electrically connected to a second terminal of the transistor Tr22 and a second terminal of the transistor Tr23. The terminal xt is electrically connected to a gate of the transistor Tr21, a gate of the transistor Tr22, and the input terminal of the inverter circuit INV3, and the output terminal of the inverter circuit INV3 is electrically connected to a gate of the transistor Tr23 and a gate of the transistor Tr24.

In the holding unit HCCa, a first terminal of the transistor Tr25a is electrically connected to a first terminal of the capacitor C11a, the back gate of the transistor Tr21, and the back gate of the transistor Tr24, a second terminal of the transistor Tr25a is electrically connected to a wiring DLa through the terminal wt, and a gate of the transistor Tr25a is electrically connected to a wiring SL03. A second terminal of the capacitor C11a is electrically connected to the wiring VL.

In the holding unit HCCb, a first terminal of the transistor Tr25b is electrically connected to a first terminal of the capacitor C11b, the back gate of the transistor Tr22, and the back gate of the transistor Tr23, a second terminal of the transistor Tr25b is electrically connected to a wiring DLb through a terminal wts, and a gate of the transistor Tr25b is electrically connected to the wiring SL03. A second terminal of the capacitor C11b is electrically connected to the wiring VL.

The wiring VL functions as a voltage line that supplies a constant voltage like the wiring VL described in Embodiment 1. The constant voltage can be VDD, VSS, a ground potential, or the like.

The holding unit HCCa has a function of holding a potential corresponding to a signal input from the terminal wt, and the holding unit HCCb has a function of holding a potential corresponding to a signal input from the terminal wts. That is, the wiring DLa electrically connected to the terminal wt functions as a signal line that supplies a potential to be held in the holding unit HCCa, and the wiring DLb electrically connected to the terminal wts functions as a signal line that supplies a potential to be held in the holding unit HCCb.

The transistor Tr25a included in the holding unit HCCa functions as a switching element, and supply of a potential from the wiring SL03 to the gate of the transistor Tr25a can turn on or off the transistor Tr25a. Similarly, the transistor Tr25b included in the holding unit HCCb functions as a switching element, and supply of a potential from the wiring SL03 to the gate of the transistor Tr25b can turn on or off the transistor Tr25b.

When a high-level potential is supplied to the wiring SL03 to turn on the transistor Tr25a and the transistor Tr25b, electrical continuity is established between the terminal wt and the first terminal of the capacitor C11a and between the terminal wts and the first terminal of the capacitor C11b. At that time, the circuit MPC receives signals from the terminal wt and the terminal wts, and can supply the potentials corresponding to the signals to the first terminals of the capacitors C11a and C11b. After the potentials are supplied to the first terminals of the capacitors C11a and C11b, a low-level potential is supplied to the wiring SL03 to turn off the transistor Tr25a and the transistor Tr25b, whereby the potentials can be held in the holding unit HCCa and the holding unit HCCb.

To hold the potentials in the holding unit HCCa and the holding unit HCCb for a long time, the transistor Tr25a and the transistor Tr25b are preferably the OS transistors with extremely low off-state current. The transistor Tr25a and the transistor Tr25b may each have a back gate as illustrated in FIG. 13A. The detailed electrical connections of the back gates of the transistor Tr25a and the transistor Tr25b are not illustrated in FIG. 13A; for example, when the gate and the back gate of the transistor Tr25a (the transistor Tr25b) are electrically connected to each other, the on-state current of the transistor Tr25a (the transistor Tr25b) can be increased. For example, when the back gate of the transistor Tr25a (the transistor Tr25b) is electrically connected to a wiring that supplies voltage increasing the threshold voltage, the off-state current of the transistor Tr25a (the transistor Tr25b)

can be reduced. Note that each of the transistor Tr25a and the transistor Tr25b does not necessarily have the back gate.

As described in Embodiment 1, the potential corresponding to the weight coefficient $w_i^{(k-1)}{}_j^{(k)}$ is input as a signal to the terminal wt. The potential can be a low-level potential, a high-level potential, a potential between a high-level potential and a low-level potential, or the like. An intermediate potential is input as a signal to the terminal wts. The intermediate potential can be a potential between a low-level potential and a high-level potential. That is, the intermediate potential input to the terminal wts can be regarded as a reference potential of the potentials input to the terminal wt. Thus, the wiring DLa supplies the potential corresponding to the weight coefficient $w_i^{(k-1)}{}_j^{(k)}$, and the wiring DLb supplies the intermediate potential.

As described in Embodiment 1, the potential corresponding to the signal $x_i^{(k-1)}$ is input as a signal to the terminal xt. The signal $x_i^{(k-1)}$ can be a signal with a low-level potential or a high-level potential.

Figure 13B:
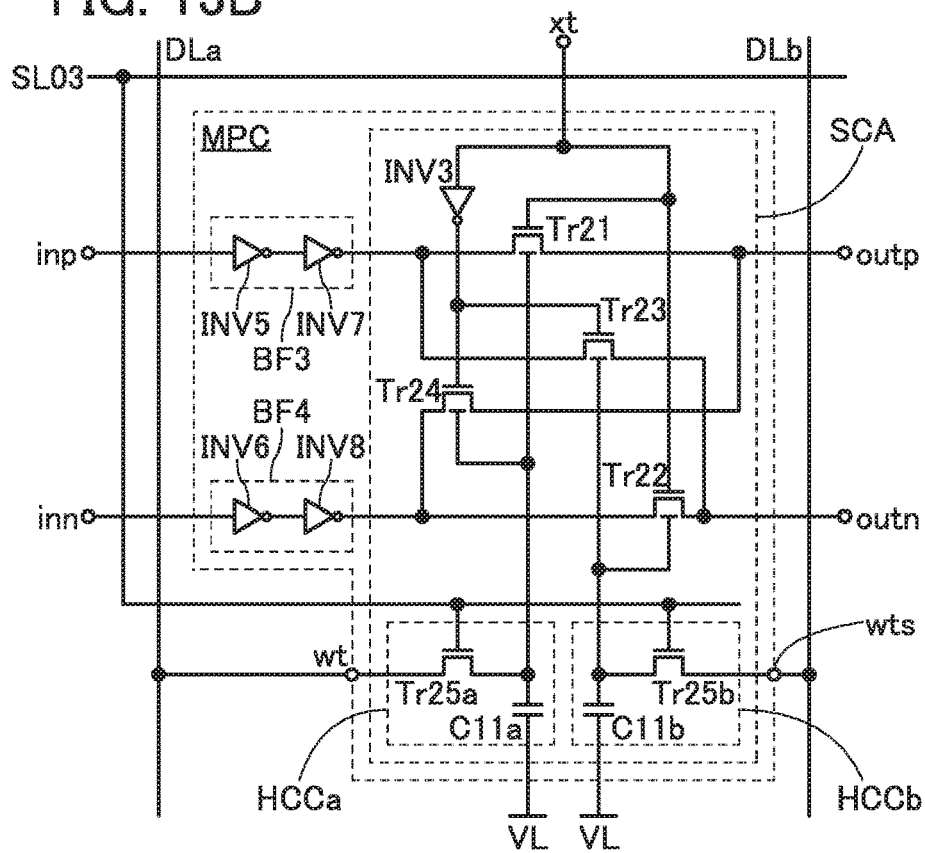

Note that the configuration of the circuit MPC in FIG. 12A is not limited to that of the circuit MPC in FIG. 13A, and the configuration in FIG. 13A may be changed depending on the circumstances. For example, as illustrated in FIG. 13B, the inverter circuit INV7 and the inverter circuit INV8 may be provided at different positions from FIG. 13A. In the circuit MPC in FIG. 13B, the input terminal of the inverter circuit INV7 is electrically connected to the output terminal of the inverter circuit INV5, the output terminal of the inverter circuit INV7 is electrically connected to one of the two input terminals of the switching circuit SCA, one of the two output terminals of the switching circuit SCA is electrically connected to the terminal outp, the input terminal of the inverter circuit INV8 is electrically connected to the output terminal of the inverter circuit INV6, the output terminal of the inverter circuit INV8 is electrically connected to the other input terminal of the switching circuit SCA, and the other output terminal of the switching circuit SCA is electrically connected to the terminal outn. FIG. 13B also illustrates a circuit BF3 including the inverter circuits INV5 and INV7 and a circuit BF4 including the inverter circuits INV6 and INV8. The circuit BF3 and/or the circuit BF4 may be, instead of the buffer circuit in FIG. 13B, an amplifier circuit configured using a logic circuit, a signal converter circuit (an analog-digital converter circuit, a digital-analog converter circuit, or the like), a potential level converter circuit, and the like.

Although the back gates of the transistor Tr25a and the transistor Tr25b are not illustrated in FIG. 13B, the transistor Tr25a and the transistor Tr25b may each have the back gate as in FIG. 13A. Unless otherwise specified, the presence or absence of a back gate of a transistor described in this specification and the like is not limited. For example, even when a back gate of a transistor is not illustrated in the drawings, the transistor can have a back gate.

Figure 14:
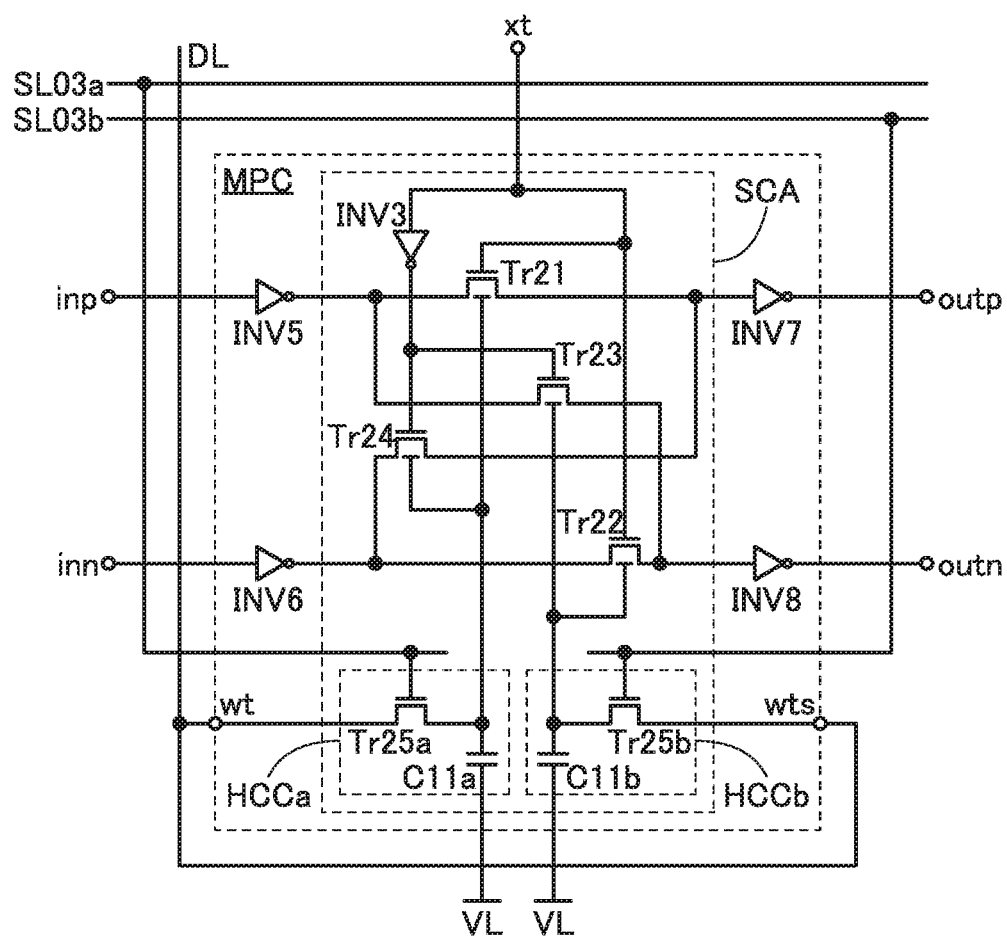
FIG. 14 is a circuit diagram illustrating a configuration example of a circuit in a semiconductor device.

For example, connection of the wirings in the circuit MPC in FIG. 13A may be changed. The circuit MPC in FIG. 14 has different wiring connection from the circuit MPC in FIG. 13A; a wiring SL03a is electrically connected to the gate of the transistor Tr25a in the holding unit HCCa, a wiring SL03b is electrically connected to the gate of the transistor Tr25b in the holding unit HCCb, and the wiring DL is electrically connected to the terminal wt and the terminal wts. That is, the circuit MPC in FIG. 14 is different from that in FIG. 13A in that the wiring DLa and the wiring DLb are combined into one wiring DL and the wiring SL03 is divided into the wiring SL03a and the wiring SL03b. In the case where different potentials are supplied to the holding unit HCCa and the holding unit HCCb in the circuit MPC in FIG. 14, the potentials cannot be supplied at the same time because the wiring DL is electrically connected to the terminal wt and the terminal wts. Thus, in the circuit MPC in FIG. 14, one of the transistor Tr25a and the transistor Tr25b is turned on and the other is turned off with the wiring SL03a and the wiring SL03b to supply the potential of the wiring DL to one of the holding unit HCCa and the holding unit HCCb.

<<Arithmetic Operation>>

Next, an operation example in which the circuit MPC in FIG. 13A is used as the arithmetic circuit 110 in FIG. 1A is described. In this operation example, the description is made with a focus on the circuit MPC[i] of the arithmetic circuit 110 in FIG. 1A. Note that the description of the contents already described in Embodiment 1 is omitted.

In the initial operation, the potential corresponding to the signal $x_i^{(k-1)}$ is input to the terminal xt. Thus, the transistors Tr21 to Tr24 are turned on or off in response to the potential corresponding to the signal $x_i^{(k-1)}$.

The wiring DLa inputs the potential corresponding to the weight coefficient $w_i^{(k-1)}{}_j^{(k)}$ to the terminal wt, and the wiring DLb inputs the intermediate potential to the terminal wts. After that, a high-level potential is supplied to the wiring SL03 to turn on the transistor Tr25a and the transistor Tr25b. With this operation, the potential corresponding to the weight coefficient $w_i^{(k-1)}{}_j^{(k)}$ is supplied to the first terminal of the capacitor C11a, and the intermediate potential is supplied to the first terminal of the capacitor C11b. Thus, the threshold voltages of the transistor Tr21 and the transistor Tr24 change with the weight coefficient $w_i^{(k-1)}{}_j^{(k)}$, and the threshold voltages of the transistor Tr22 and the transistor Tr23 change with the intermediate potential. Lastly, a low-level potential is supplied to the wiring SL03 to turn off the transistor Tr25a and the transistor Tr25b, whereby the potentials of the first terminals of the capacitor C11a and the capacitor C11b can be held.

After the initial operation, the signal Sp[i−1] and the signal Sn[i−1] are input to the terminal inp and the terminal inn, respectively, of the circuit MPC[i] (here, i is an integer greater than or equal to 1 and less than or equal to m), whereby arithmetic operation starts in the circuit MPC[i]. In particular, when i is 1, the signal Sp[0] and the signal Sn[0] are input to the terminal inp and the terminal inn, respectively, of the circuit MPC[1] with little time lag (substantially at the same time). When i is greater than or equal to 2, the signal Sp[i−1] and the signal Sn[i−1] are output from the circuit MPC[i−1]; thus, a time lag therebetween is sometimes generated. In the description of the arithmetic operation, the signal Sp[i−1] and the signal Sn[i−1] are input to the terminal inp and the terminal inn, respectively, of the circuit MPC[i] with little time lag (substantially at the same time) for convenience.

[Condition 1]

The case where the potential corresponding to the weight coefficient $w_i^{(k-1)}{}_j^{(k)}$ is a high-level potential and the potential corresponding to the signal $x_i^{(k-1)}$ is a high-level potential is considered.

At that time, the transistor Tr21 and the transistor Tr22 are turned on and the transistor Tr23 and the transistor Tr24 are turned off; thus, electrical continuity is established between the output terminal of the inverter circuit INV5 and the input terminal of the inverter circuit INV7, and between the output terminal of the inverter circuit INV6 and the input terminal of the inverter circuit INV8.

The high-level potential is supplied to the back gate of the transistor Tr21 and the intermediate potential is supplied to the back gate of the transistor Tr22; thus, the amount of current flowing between the source and the drain of the transistor Tr21 is larger than that of current flowing between the source and the drain of the transistor Tr22. Therefore, the speed of signal transmission from the output terminal of the inverter circuit INV5 to the input terminal of the inverter circuit INV7 is higher than that of signal transmission from the output terminal of the inverter circuit INV6 to the input terminal of the inverter circuit INV8. Thus, when signals are input to the terminal inp and the terminal inn at the same time, the signal input to the terminal inp is output to the terminal outp, and then, the signal input to the terminal inn is output to the terminal outn.

Since the signal is output from the terminal outp before the signal is output from the terminal outn, the timing chart of the circuit MPC[i] in this condition is the same as the timing chart in FIG. 7A. At Time T2, the potential of the terminal outp becomes high, and then, the potential of the terminal outn becomes high at Time T3. That is, the signal Sp[i] is output as an output signal from the terminal outp at Time T2, and the signal Sn[i] is output as an output signal from the terminal outn at Time T3.

[Condition 2]

The case where the potential corresponding to the weight coefficient $w_i^{(k-1)}{}_j^{(k)}$ is a low-level potential and the potential corresponding to the signal $x_i^{(k-1)}$ is a high-level potential is considered.

At that time, the transistor Tr21 and the transistor Tr22 are turned on and the transistor Tr23 and the transistor Tr24 are turned off; thus, electrical continuity is established between the output terminal of the inverter circuit INV5 and the input terminal of the inverter circuit INV7, and between the output terminal of the inverter circuit INV6 and the input terminal of the inverter circuit INV8.

The low-level potential is supplied to the back gate of the transistor Tr21 and the intermediate potential is supplied to the back gate of the transistor Tr22; thus, the amount of current flowing between the source and the drain of the transistor Tr21 is smaller than that of current flowing between the source and the drain of the transistor Tr22. Therefore, the speed of signal transmission from the output terminal of the inverter circuit INV5 to the input terminal of the inverter circuit INV7 is lower than that of signal transmission from the output terminal of the inverter circuit INV6 to the input terminal of the inverter circuit INV8. Thus, when signals are input to the terminal inp and the terminal inn at the same time, the signal input to the terminal inn is output to the terminal outn, and then, the signal input to the terminal inp is output to the terminal outp.

Since the signal is output from the terminal outp after the signal is output from the terminal outn, the timing chart of the circuit MPC[i] in this condition is the same as the timing chart in FIG. 7B. At Time T3, the potential of the terminal outn becomes high, and then, the potential of the terminal outp becomes high at Time T4. That is, the signal Sn[i] is output as the output signal from the terminal outn at Time T3, and the signal Sp[i] is output as the output signal from the terminal outp at Time T4.

[Condition 3]

The case where the potential corresponding to the weight coefficient $w_i^{(k-1)}{}_j^{(k)}$ is a high-level potential and the potential corresponding to the signal $x_i^{(k-1)}$ is a low-level potential is considered.

At that time, the transistor Tr21 and the transistor Tr22 are turned off and the transistor Tr23 and the transistor Tr24 are turned on; thus, electrical continuity is established between the output terminal of the inverter circuit INV5 and the input terminal of the inverter circuit INV8, and between the output terminal of the inverter circuit INV6 and the input terminal of the inverter circuit INV7.

The high-level potential is supplied to the back gate of the transistor Tr24 and the intermediate potential is supplied to the back gate of the transistor Tr23; thus, the amount of current flowing between the source and the drain of the transistor Tr24 is larger than that of current flowing between the source and the drain of the transistor Tr23. Therefore, the speed of signal transmission from the output terminal of the inverter circuit INV6 to the input terminal of the inverter circuit INV7 is higher than that of signal transmission from the output terminal of the inverter circuit INV5 to the input terminal of the inverter circuit INV8. Thus, when signals are input to the terminal inp and the terminal inn at the same time, the signal input to the terminal inn is output to the terminal outp, and then, the signal input to the terminal inp is output to the terminal outn.

Since the signal is output from the terminal outp after the signal is output from the terminal outn, the timing chart of the circuit MPC[i] in this condition is the same as the timing chart in FIG. 7C. At Time T2, the potential of the terminal outn becomes high, and then, the potential of the terminal outp becomes high at Time T3. That is, the signal Sn[i] is output as the output signal from the terminal outn at Time T2, and the signal Sp[i] is output as the output signal from the terminal outp at Time T3.

[Condition 4]

The case where the potential corresponding to the weight coefficient $w_i^{(k-1)}{}_j^{(k)}$ is a low-level potential and the potential corresponding to the signal $x_i^{(k-1)}$ is a low-level potential is considered.

At that time, the transistor Tr21 and the transistor Tr22 are turned off and the transistor Tr23 and the transistor Tr24 are turned on; thus, electrical continuity is established between the output terminal of the inverter circuit INV5 and the input terminal of the inverter circuit INV8, and between the output terminal of the inverter circuit INV6 and the input terminal of the inverter circuit INV7.

The low-level potential is supplied to the back gate of the transistor Tr24 and the intermediate potential is supplied to the back gate of the transistor Tr23; thus, the amount of current flowing between the source and the drain of the transistor Tr24 is smaller than that of current flowing between the source and the drain of the transistor Tr23. Therefore, the speed of signal transmission from the output terminal of the inverter circuit INV6 to the input terminal of the inverter circuit INV7 is lower than that of signal transmission from the output terminal of the inverter circuit INV5 to the input terminal of the inverter circuit INV8. Thus, when signals are input to the terminal inp and the terminal inn at the same time, the signal input to the terminal inp is output to the terminal outn, and then, the signal input to the terminal inn is output to the terminal outp.

Since the signal is output from the terminal outp before the signal is output from the terminal outn, the timing chart of the circuit MPC[i] in this condition is the same as the timing chart in FIG. 7D. At Time T3, the potential of the terminal outp becomes high, and then, the potential of the terminal outn becomes high at Time T4. That is, the signal Sp[i] is output as the output signal from the terminal outp at Time T3, and the signal Sn[i] is output as the output signal from the terminal outn at Time T4.

In the conditions 1 to 4, the time lag T[i] between the output of the signal Sn[i] from the terminal outn and the output of the signal Sp[i] from the terminal outp is determined by the potential corresponding to the weight coefficient $w_i^{(k-1)}{}_j^{(k)}$ and the potential corresponding to the signal $x_i^{(k-1)}$ as in the description of the arithmetic operation example in Embodiment 1. Specifically, when the transistor Tr21 and the transistor Tr24 operate with a potential, which is supplied to the gates of the transistor Tr21 and the transistor Tr24 (the potential corresponding to the signal $x_i^{(k-1)}$), in the range of −0.8 V to 2.5 V inclusive, a high-level potential of 1.5 V or higher and a low-level potential of lower than 1.5 V are supplied as the potential corresponding to the weight coefficient $w_i^{(k-1)}{}_j^{(k)}$ to the back gates of the transistor Tr21 and the transistor Tr24. When the transistor Tr22 and the transistor Tr23 operate with a potential, which is supplied to the gates of the transistor Tr22 and the transistor Tr23 (the potential corresponding to the signal $x_i^{(k-1)}$), in the range of −0.8 V to 2.5 V inclusive, a potential between the high-level potential and the low-level potential, which are supplied to the back gates of the transistor Tr21 and the transistor Tr24, is supplied as the intermediate potential to the back gates of the transistor Tr22 and the transistor Tr23. For the relationship between the time lag T[i], the weight coefficient $w_i^{(k-1)}{}_j^{(k)}$, and the signal $x_i^{(k-1)}$, refer to the description of the arithmetic operation example in Embodiment 1.

As described above, when the signal Sp[i−1] and the signal Sn[i−1] are input to the circuit MPC[i], the circuit MPC[i] outputs the signal Sp[i] and the signal Sn[i] to which the time lag T[i], which is determined by the potential corresponding to the weight coefficient $w_i^{(k-1)}{}_j^{(k)}$ and the potential corresponding to the signal $x_i^{(k-1)}$, is added.

Then, as in FIG. 1A, the arithmetic circuit 110 is configured using the m connected circuits MPC, whereby the signal $z_j^{(k)}$ can be output from the terminal outa of the circuit ACTF. For the arithmetic operation in this case, refer to the description of the arithmetic operation where the plurality of circuits MPC are connected in Embodiment 1.

Configuration Example 2

Next, a configuration example of a circuit that can be used as the circuit MPC in FIG. 12A and is different from Configuration example 1 is described.

Figure 15:
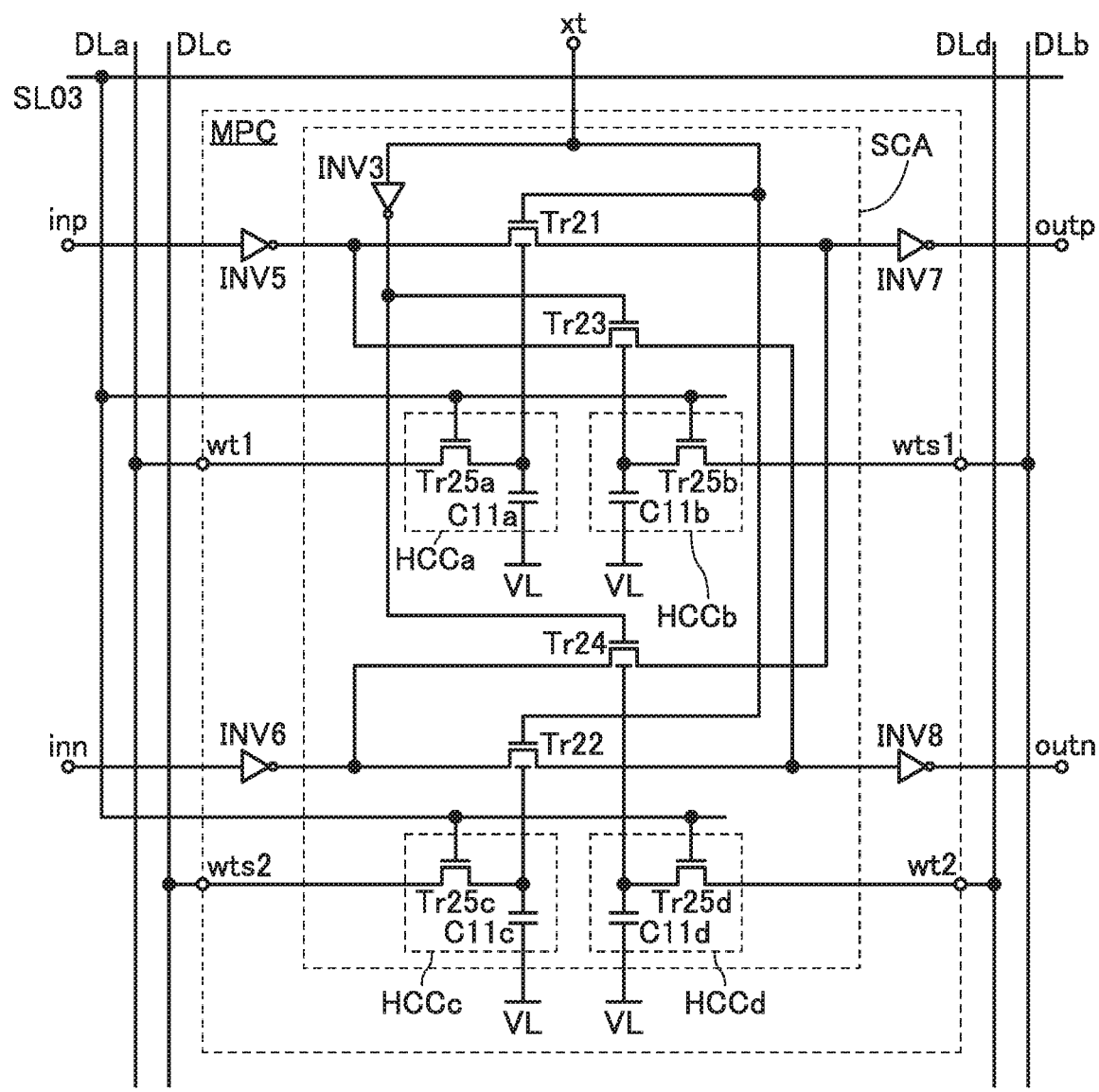
FIG. 15 is a circuit diagram illustrating a configuration example of a circuit in a semiconductor device.

The circuit MPC in FIG. 15 is different from that in FIGS. 13A and 13B in that the back gates of the transistors Tr21 to Tr24 are each provided with a holding unit. The switching circuit SCA of the circuit MPC in FIG. 15 includes, as the holding unit HCC in FIG. 12A, the holding unit HCCa, the holding unit HCCb, a holding unit HCCc, and a holding unit HCCd.

The holding unit HCCa includes the transistor Tr25a and the capacitor C11a. The first terminal of the transistor Tr25a is electrically connected to the back gate of the transistor Tr21 and the first terminal of the capacitor C11a. The second terminal of the transistor Tr25a is electrically connected to the wiring SL03 through a terminal wt1. The gate of the transistor Tr25a is electrically connected to the wiring SL03. The second terminal of the capacitor C11a is electrically connected to the wiring VL.

The holding unit HCCb includes the transistor Tr25b and the capacitor C11b. The holding unit HCCc includes a transistor Tr25c and a capacitor C11c. The holding unit HCCd includes a transistor Tr25d and a capacitor C11d. The holding unit HCCb, the holding unit HCCc, and the holding unit HCCd can each have a circuit configuration similar to that of the holding unit HCCa, for example. In the circuit MPC in FIG. 15, the holding unit HCCb, the holding unit HCCc, and the holding unit HCCd each have the configuration similar to that of the holding unit HCCa.

The first terminal of the transistor Tr25b is electrically connected to the back gate of the transistor Tr23, and the second terminal of the transistor Tr25b is electrically connected to the wiring DLb through a terminal wts1. A first terminal of the transistor Tr25c is electrically connected to the back gate of the transistor Tr22, and a second terminal of the transistor Tr25c is electrically connected to a wiring of DLc through a terminal wts2. A first terminal of the transistor Tr25d is electrically connected to the back gate of the transistor Tr24, and a second terminal of the transistor Tr25d is electrically connected to a wiring DLd through a terminal wt2.

Accordingly, the holding unit HCCa has the configuration similar to that of the holding unit HCCa of the circuit MPC in FIGS. 13A and 13B and thus can hold the potential of the back gate of the transistor Tr21. Similarly, the holding unit HCCb can hold the potential of the back gate of the transistor Tr23, the holding unit HCCc can hold the potential of the back gate of the transistor Tr22, and the holding unit HCCd can hold the potential of the back gate of the transistor Tr24.

The wiring SL03 illustrated in FIG. 15 corresponds to the wiring SL03 illustrated in FIG. 13A. Hence, the potentials are supplied to the holding unit HCCa, the holding unit HCCb, the holding unit HCCc, and the holding unit HCCd by turning on the transistor Tr25a, the transistor Tr25b, the transistor Tr25c, and the transistor Tr25d by supplying a high-level potential to the wiring SL03. After that, the potentials are held in the holding unit HCCa, the holding unit HCCb, the holding unit HCCc, and the holding unit HCCd by turning off the transistor Tr25a, the transistor Tr25b, the transistor Tr25c, and the transistor Tr25d by supplying a low-level potential to the wiring SL03.

The terminal wt1 and the terminal wt2 in FIG. 15 correspond to the terminal wt in FIG. 13A, and the terminal wts1 and the terminal wts2 in FIG. 15 correspond to the terminal wts in FIG. 13A. Thus, in FIG. 15, the wiring DLa and the wiring DLd supply the potential corresponding to the weight coefficient $w_i^{(k-1)}{}_j^{(k)}$, and the wiring DLb and the wiring DLc supply the intermediate potential.

The potential held in the first terminal of the capacitor C11a in the holding unit HCCa is preferably equal to the potential held in the first terminal of the capacitor C11d in the holding unit HCCd. Thus, the terminal wt1 and the terminal wt2 may be the same terminals. Alternatively, the wiring DLa and the wiring DLd may be combined into one wiring. The potential held in the first terminal of the capacitor C11b in the holding unit HCCb is preferably equal to the potential held in the first terminal of the capacitor C11c in the holding unit HCCc. Thus, the terminal wts1 and the terminal wts2 may be the same terminals. Alternatively, the wiring DLb and the wiring DLc may be combined into one wiring.

The characteristics of the transistors Tr21 to Tr24 may differ from each other in the manufacturing process of the arithmetic circuit 110, for example. In that case, the potentials to be supplied to the back gates of the transistors Tr21 to Tr24 are corrected in accordance with the characteristics of the transistors Tr21 to Tr24, and the corrected potentials are supplied to the back gates of the transistors Tr21 to Tr24. In addition, it is preferable that the terminal wt1 and the terminal wt2 be different terminals and electrically connected to different wirings, and the terminal wts1 and the terminal wts2 be different terminals and electrically connected to different wirings, as in the circuit MPC in FIG. 15.

Figure 16:
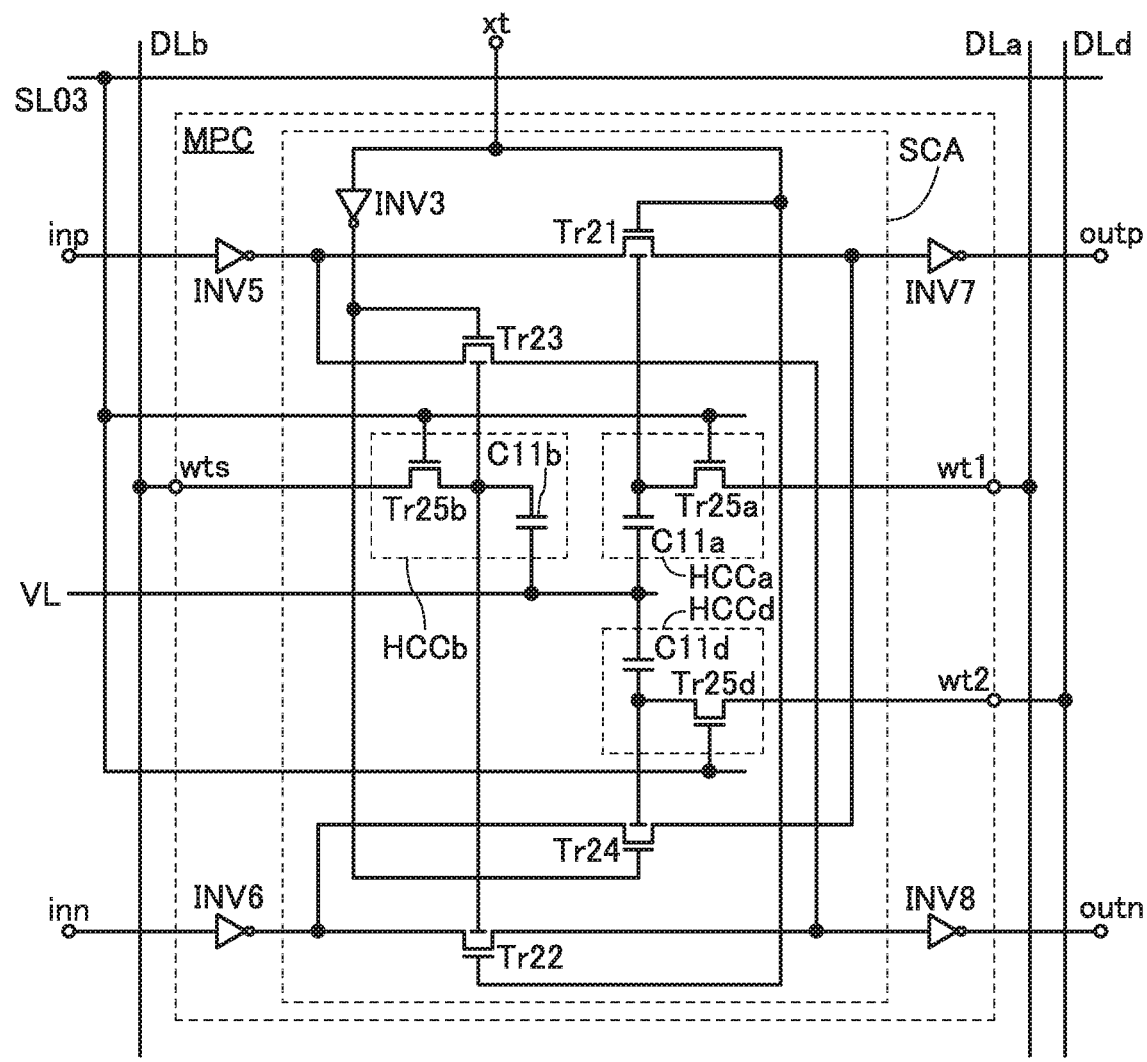
FIG. 16 is a circuit diagram illustrating a configuration example of a circuit in a semiconductor device.

Note that the configuration of the circuit MPC in FIG. 12A is not limited to that of the circuit MPC in FIG. 15, and the configuration of the circuit MPC in FIG. 15 may be changed depending on the circumstances. For example, as illustrated in FIG. 16, the potentials of the back gates of the transistor Tr22 and the transistor Tr23 may be held in the holding unit HCCb. Although in the circuit MPC in FIG. 16, the holding unit HCCb and the holding unit HCCc in FIG. 15 are combined into the holding unit HCCb, the holding unit HCCa and the holding unit HCCb may be combined into one holding unit instead of the holding unit HCCb and the holding unit HCCc in FIG. 15. When the potentials of the back gates of the transistors Tr21 to Tr24 are held, some of the holding units in the circuit MPC can be combined into one holding unit.

For another example, although the wiring SL03 is electrically connected to the gates of the transistor Tr25$a$, the transistor Tr25$b$, the transistor Tr25$c$, and the transistor Tr25$d$ in the holding unit HCCa, the holding unit HCCb, the holding unit HCCc, and the holding unit HCCd, respectively, of the circuit MPC in FIG. 15, different wirings may be electrically connected to the gates of the transistors as in the circuit MPC in FIG. 14. In that case, the on/off switchings of the transistors can be independently performed; thus, the wiring DLa, the wiring DLb, the wiring DLc, and the wiring DLd can be combined into one wiring. For example, when the potential is held in any of the holding unit HCCa, the holding unit HCCb, the holding unit HCCc, and the holding unit HCCd, the transistor in the corresponding holding unit is turned on, the transistors in the other holding units are turned off, and the potential to be held is supplied to the corresponding holding unit from the wiring combining the wiring DLa, the wiring DLb, the wiring DLc, and the wiring DLd.

Configuration Example 3

Next, a configuration example of a circuit that can be used as the circuit MPC in FIG. 12A and is different from Configuration examples 1 and 2 is described.

Figure 17:
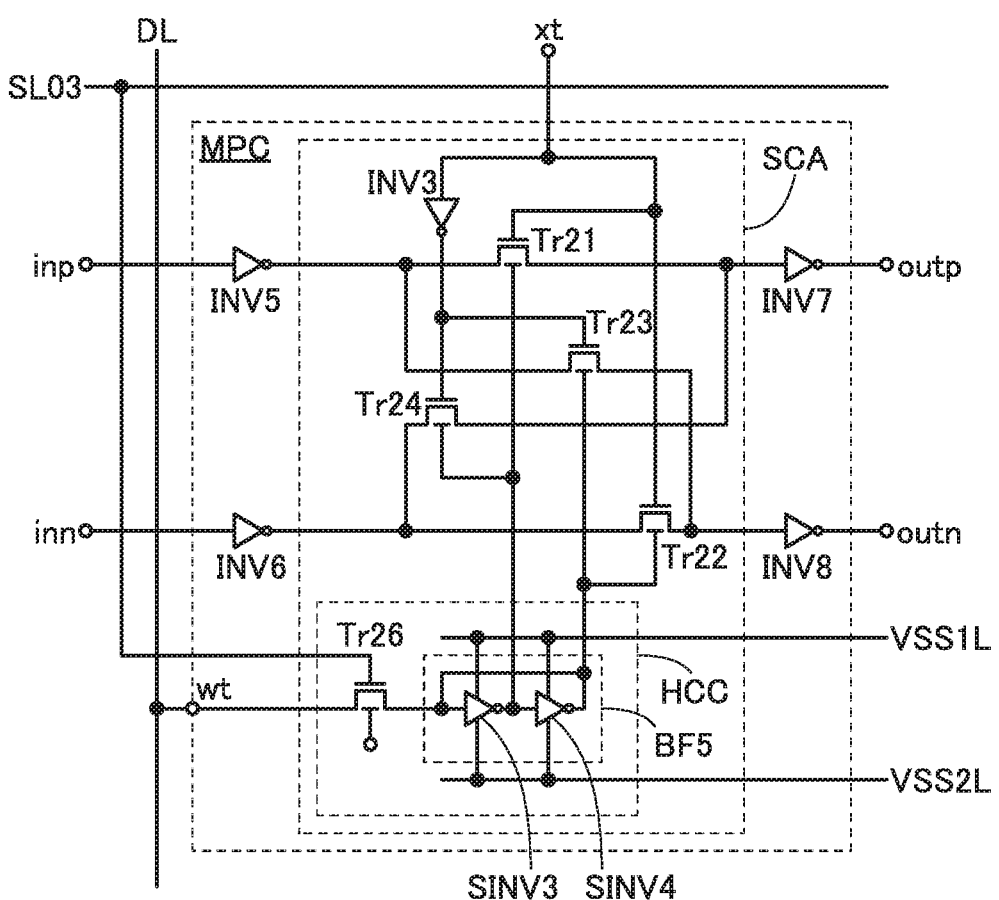
FIG. 17 is a circuit diagram illustrating a configuration example of a circuit in a semiconductor device.

The circuit MPC in FIG. 17 is different from that in FIG. 13A in the configuration of the holding unit HCC. The holding unit HCC in the circuit MPC in FIG. 17 includes an inverter circuit SINV3, an inverter circuit SINV4, and a transistor Tr26. An output terminal of the inverter circuit SINV3 is electrically connected to an input terminal of the inverter circuit SINV4 and the back gates of the transistor Tr21 and the transistor Tr24, and an output terminal of the inverter circuit SINV4 is electrically connected to an input terminal of the inverter circuit SINV3, a first terminal of the transistor Tr26, and the back gates of the transistor Tr22 and the transistor Tr23. A second terminal of the transistor Tr26 is electrically connected to the wiring DL through the terminal wt, and a gate of the transistor Tr26 is electrically connected to the wiring SL03.

The holding unit HCC in the circuit MPC in FIG. 17 includes an inverter loop configured using the inverter circuit SINV3 and the inverter circuit SINV4. Note that FIG. 17 also illustrates a circuit BF5 including the inverter circuit SINV3 and the inverter circuit SINV4. The number of inverter circuits is not limited to two and is desirably two or more because the input and the output having the same logical value enable the circuit to be configured more easily.

High power supply potential input terminals of the inverter circuit SINV3 and the inverter circuit SINV4 are electrically connected to a wiring VSS1L, and low power supply potential input terminals of the inverter circuit SINV3 and the inverter circuit SINV4 are electrically connected to a wiring VSS2L.

The wiring VSS1L functions as a voltage line that supplies a voltage VSS1. The wiring VSS2L functions as a voltage line that supplies a voltage VSS2 which is lower than the voltage VSS1. The voltage VSS1 can be lower than or equal to the voltage VSS, for example.

The wiring SL03 in FIG. 17 corresponds to the wiring SL03 in FIG. 13A. Hence, the potential is supplied to the holding unit HCC by turning on the transistor Tr26 by supplying a high-level potential to the wiring SL03. After that, the potential is held in the holding unit HCC by turning off the transistor Tr26 by supplying a low-level potential to the wiring SL03.

As illustrated in FIG. 17, the holding unit HCC includes the inverter loop configured using the inverter circuit SINV3 and the inverter circuit SINV4 and thus can hold one of VSS1 and VSS2 as the potentials of the back gates of the transistor Tr21 and the transistor Tr24, and can hold the other of VSS1 and VSS2 as the potentials of the back gates of the transistor Tr22 and the transistor Tr23 in response to the potential input to the input terminal of the inverter circuit SINV3.

That is, the holding unit HCC in FIG. 17 can hold binary data as a weight coefficient. Thus, in the case where the circuit MPC in FIG. 17 is used as the circuit MPC included in the arithmetic circuit 110 in FIG. 1A, the weight coefficient input to the terminal wt is preferably binary data.

The potentials supplied to the back gates of the transistors Tr21 to Tr24 are VSS1 or VSS2; thus, there are two patterns of time lag between the signal output from the terminal outp and the signal output from the terminal outn.

In order to hold the potential input from the wiring DL to the circuit BF5 in the holding unit HCC, the transistor Tr26 preferably has low off-state current. Thus, the transistor Tr26 is preferably the OS transistor described above. The transistor Tr26 in FIG. 17 has the back gate, and the on-state current can be increased by electrically connecting the back gate and the gate of the transistor Tr26 to each other, for example. The off-state current of the transistor Tr26 can be further reduced by electrically connecting the back gate to a wiring that supplies a low potential. Note that the transistor Tr26 does not necessarily have the back gate.

Configuration Example 4

Figure 18:
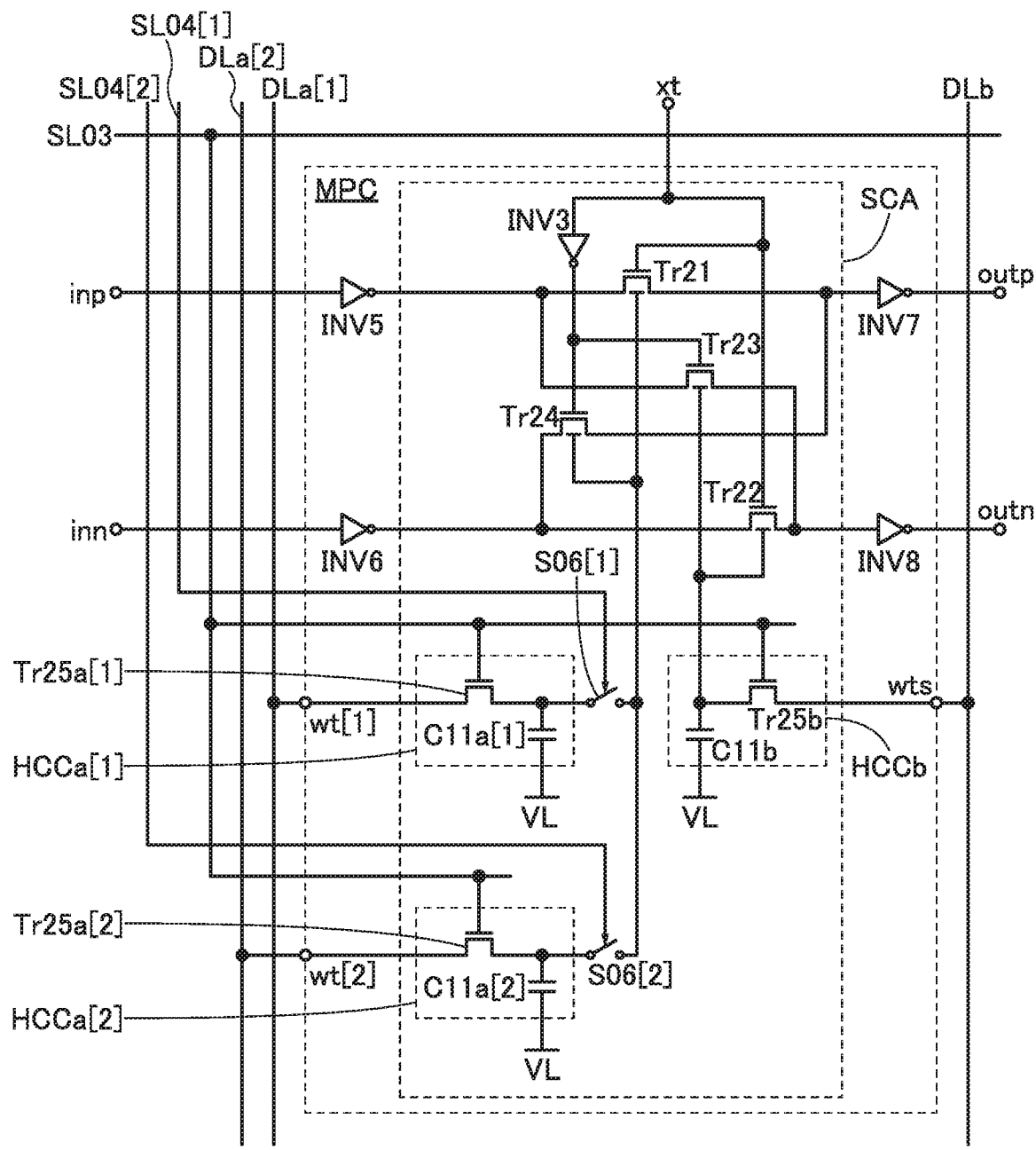
FIG. 18 is a circuit diagram illustrating a configuration example of a circuit in a semiconductor device.

The circuit MPC in FIG. 18 is different from that in FIG. 13A in the number of holding units HCC that hold the potentials of the back gates of the transistor Tr21 and the transistor Tr24. Specifically, the switching circuit SCA in FIG. 18 includes a holding unit HCCa[1] and a holding unit HCCa[2] as the holding unit HCCa of the circuit MPC in FIG. 13A.

The switching circuit SCA in FIG. 18 includes a switch S06[1] and a switch S06[2] in addition to the circuit components of the circuit MPC in FIG. 13A. The holding unit HCCa[1] and the holding unit HCCa[2] each have a circuit configuration similar to that of the holding unit HCCa of the switching circuit SCA in FIG. 13A. Note that in the holding unit HCCa[1] in FIG. 18, a transistor Tr25$a$[1] corresponds to the transistor Tr25$a$ in FIG. 13A and a capacitor C11$a$[1] corresponds to the capacitor C11$a$ in FIG. 13A. In addition, in the holding unit HCCa[2] in FIG. 18, a transistor Tr25$a$[2] corresponds to the transistor Tr25$a$ in FIG. 13A and a capacitor C11$a$[2] corresponds to the capacitor C11$a$ in FIG. 13A.

A first terminal of the switch S06[1] is electrically connected to the back gates of the transistor Tr21 and the transistor Tr24, a second terminal of the switch S06[1] is electrically connected to a first terminal of the transistor Tr25a[1] and a first terminal of the capacitor C11a[1], and a control terminal of the switch S06[1] is electrically connected to a wiring SL04[1]. A second terminal of the transistor Tr25a[1] is electrically connected to a wiring DLa[1] through a terminal wt[1], and a gate of the transistor Tr25a[1] is electrically connected to the wiring SL03.

With the above connection configuration, the holding unit HCCa[1] is electrically connected to the terminal wt[1] and thus can hold a potential corresponding to a signal input from the terminal wt[1].

A first terminal of the switch S06[2] is electrically connected to the back gates of the transistor Tr21 and the transistor Tr24, a second terminal of the switch S06[2] is electrically connected to a first terminal of the transistor Tr25a[2] and a first terminal of the capacitor C11a[2], and a control terminal of the switch S06[2] is electrically connected to a wiring SL04[2]. A second terminal of the transistor Tr25a[2] is electrically connected to a wiring DLa[2] through a terminal wt[2], and a gate of the transistor Tr25a[2] is electrically connected to the wiring SL03.

With the above connection configuration, the holding unit HCCa[2] is electrically connected to the terminal wt[2] and thus can hold a potential corresponding to a signal input from the terminal wt[2].

The switch S06[1] is turned on or off by supplying a potential from the wiring SL04[1] to the control terminal of the switch S06[1]. Similarly, the switch S06[2] is turned on or off by supplying a potential from the wiring SL04[2] to the control terminal of the switch S06[2]. Note that in this specification and the like, the switch S06[1] and the switch S06[2] are turned on by supplying a high-level potential to their control terminals, and are turned off by supplying a low-level potential to their control terminals.

As in the terminal wt in FIG. 13A, the potential corresponding to the weight coefficient is input to the terminal wt[1] and the terminal wt[2]. That is, like the holding unit HCC in FIG. 13A, the holding unit HCCa[1] and the holding unit HCCa[2] can hold the potentials corresponding to the weight coefficients. In other words, the switching circuit SCA in the circuit MPC in FIG. 18 can hold the potentials corresponding to two weight coefficients.

When the circuit MPC in FIG. 18 is used as all the circuits MPC in the arithmetic circuit 110, arithmetic operations can be performed with changes in the weight coefficients. For example, in the switching circuits SCA in the circuits MPC[1] to MPC[m] in the arithmetic circuit 110, the potentials corresponding to the weight coefficients $w_1^{(k-1)(k)}_j$ to $w_m^{(k-1)(k)}_j$ are held in the holding units HCCa[1], the potentials corresponding to the weight coefficients $w_1^{(k-1)(k)}_h$ to $w_m^{(k-1)(k)}_h$ (here, h is an integer greater than or equal to 1 and less than or equal to n, and not j) are held in the holding units HCCa[2], and the signals $x_1^{(k-1)}$ to $x_m^{(k-1)}$ corresponding to the signals $z_1^{(k-1)}$ to $z_m^{(k-1)}$ are input to the terminals xt. Intermediate potentials are held in the holding units HCCb. At this time, a high-level potential is supplied to the wiring SL04[1] to turn on the switch S06[1] and a low-level potential is supplied to the wiring SL04[2] to turn off the switch S06[2], so that the arithmetic circuit 110 can perform the product-sum operation of the weight coefficients $w_1^{(k-1)(k)}_j$ to $w_m^{(k-1)(k)}_j$ and the signals $z_1^{(k-1)}$ to $z_m^{(k-1)}$ and the arithmetic operation of the activation function. In addition, a low-level potential is supplied to the wiring SL04[1] to turn off the switch S06[1] and a high-level potential is supplied to the wiring SL04[2] to turn on the switch S06[2], so that the arithmetic circuit 110 can perform the product-sum operation of the weight coefficients $w_1^{(k-1)(k)}_h$ to $w_m^{(k-1)(k)}_h$ and the signals $z_1^{(k-1)}$ to $z_m^{(k-1)}$ and the arithmetic operation of the activation function.

When the circuit MPC in FIG. 18 is used as all the circuits MPC in the arithmetic circuit 110, the weight coefficients can be changed and thus arithmetic operation for each weight coefficient can be performed. Although the switching circuit SCA in FIG. 18 includes the holding unit HCCa[1] and the holding unit HCCa[2] as the holding unit HCCa in FIG. 13A, the holding unit HCC may include three or more holding units. In the case where the weight coefficient used in the neural network is 1-bit (binary) data, for example, a high-level potential is held in the holding unit HCCa[1] and a low-level potential is held in the holding unit HCCa[2] so that the arithmetic operation can be performed with changes in the weight coefficients depending on the conditions.

Configuration Example 5

Here, a configuration example of a circuit that can be used as the circuit MPC in FIG. 12C is described.

Figure 19A:
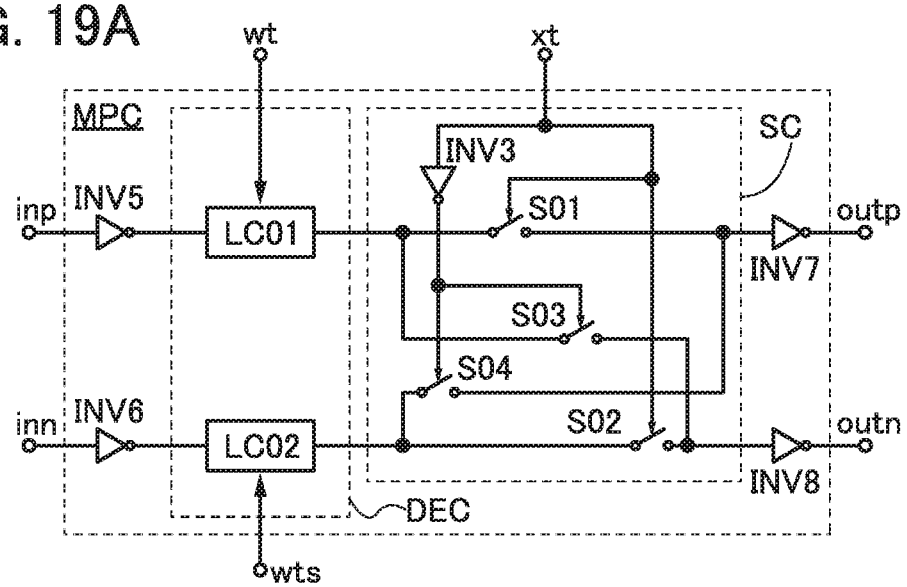
FIGS. 19A and 19B are block diagrams illustrating configuration examples of a circuit in a semiconductor device.

The circuit MPC in FIG. 19A includes the inverter circuits INV5 to INV8, the circuit DEC, and the switching circuit SC in FIG. 3A that is described in Embodiment 1.

The input terminal of the inverter circuit INV5 is electrically connected to the terminal inp, and the output terminal of the inverter circuit INV5 is electrically connected to one of two input terminals of the circuit DEC. The input terminal of the inverter circuit INV6 is electrically connected to the terminal inn, and the output terminal of the inverter circuit INV6 is electrically connected to the other input terminal of the circuit DEC. One of two output terminals of the circuit DEC is electrically connected to one of two input terminals of the switching circuit SC, and the other output terminal of the circuit DEC is electrically connected to the other input terminal of the switching circuit SC. The input terminal of the inverter circuit INV7 is electrically connected to one of two output terminals of the switching circuit SC, and the output terminal of the inverter circuit INV7 is electrically connected to the terminal outp. The input terminal of the inverter circuit INV8 is electrically connected to the other output terminal of the switching circuit SC, and the output terminal of the inverter circuit INV8 is electrically connected to the terminal outn.

The circuit DEC includes a load circuit LC01 and a load circuit LC02.

A first terminal of the load circuit LC01 is electrically connected to one of the two input terminals of the circuit DEC, and a second terminal of the load circuit LC01 is electrically connected to one of the two output terminals of the circuit DEC. A first terminal of the load circuit LC02 is electrically connected to the other input terminal of the circuit DEC, and a second terminal of the load circuit LC02 is electrically connected to the other output terminal of the circuit DEC.

The load circuit LC01 is electrically connected to the terminal wt, and the load circuit LC02 is electrically connected to the terminal wts. The resistances of the load circuit LC01 and the load circuit LC02 are determined by the signals input to the terminal wt and the terminal wts, respectively.

Figure 19B:
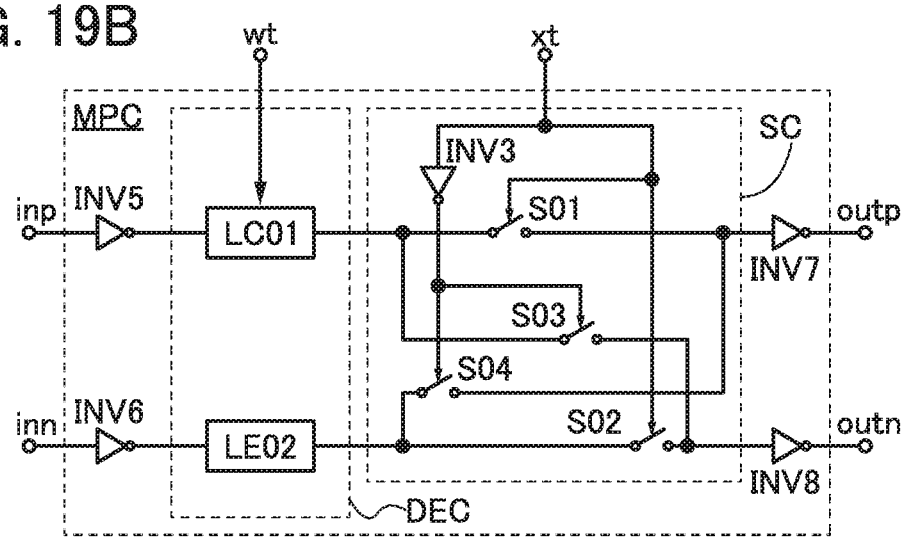

Note that in the circuit MPC in FIG. 19A, the resistance of the load circuit LC02 is not necessarily changed. Specifically, as in the circuit MPC in FIG. 19B, a load element LE02 whose resistance does not change may be used instead of the load circuit LC02. The load circuit LC02 has a function of supplying a reference load of the load circuit LC01. Thus, in the case where the reference load does not need to be changed, the load element LE02 is used instead. Note that a resistor, a coil, a transistor, or the like can be used as the load element LE02. The load element LE02 does not necessarily include a circuit component, i.e., the load element LE02 may be a wiring that directly and electrically connects the output terminal of the inverter circuit INV6 to the other input terminal of the switching circuit SC.

Figure 20A:
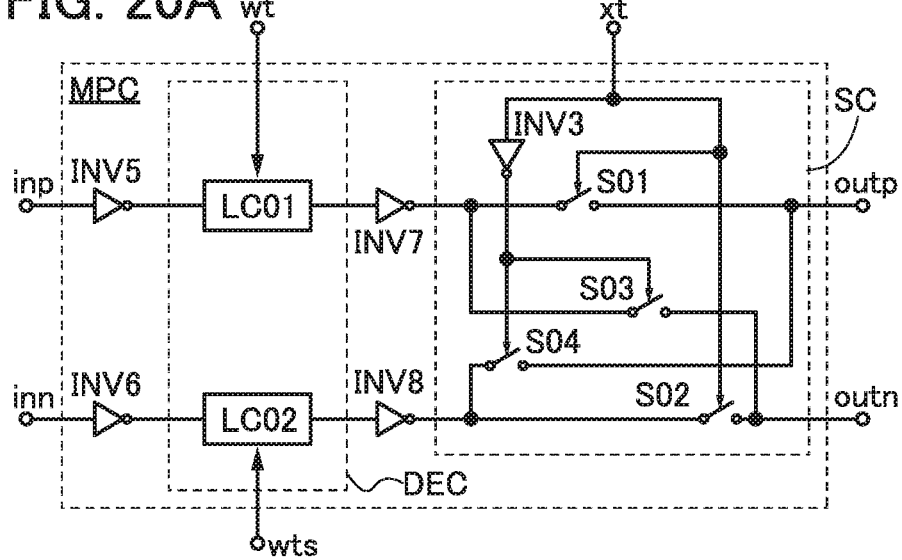
FIGS. 20A and 20B are block diagrams illustrating configuration examples of a circuit in a semiconductor device.
Figure 20B:
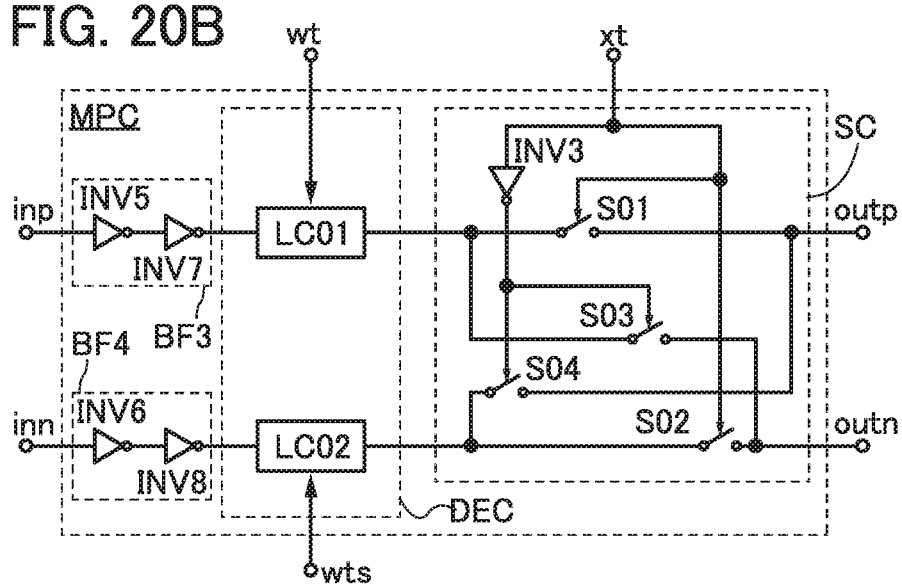

In the circuit MPC in FIG. 19A, the inverter circuit INV7 and the inverter circuit INV8 may be provided between the circuit DEC and the switching circuit SC as in FIG. 20A. Furthermore, the inverter circuit INV7 and the inverter circuit INV8 may be provided as in the circuit MPC in FIG. 13B and as in FIG. 20B such that the inverter circuit INV5 and the inverter circuit INV7 are electrically connected to each other in series, and the inverter circuit INV6 and the inverter circuit INV8 are electrically connected to each other in series. Note that FIG. 20B illustrates the circuit BF3 including the inverter circuit INV5 and the inverter circuit INV7, and the circuit BF4 including the inverter circuit INV6 and the inverter circuit INV8.

Figure 21A:
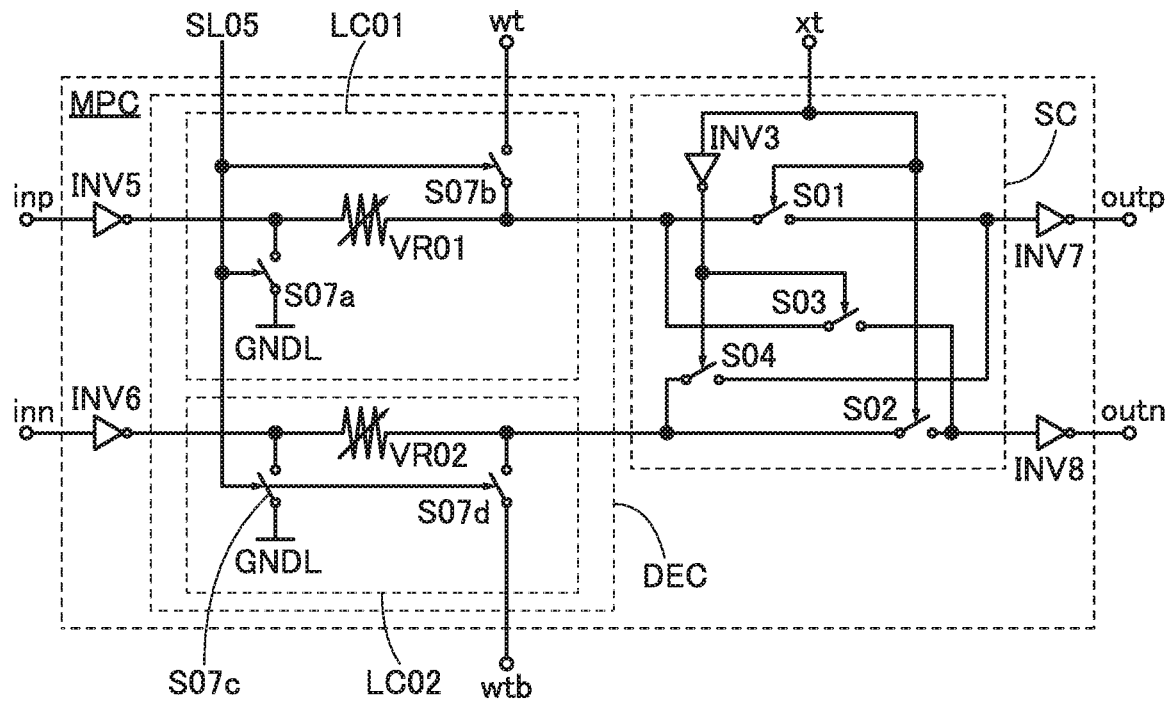
FIGS. 21A and 21B are circuit diagrams illustrating configuration examples of a circuit in a semiconductor device.

FIG. 21A illustrates an example of a circuit including variable resistors as the load circuit LC01 and the load circuit LC02. The load circuit LC01 in the circuit DEC in FIG. 21A includes a variable resistor VR01, a switch S07a, and a switch S07b. Similarly, the load circuit LC02 in the circuit DEC includes a variable resistor VR02, a switch S07c, and a switch S07d. Note that each of the switches S07a to S07d is turned on by supplying a high-level potential to its control terminal, and turned off by supplying a low-level potential to its control terminal.

The variable resistor VR01 (the variable resistor VR02) can be formed using, for example, a conductor (e.g., silver, platinum, titanium nitride, or titanium dioxide) functioning as a pair of electrodes and a metal oxide (e.g., a metal oxide having a perovskite structure) interposed between the pair of electrodes.

In the load circuit LC01, a first terminal of the switch S07a is electrically connected to one of the two input terminals of the circuit DEC and a first terminal of the variable resistor VR01, a second terminal of the switch S07a is electrically connected to, for example, a wiring GNDL that supplies a ground potential, and a control terminal of the switch S07a is electrically connected to a wiring SL05. A first terminal of the switch S07b is electrically connected to one of the two output terminals of the circuit DEC and a second terminal of the variable resistor VR01, a second terminal of the switch S07b is electrically connected to the terminal wt, and a control terminal of the switch S07b is electrically connected to the wiring SL05.

In the load circuit LC02, a first terminal of the switch S07c is electrically connected to the other input terminal of the circuit DEC and a first terminal of the variable resistor VR02, a second terminal of the switch S07c is electrically connected to, for example, the wiring GNDL, and a control terminal of the switch S07c is electrically connected to the wiring SL05. A first terminal of the switch S07d is electrically connected to the other output terminal of the circuit DEC and a second terminal of the variable resistor VR02, a second terminal of the switch S07d is electrically connected to a terminal wtb, and a control terminal of the switch S07d is electrically connected to the wiring SL05.

The signal corresponding to the weight coefficient is input to the terminal wt. The terminal wtb corresponds to the terminal wts in the circuit MPC in FIGS. 20A and 20B, and an inverted signal of the signal is input to the terminal wtb.

The wiring GNDL can supply a voltage GND. The voltage GND can be, for example, a ground potential. In addition, the wiring GNDL may have a function of supplying another reference potential instead of the ground potential.

The wiring SL05 has a function of turning on or off the switches S07a to S07d. In this specification and the like, the switches S07a to S07d are turned on by supplying a high-level potential to the wiring SL05, and are turned off by supplying a low-level potential to the wiring SL05. Thus, voltage between the first terminal and the second terminal of the variable resistor VR01 becomes voltage corresponding to the signal input from the terminal wt, and voltage between the first terminal and the second terminal of the variable resistor VR02 becomes voltage corresponding to the signal input from the terminal wtb. That is, the resistances of the variable resistor VR01 and the variable resistor VR02 are determined by the signals input to the terminal wt and the terminal wts, respectively.

For example, by supplying a high-level potential to the terminal wt (the terminal wtb), the resistance of the variable resistor VR01 (the variable resistor VR02) can be reduced. In addition, for example, by supplying a low-level potential to the terminal wt (the terminal wtb), the resistance of the variable resistor VR01 (the variable resistor VR02) can be increased. Thus, in the circuit MPC, the signal-transmission speed between the terminals inp and inn and the terminals outp and outn can be changed.

In the circuit DEC of the circuit MPC in FIG. 21A, the connection to the wiring GNDL via the switch S07a and/or the switch S07c can be omitted depending on the circumstances. In that case, the circuit MPC has a configuration shown in FIG. 21B, which has reduced circuit area as compared to the circuit MPC in FIG. 21A.

In the circuit DEC of the circuit MPC in FIG. 21A, the electrical connection between the variable resistor VR01 (the variable resistor VR02) and the switches S07a to S07d may be changed depending on the circumstances. For example, the circuit DEC in FIG. 21A may have a configuration as in the circuit MPC in FIG. 22, in which in the load circuit LC01 (the load circuit LC02), the first terminal of the variable resistor VR01 (the variable resistor VR02) is electrically connected to the first terminal of the switch S07b (the switch S07d), and the second terminal of the variable resistor VR01 (the variable resistor VR02) is electrically connected to the first terminal of the switch S07a (the switch S07c).

Figure 21B:
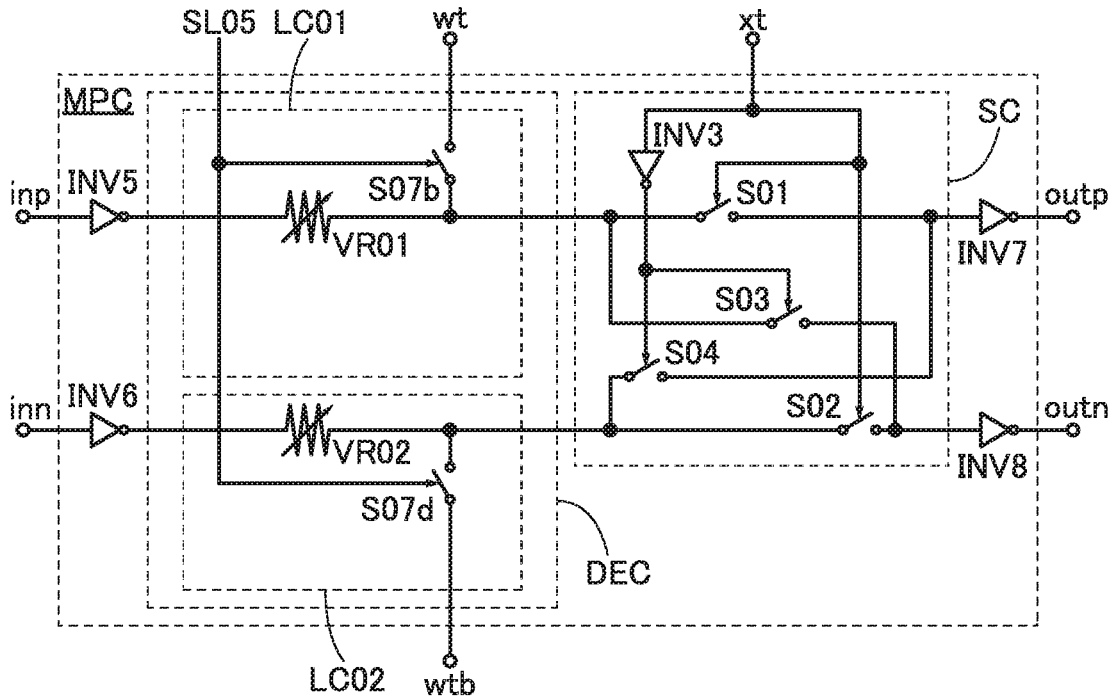
Figure 22:
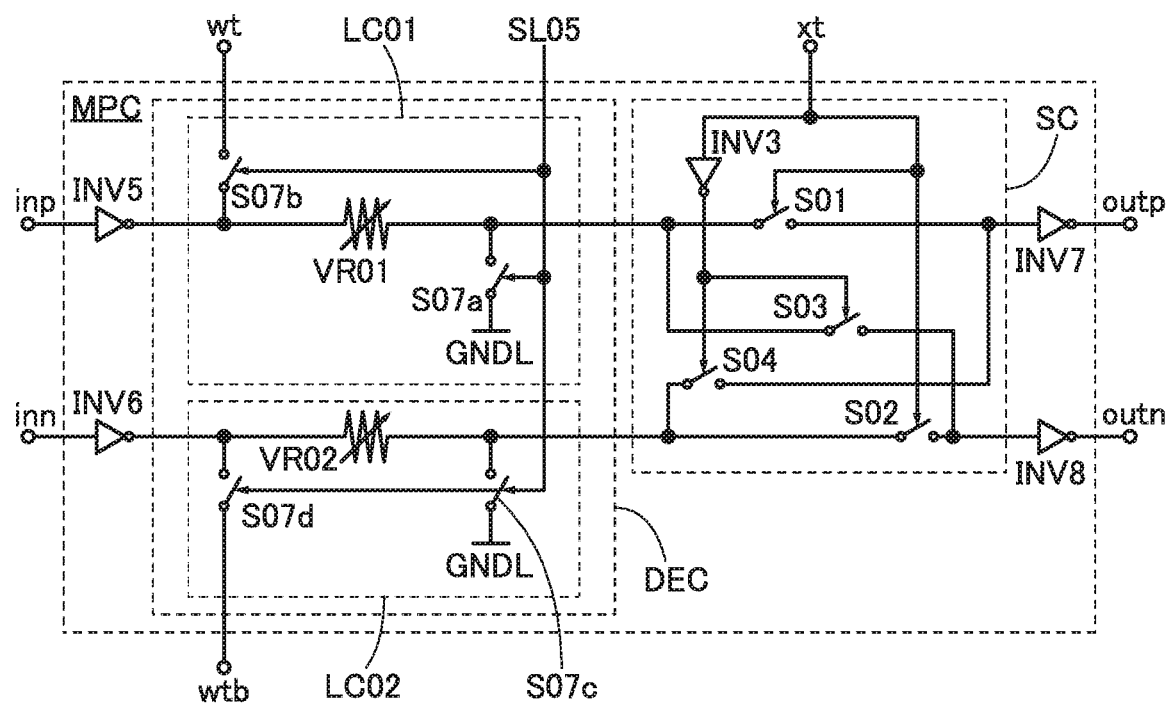
FIG. 22 is a circuit diagram illustrating a configuration example of a circuit in a semiconductor device.
Figure 23A:
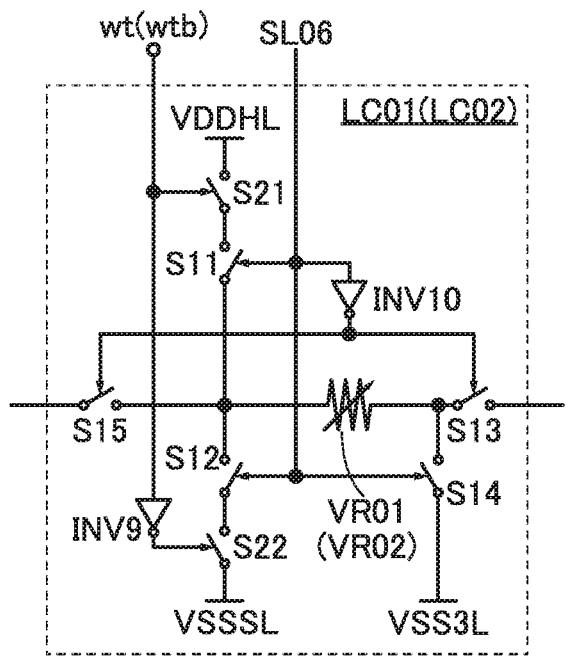
FIGS. 23A and 23B are circuit diagrams illustrating configuration examples of a circuit in a semiconductor device.

The load circuit LC01 (the load circuit LC02) including the variable resistor can have a configuration, for example, in FIG. 23A, which is different from the configurations of the load circuit LC01 (the load circuit LC02) in FIGS. 21A and 21B and FIG. 22. The load circuit LC01 (the load circuit LC02) in FIG. 23A includes switches S11 to S15, a switch S21, a switch S22, an inverter circuit INV9, an inverter circuit INV10, and the variable resistor VR01 (the variable resistor VR02). Note that the switches S11 to S15, the switch S21, and the switch S22 are turned on by supplying a high-level potential to their control terminals, and are turned off by supplying a low-level potential to their control terminals.

The first terminal of the variable resistor VR01 (the variable resistor VR02) is electrically connected to a first terminal of the switch S11, a first terminal of the switch S12, and a first terminal of the switch S15, and a second terminal of the switch S15 is electrically connected to the first terminal of the load circuit LC01 (the load circuit LC02). The second terminal of the variable resistor VR01 (the variable resistor VR02) is electrically connected to a first terminal of the switch S13 and a first terminal of the switch S14, and a second terminal of the switch S13 is electrically connected to the second terminal of the load circuit LC01 (the load circuit LC02). A second terminal of the switch S11 is electrically connected to a first terminal of the switch S21, and a second terminal of the switch S21 is electrically connected to a wiring VDDHL. A second terminal of the switch S12 is electrically connected to a first terminal of the switch S22, and a second terminal of the switch S22 is electrically connected to a wiring VSSSL. A second terminal of the switch S14 is electrically connected to a wiring VSS3L.

The terminal wt (the terminal wtb) is electrically connected to the control terminal of the switch S21 and an input terminal of the inverter circuit INV9, and an output terminal of the inverter circuit INV9 is electrically connected to the control terminal of the switch S22. An input terminal of the inverter circuit INV10 is electrically connected to the control terminal of the switch S11, the control terminal of the switch S12, the control terminal of the switch S14, and a wiring SL06, and an output terminal of the inverter circuit INV10 is electrically connected to the control terminal of the switch S13 and the control terminal of the switch S15.

The wiring SL06 has a function of turning on or off the switches S11 to S15. The wiring VDDHL functions as a voltage line that supplies a voltage VDDH, the wiring VSSSL functions as a voltage line that supplies a voltage VSSS, and the wiring VSS3L functions as a voltage line that supplies a voltage VSS3. The voltage VDDH, the voltage VSSS, and the voltage VSS3 are input voltages for changing the resistance of the variable resistor VR01 (the variable resistor VR02), and the voltage VDDH is higher than the voltage VSSS and the voltage VSS3. The voltage VSS3 can be higher than or equal to the voltage VSSS.

Here, the case where the resistance of the variable resistor VR01 is changed is considered. First, a high-level potential is input to the wiring SL06 to turn on the switch S11, the switch S12, and the switch S14, and turn off the switch S13 and the switch S15. Then, a high-level potential is input as the potential corresponding to the weight coefficient to the terminal wt to turn on the switch S21 and turn off the switch S22, for example. At this time, the voltage VDDH is input to the first terminal of the variable resistor VR01, and the voltage VSS3 is input to the second terminal of the variable resistor VR01. Thus, the resistance of the variable resistor VR01 can be reduced. After that, a low-level potential is input to the wiring SL06 to turn off the switch S11, the switch S12, and the switch S14, and turn on the switch S13, so that the resistance of the load circuit LC01 can be set low.

When a low-level potential is input as the potential corresponding to the weight coefficient to the terminal wt in the above case, the switch S21 is turned off and the switch S22 is turned on. At this time, the voltage VSSS is input to the first terminal of the variable resistor VR01, and the voltage VSS3 is input to the second terminal of the variable resistor VR01. Thus, the resistance of the variable resistor VR01 can be increased. After that, a low-level potential is input to the wiring SL06 to turn off the switch S11, the switch S12, and the switch S14, and turn on the switch S13 and the switch S15, so that the resistance of the load circuit LC01 can be set high.

The variable resistor VR02 can have a circuit configuration similar to that of the variable resistor VR01 in FIG. 23A. In that case, the terminal wtb corresponds to that in FIGS. 21A and 21B. In addition, the signal input to the terminal wtb is preferably an inverted signal of the signal input to the terminal wt.

When the resistance of the variable resistor VR01 is set low and the resistance of the variable resistor VR02 is set high, the signal-transmission speed between one of the two input terminals and one of the two output terminals of the circuit DEC can be higher than that between the other input terminal and the other output terminal of the circuit DEC. By contrast, when the resistance of the variable resistor VR01 is set high and the resistance of the variable resistor VR02 is set low, the signal-transmission speed between one of the two input terminals and one of the two output terminals of the circuit DEC can be lower than that between the other input terminal and the other output terminal of the circuit DEC. Thus, when the signals are input to the terminal inp and the terminal inn of the circuit MPC, the signals output from the terminal outp and the terminal outn can have a time lag based on the resistances of the variable resistor VR01 and the variable resistor VR02.

Figure 23B:
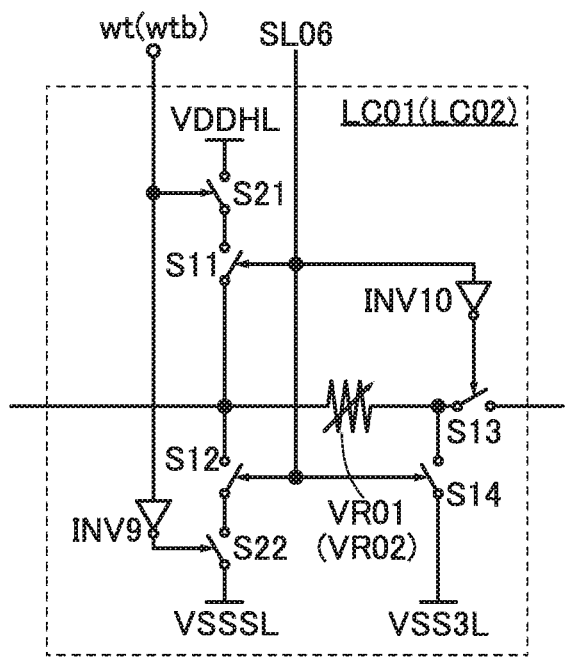

In the load circuit LC01 (the load circuit LC02) in FIG. 23A, the switch S15 can be omitted depending on the circumstances. The load circuit LC01 (the load circuit LC02) in that case has a configuration in FIG. 23B, which has reduced circuit area as compared to the load circuit LC01 in FIG. 23A.

Figure 24A:
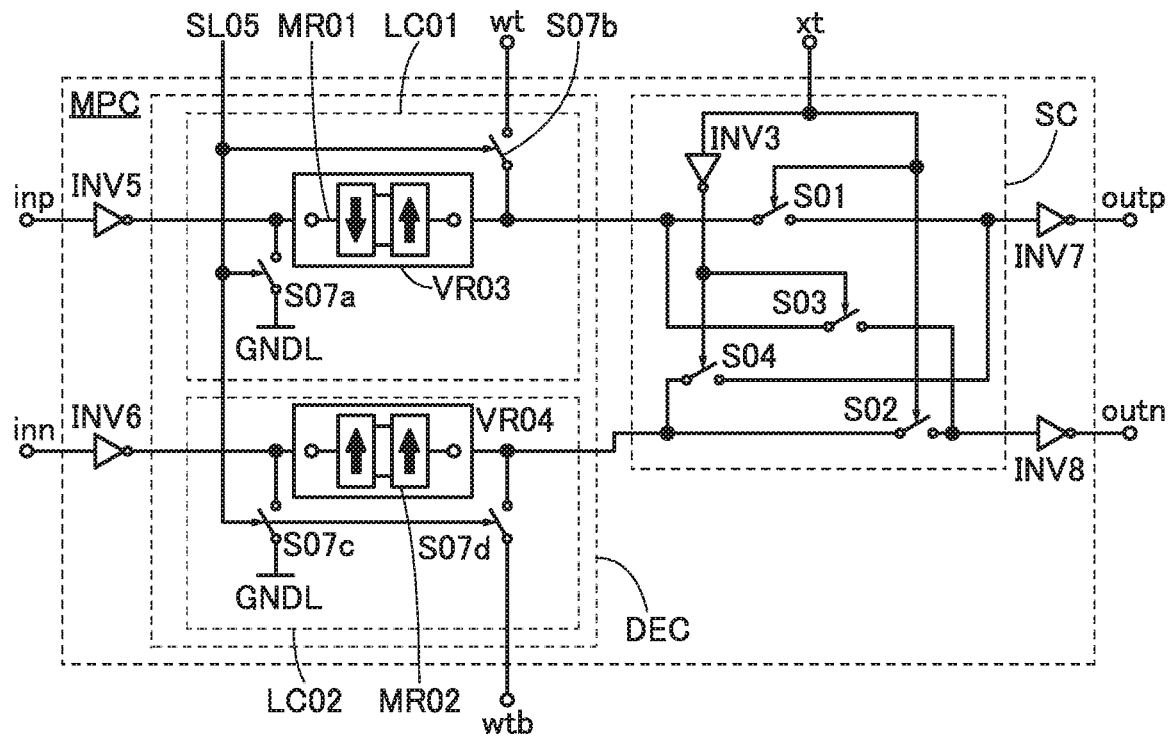
FIGS. 24A and 24B are block diagrams illustrating configuration examples of a circuit in a semiconductor device.
Figure 24B:
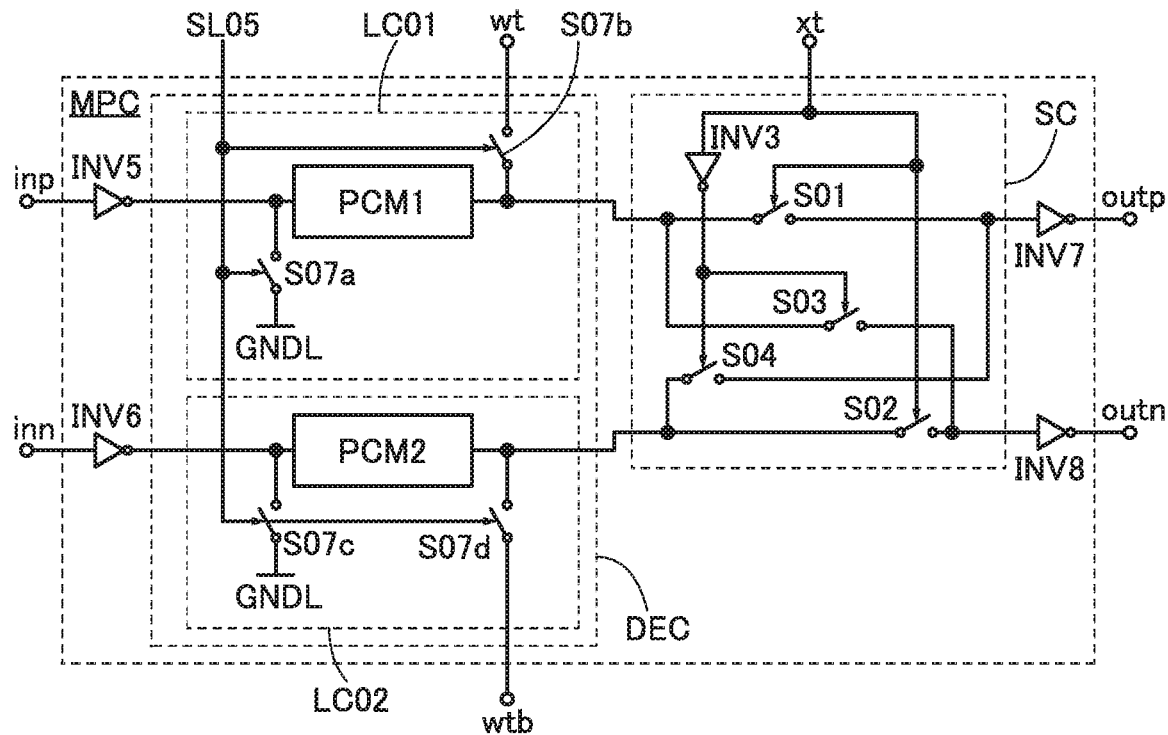

Note that the configuration of the circuit MPC in FIG. 19A is not limited to the configurations of the circuit MPC in FIGS. 21A and 21B, and the configurations of the circuit MPC in FIGS. 21A and 21B may be changed depending on the circumstances. For example, a circuit including a magnetic tunnel junction (MTJ) element, or the like can be used, instead of the circuit including the variable resistor in FIG. 21A, as the load circuit LC01 and the load circuit LC02. As in the circuit MPC in FIG. 24A, for example, the variable resistor VR01 and the variable resistor VR02 of the circuit DEC in FIG. 21A may be replaced with a variable resistor circuit VR03 including an MTJ element MR01 and a variable resistor circuit VR04 including an MTJ element MR02, respectively. Instead of a variable resistor and an MTJ element, a resistor containing a phase change material that is used for phase change memory (PCM) or the like may be used. In this specification and the like, the resistor is sometimes referred to as phase change memory for convenience. For example, as in the circuit MPC in FIG. 24B, the variable resistor VR01 and the variable resistor VR02 of the circuit DEC in FIG. 21A can be replaced with phase change memory PCM1 and phase change memory PCM2, respectively.

Configuration Example 6

Figure 25A:
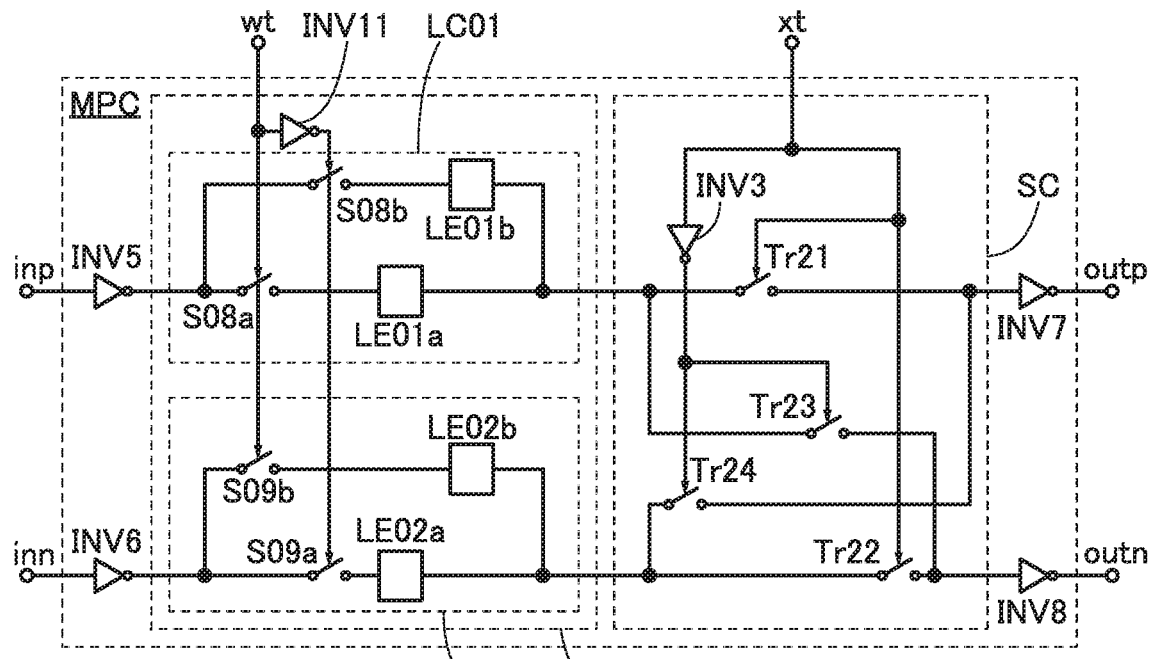
FIGS. 25A and 25B are block diagrams illustrating configuration examples of a circuit in a semiconductor device.

The circuit MPC in FIG. 25A includes a plurality of load circuits as the load circuit LC01 and the load circuit LC02 of the circuit MPC in FIG. 19A. Specifically, the circuit DEC in FIG. 25A includes a load element LE01*a* and a load element LE01*b* as the load circuit LC01 in FIG. 19A, and a load element LE02*a* and a load element LE02*b* as the load circuit LC02 in FIG. 19A. The circuit DEC includes a switch S08*a* and a switch S08*b* for selecting the load element LE01*a* or the load element LE01*b*, a switch S09*a* and a switch S09*b* for selecting the load element LE02*a* or the load element LE02*b*, and an inverter circuit INV11.

A first terminal of the switch S08*a* and a first terminal of the switch S08*b* are electrically connected to one of the two input terminals of the circuit DEC, a second terminal of the switch S08*a* is electrically connected to a first terminal of the load element LE01*a*, and a second terminal of the switch S08*b* is electrically connected to a first terminal of the load element LE01*b*. A first terminal of the switch S09*a* and a first terminal of the switch S09b are electrically connected to the other input terminal of the circuit DEC, a second terminal of the switch S09a is electrically connected to a first terminal of the load element LE02a, and a second terminal of the switch S09b is electrically connected to a first terminal of the load element LE02b.

The terminal wt is electrically connected to a control terminal of the switch S08a, a control terminal of the switch S09b, and an input terminal of the inverter circuit INV11. An output terminal of the inverter circuit INV11 is electrically connected to a control terminal of the switch S08b and a control terminal of the switch S09a.

The switch S08a, the switch S08b, the switch S09a, and the switch S09b are turned on or off by supplying a potential from the terminal wt. In this specification and the like, the switch S08a, the switch S08b, the switch S09a, and the switch S09b are turned on by supplying a high-level potential to the control terminals, and turned off by supplying a low-level potential to the control terminals. That is, the switch S08a and the switch S09b are turned on and the switch S08b and the switch S09a are turned off when the potential of the terminal wt is high, and the switch S08a and the switch S09b are turned off and the switch S08b and the switch S09a are turned on when the potential of the terminal wt is low.

In the case where the circuit MPC has the configuration in FIG. 25A, a resistor may be used as each of the load element LE01a, the load element LE01b, the load element LE02a, and the load element LE02b. Specifically, for example, when a resistor having high resistance is used as the load element LE01a and the load element LE02a and a resistor having low resistance is used as the load element LE01b and the load element LE02b, the signals input to the terminal inp and the terminal inn of the circuit MPC can have different delay amounts. That is, the signals output from the terminal outp and the terminal outn of the circuit MPC can have a time lag. Note that in that case, it is preferable that the resistance of the load element LE01a be equal to that of the load element LE02a and the resistance of the load element LE01b be equal to that of the load element LE02b.

Examples of an element that can be used as the load element LE01a, the load element LE01b, the load element LE02a, and the load element LE02b include a coil, a transistor, and a diode other than a resistor.

The variable resistor VR01 (the variable resistor VR02) described in Configuration example 5 may be used as each of the load element LE01a, the load element LE01b, the load element LE02a, and the load element LE02b, for example. Without limitation to elements, the circuit including the variable resistor VR01 (the variable resistor VR02), the circuit including the MTJ element in FIG. 24A, or the circuit including the phase change memory in FIG. 24B may also be used as each of the load element LE01a, the load element LE01b, the load element LE02a, and the load element LE02b. The resistances of the load element LE01a, the load element LE01b, the load element LE02a, and the load element LE02b can be changed as appropriate when using the elements or circuits described above. Examples of a circuit that can be used as the load element LE01a, the load element LE01b, the load element LE02a, and the load element LE02b include a correction circuit, an amplifier circuit, and a converter circuit other than the above-described circuits.

The circuit MPC in FIG. 25A can be used when the weight coefficients $w_1^{(k-1)(k)}{}_j$ to $w_m^{(k-1)(k)}{}_j$ input to the terminal wt are each binary data.

Figure 25B:
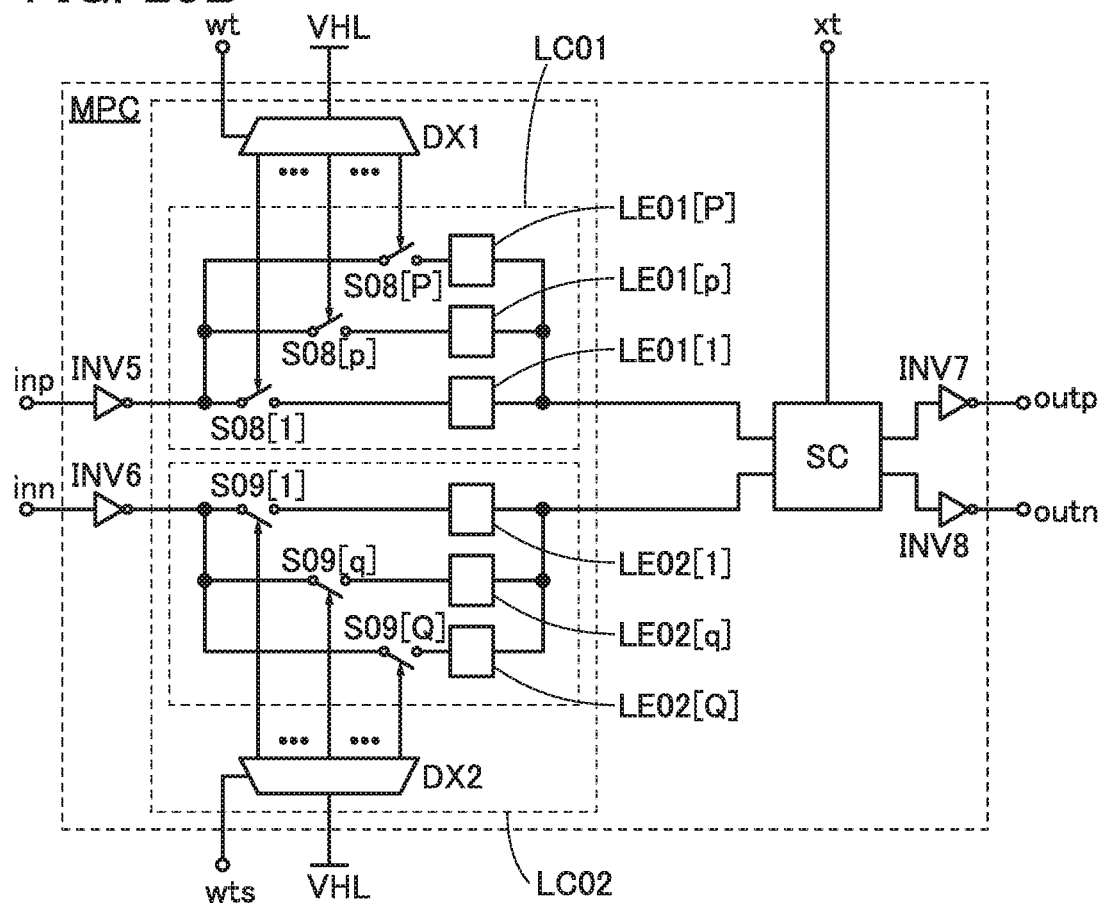

The circuit MPC in FIG. 25A has the configuration in which the switch S08a and the switch S08b (the switch S09a and the switch S09b) select one of the load element LE01a and the load element LE01b (one of the load element LE02a and the load element LE02b); however, one embodiment of the present invention is not limited to this configuration, and one of three or more load circuits may be selected. The circuit MPC in FIG. 25B is a modification example of the circuit MPC in FIG. 25A, in which one of three or more load circuits is selected in response to the signal input to the terminal wt (the terminal wts). Such a circuit MPC can be used when the weight coefficients $w_1^{(k-1)(k)}{}_j$ to $w_m^{(k-1)(k)}{}_j$ input to the terminal wt are each ternary or higher-order data.

The circuit MPC in FIG. 25B includes switches S08[1] to S08[P] (P is an integer greater than or equal to 1) as the switch S08a and the switch S08b in FIG. 25A, load elements LE01[1] to LE01[P] as the load element LE01a and the load element LE01b in FIG. 25A, switches S09[1] to S09[Q] (Q is an integer greater than or equal to 1) as the switch S09a and the switch S09b in FIG. 25A, and load elements LE02[1] to LE02[Q] as the load element LE02a and the load element LE02b in FIG. 25A. The circuit MPC in FIG. 25B also includes a selector DX1 and a selector DX2. In FIG. 25B, the load element LE01[1], the load element LE01[p], the load element LE01[P], the load element LE02[1], the load element LE02[q], and the load element LE02[Q] are illustrated as the load circuits, the switch S08[1], the switch S08[p], the switch S08[P], the switch S09[1], the switch S09[q], and the switch S09[Q] are illustrated as the switches, and the other load circuits and switches are not illustrated.

Note that the loads of the load elements LE01[1] to LE01[P] are preferably different from each other, and the loads of the load elements LE02[1] to LE02[Q] are preferably different from each other.

In the circuit MPC in FIG. 25B, an input terminal of the selector DX1 is electrically connected to a wiring VHL that supplies a high-level potential, and a plurality of output terminals of the selector DX1 are electrically connected to the respective control terminals of the switches S08[1] to S08[P]. The terminal wt is electrically connected to the selector DX1, and the selector DX1 has a function of electrically connecting the wiring VHL to the control terminal of any one of the switches S08[1] to S08[P] in response to the signal input to the terminal wt. That is, the load of any one of the load elements LE01[1] to LE01[P] can be supplied to the signal output from the output terminal of the inverter circuit INV5 in response to the weight coefficient input to the terminal wt.

An input terminal of the selector DX2 is electrically connected to the wiring VHL that supplies a high-level potential, and a plurality of output terminals of the selector DX2 are electrically connected to the respective control terminals of the switches S09[1] to S09[Q]. The terminal wts is electrically connected to the selector DX2, and the selector DX2 has a function of electrically connecting the wiring VHL to the control terminal of any one of the switches S09[1] to S09[Q] in response to the signal input to the terminal wts. That is, the load of any one of the load elements LE02[1] to LE02[Q] can be supplied to the signal output from the output terminal of the inverter circuit INV6 in response to the weight coefficient input to the terminal wts.

Note that in the circuit MPC in FIG. 25B, the switches S09[1] to S09[Q] and the selector DX2 have a function of selecting a reference of the load elements LE01[1] to LE01[P] from the load elements LE02[1] to LE02[Q]. Thus, in the case where a reference load circuit of the load elements LE01[1] to LE01[P] is determined in advance, a configuration of the circuit MPC in FIG. 26A may be employed in which the switches S09[1] to S09[Q] and the selector DX2 are not provided and only the reference load element LE02 of the load elements LE01[1] to LE01[P] is provided.

When the circuit MPC in FIG. 25B is used as all the circuits MPC in the arithmetic circuit 110, arithmetic operations can be performed with changes in the weight coefficients. For example, in the circuits DEC included in the circuits MPC[1] to MPC[m] of the arithmetic circuit 110, the loads corresponding to the weight coefficients $w_1^{(k-1)}{}_j^{(k)}$ to $w_m^{(k-1)}{}_j^{(k)}$ are set to the loads of the load elements LE01[$p$], the loads corresponding to the weight coefficients $w_1^{(k-1)}{}_h^{(k)}$ to $w_m^{(k-1)}{}_h^{(k)}$ are set to the loads of the load elements LE01[$r$] (here, r is an integer greater than or equal to 1 and less than or equal to P, and not p), a predetermined potential is input to the terminal wts, any one of the load elements LE02[1] to LE02[Q] is selected as a reference of the load elements LE01[1] to LE01[P], and the signals $x_1^{(k-1)}$ to $x_m^{(k-1)}$ corresponding to the signals $z_1^{(k-1)}$ to $z_m^{(k-1)}$ are input to the terminal xt. At this time, in the case where a signal that selects the load element LE01[$p$] is input to the terminal wt, the switch S08[$p$] is turned on and the switches S08[1] to S08[P] except the switch S08[$p$] are turned off. Accordingly, the arithmetic circuit 110 can perform the product-sum operation of the weight coefficients $w_1^{(k-1)}{}_j^{(k)}$ to $w_m^{(k-1)}{}_j^{(k)}$ and the signals $z_1^{(k-1)}$ to $z_m^{(k-1)}$ and the arithmetic operation of the activation function using any one of the load elements LE02[1] to LE02[Q] as a reference. In the case where a signal that selects the load element LE01[$r$] is input to the terminal wt, the switch S08[$r$] is turned on and the switches S08[1] to S08[P] except the switch S08[$r$] are turned off. Accordingly, the arithmetic circuit 110 can perform the product-sum operation of the weight coefficients $w_1^{(k-1)}{}_h^{(k)}$ to $w_m^{(k-1)}{}_h^{(k)}$ and the signals $z_1^{(k-1)}$ to $z_m^{(k-1)}$ and the arithmetic operation of the activation function using any one of the load elements LE02[1] to LE02[Q] as a reference.

When the circuit MPC in FIG. 25B is used as all the circuits MPC in the arithmetic circuit 110, the weight coefficients can be changed and thus arithmetic operation for each weight coefficient can be performed.

Figure 26A:
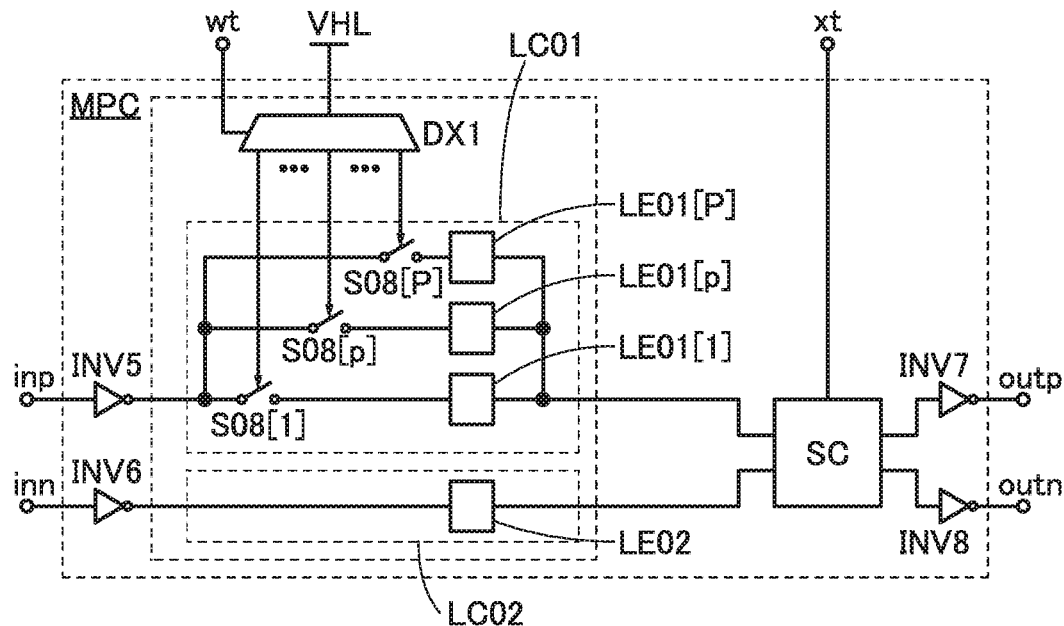
FIGS. 26A and 26B are block diagrams illustrating configuration examples of a circuit in a semiconductor device.

Although the load circuits are connected in parallel in the circuit MPC in FIGS. 25A and 25B and FIG. 26A, the load circuits may be connected in series in the circuit MPC. The circuit MPC in FIG. 26B includes load elements LE03[1] to LE03[P] and load elements LE04[1] to LE04[Q]. The load elements LE03[1] to LE03[P] are connected in series, and the load elements LE04[1] to LE04[Q] are connected in series. Note that it is preferable that the sizes of the loads of the load elements LE03[1] to LE03[P] be equal to each other, and the sizes of the loads of the load elements LE04[1] to LE04[Q] be equal to each other.

Figure 26B:
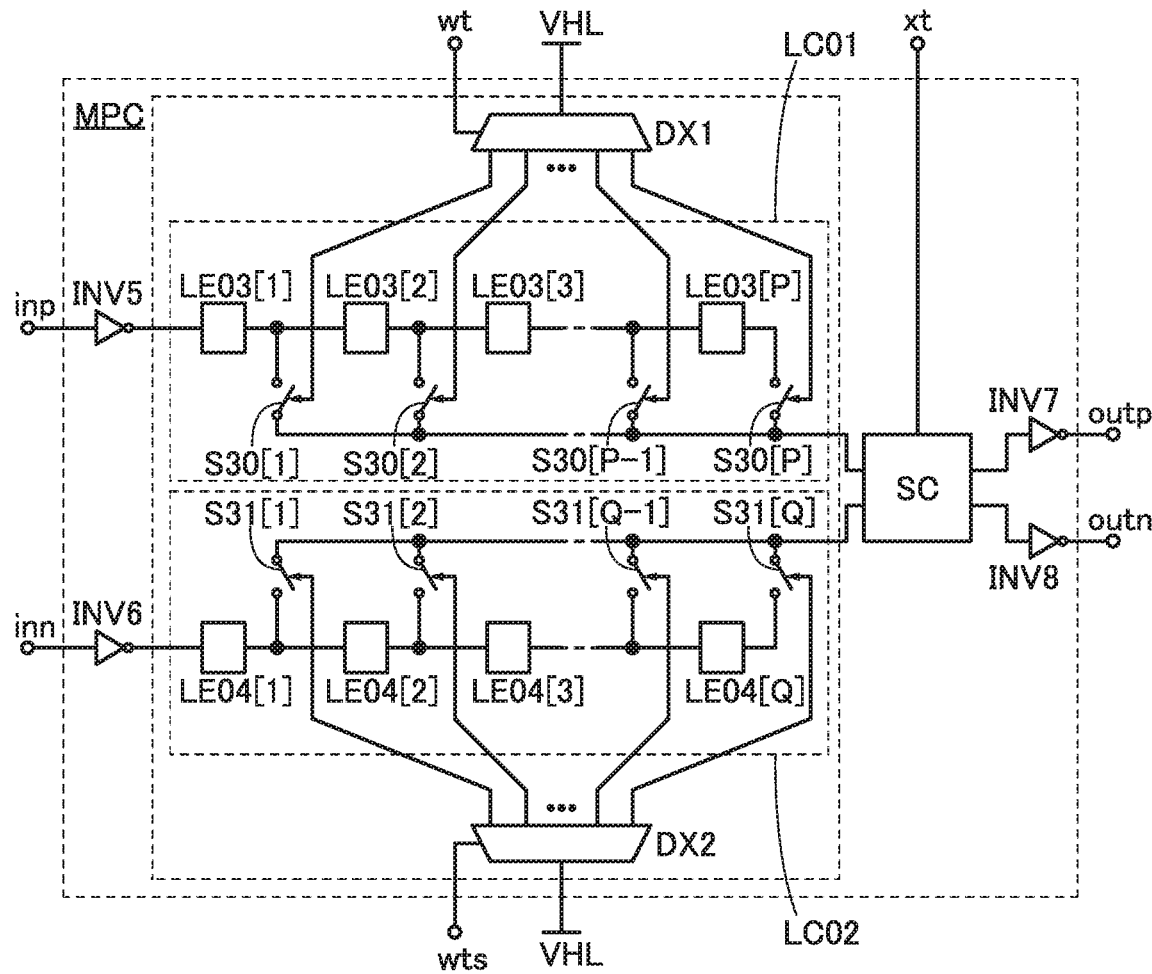

The circuit MPC in FIG. 26B includes switches S30[1] to S30[P] and switches S31[1] to S31[Q]. A first terminal of the switch S30[$j$] (not illustrated) is electrically connected to a second terminal of the load element LE03[$j$] (not illustrated), and second terminals of the switches S30[1] to S30[P] are electrically connected to one of the two input terminals of the switching circuit SC. A first terminal of the switch S31[$q$] (not illustrated) is electrically connected to a second terminal of the load element LE04[$q$] (not illustrated), and second terminals of the switches S31[1] to S31[Q] are electrically connected to the other input terminal of the switching circuit SC.

The circuit MPC in FIG. 26B includes the selector DX1 and the selector DX2. The input terminal of the selector DX1 is electrically connected to the wiring VHL that supplies a high-level potential, and the plurality of output terminals of the selector DX1 are electrically connected to the respective control terminals of the switches S30[1] to S30[P]. The terminal wt is electrically connected to the selector DX1, and the selector DX1 has a function of electrically connecting the wiring VHL to the control terminal of any one of the switches S30[1] to S30[P] in response to the signal input to the terminal wt. With such a configuration, the number of load circuits electrically connected in series between the output terminal of the inverter circuit INV5 and one of the two input terminals of the switching circuit SC can be determined by the signal input to the terminal wt.

The input terminal of the selector DX2 is electrically connected to the wiring VHL that supplies a high-level potential, and the plurality of output terminals of the selector DX2 are electrically connected to the respective control terminals of the switches S31[1] to S31[Q]. The terminal wts is electrically connected to the selector DX2, and the selector DX2 has a function of electrically connecting the wiring VHL to the control terminal of any one of the switches S31[1] to S31[Q] in response to the signal input to the terminal wts. With such a configuration, the number of load circuits electrically connected in series between the output terminal of the inverter circuit INV6 and the other input terminal of the switching circuit SC can be determined by the signal input to the terminal wts. Note that the number of load circuits corresponds to the size of the reference load of the load elements LE03[1] to LE03[P]. In the case where a reference load circuit of the load elements LE03[1] to LE03[P] is determined in advance, the switches S31[1] to S31[Q] and the selector DX2 are not provided and the reference load element LE02 (not illustrated) is provided between the output terminal of the inverter circuit INV6 and the other input terminal of the switching circuit SC.

When the circuit MPC in FIG. 26B is used as all the circuits MPC in the arithmetic circuit 110, arithmetic operations can be performed with changes in the weight coefficients. For example, in the circuits DEC included in the circuits MPC[1] to MPC[m] of the arithmetic circuit 110, the signals corresponding to the weight coefficients $w_1^{(k-1)}{}_j^{(k)}$ to $w_m^{(k-1)}{}_j^{(k)}$ are input to the terminals wt, the signals that determine the reference of the load elements LE01[1] to LE01[P] are input to the terminals wts, and the signals $x_1^{(k-1)}$ to $x_m^{(k-1)}$ corresponding to the signals $z_1^{(k-1)}$ to $z_m^{(k-1)}$ are input to the terminals xt. At this time, the number of load circuits electrically connected in series between the output terminal of the inverter circuit INV5 and one of the two input terminals of the switching circuit SC can be determined by the weight coefficient input to the terminal wt. In addition, a reference load between the output terminal of the inverter circuit INV6 and the other input terminal of the switching circuit SC is determined in response to the signal input to the terminal wts, and the product-sum operation of the weight coefficients $w_1^{(k-1)}{}_j^{(k)}$ to $w_m^{(k-1)}{}_j^{(k)}$ and the signals $z_1^{(k-1)}$ to $z_m^{(k-1)}$ and the arithmetic operation of the activation function can be performed. Furthermore, when the signals corresponding to the weight coefficients $w_1^{(k-1)}{}_j^{(k)}$ to $w_m^{(k-1)}{}_j^{(k)}$ and the signals corresponding to the weight coefficients $w_1^{(k-1)}{}_h^{(k)}$ to $w_m^{(k-1)}{}_h^{(k)}$ are input to the terminals wt of the circuits DEC included in the circuits MPC[1] to MPC[m] of the arithmetic circuit 110, the product-sum operation of the weight coefficients $w_1^{(k-1)}{}_h^{(k)}$ to $w_m^{(k-1)}{}_h^{(k)}$ and the signals $z_1^{(k-1)}$ to $z_m^{(k-1)}$ and the arithmetic operation of the activation function can be performed.

When the circuit MPC in FIG. 26B is used as all the circuits MPC in the arithmetic circuit 110, the weight coefficients can be changed and thus arithmetic operation for each weight coefficient can be performed.

Note that this embodiment can be combined with any of the other embodiments in this specification as appropriate.

Embodiment 4

In this embodiment, structure examples of an OS transistor that can be used in the semiconductor device described in any of the above embodiments will be described.

<Structure Example of Semiconductor Device>

Figure 27:
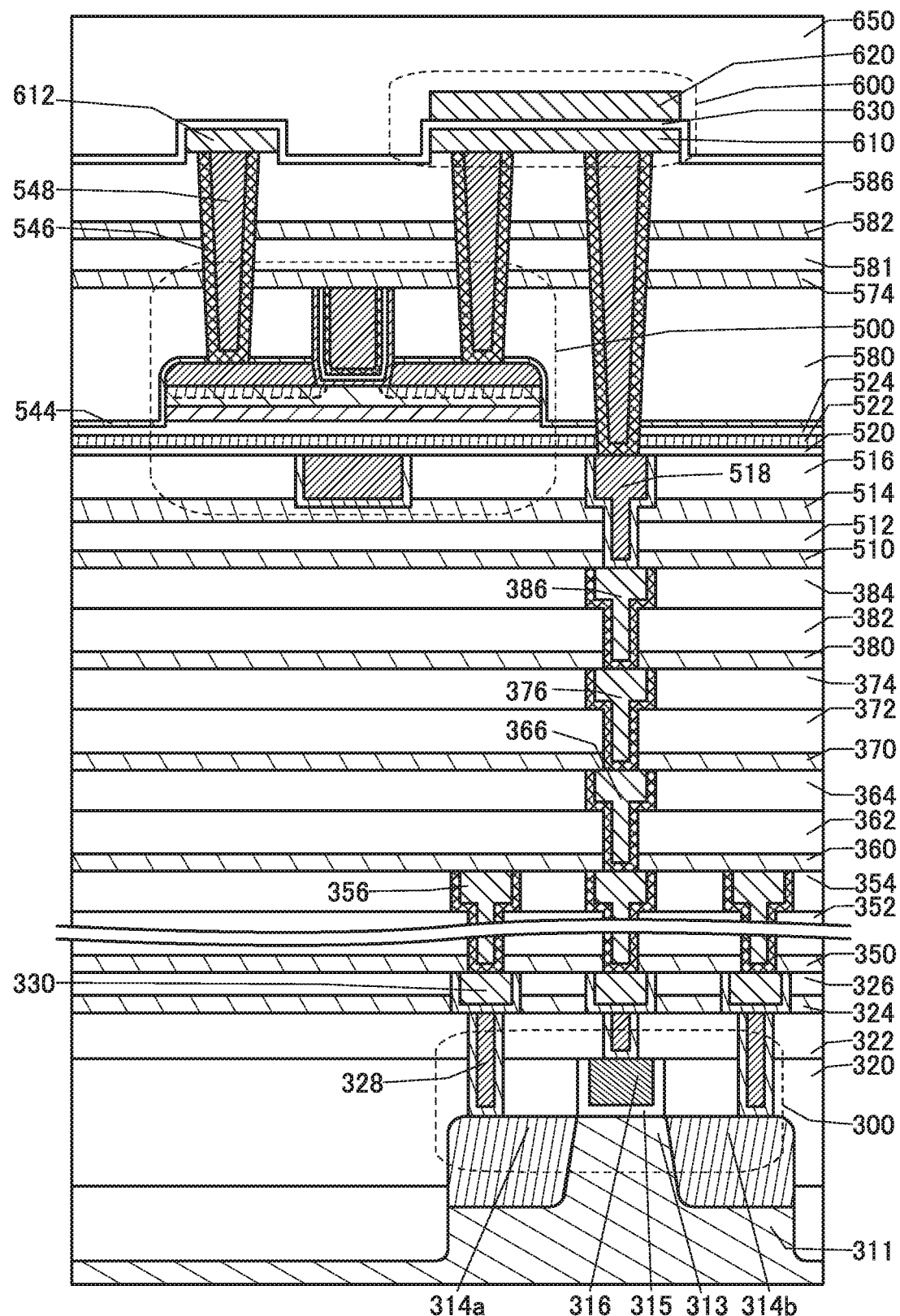
FIG. 27 is a cross-sectional view illustrating a structure example of a semiconductor device.
Figure 29A:
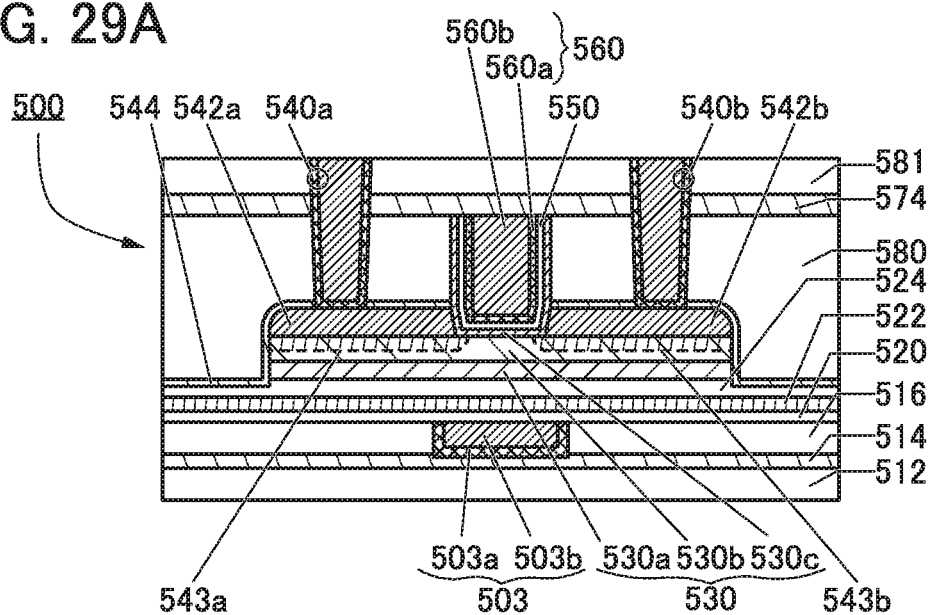
FIGS. 29A to 29C are a top view and cross-sectional views illustrating a structure example of a transistor.
Figure 29B:
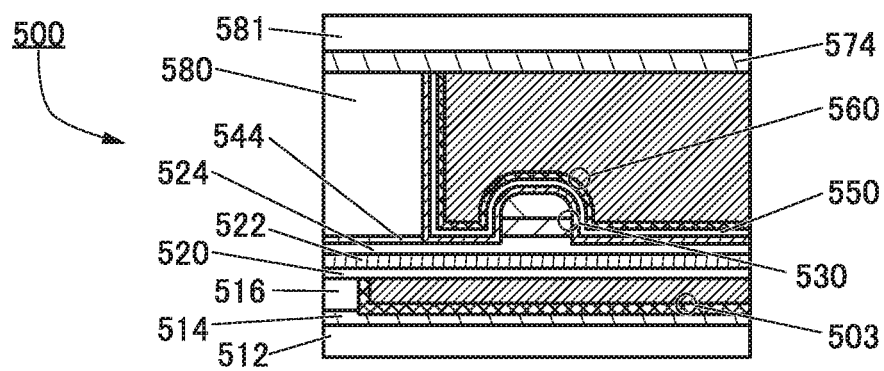
Figure 29C:
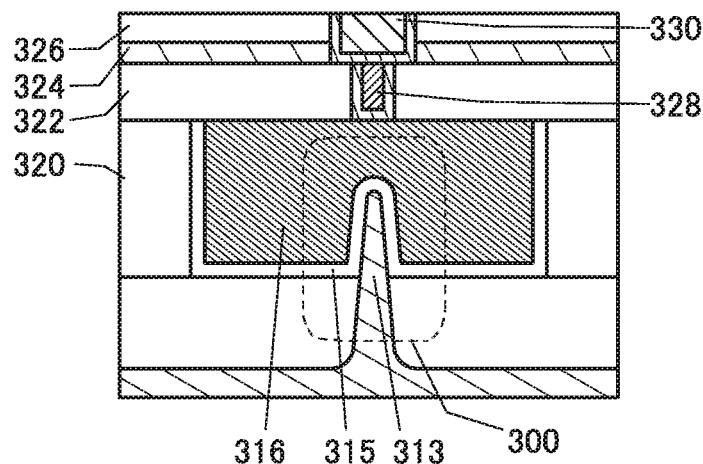

A semiconductor device illustrated in FIG. 27 includes a transistor 300, a transistor 500, and a capacitor 600. FIG. 29A is a cross-sectional view of the transistor 500 in the channel length direction, FIG. 29B is a cross-sectional view of the transistor 500 in the channel width direction, and FIG. 29C is a cross-sectional view of the transistor 300 in the channel width direction.

The transistor 500 is a transistor containing a metal oxide in a channel formation region (OS transistor). Since the off-state current of the transistor 500 is low, the use of the transistor 500 in a semiconductor device, in particular, in the transistor Tr03 or the like in the arithmetic circuit 110 enables written data to be held for a long time. In other words, such a semiconductor device has a low frequency of refresh operation or does not require refresh operation and thus can have reduced power consumption.

The transistor 500 is provided above the transistor 300, and the capacitor 600 is provided above the transistor 300 and the transistor 500. For example, the capacitor 600 can be used as the capacitor C01 in the circuit BF1.

The transistor 300 is provided in and on a substrate 311 and includes a conductor 316, an insulator 315, a semiconductor region 313 that is a part of the substrate 311, and a low-resistance region 314a and a low-resistance region 314b functioning as a source region and a drain region. Note that the transistor 300 can be used as the transistors in the above embodiments, for example.

As illustrated in FIG. 29C, the top surface and the side surface in the channel width direction of the semiconductor region 313 of the transistor 300 is covered with the conductor 316 with the insulator 315 positioned therebetween. Such a FIN-type transistor 300 can have an increased effective channel width and thus have improved on-state characteristics. In addition, since contribution of the electric field of the gate electrode can be increased, the off-state characteristics of the transistor 300 can be improved.

Note that the transistor 300 may be a p-channel transistor or an n-channel transistor.

It is preferable that a region of the semiconductor region 313 where a channel is formed, a region in the vicinity thereof, the low-resistance regions 314a and 314b functioning as the source and drain regions, and the like contain a semiconductor such as a silicon-based semiconductor, further preferably single-crystal silicon. Alternatively, a material containing germanium (Ge), silicon germanium (SiGe), gallium arsenide (GaAs), gallium aluminum arsenide (GaAlAs), or the like may be contained. Silicon whose effective mass is adjusted by applying stress to the crystal lattice and thereby changing the lattice spacing may be contained. Alternatively, the transistor 300 may be a high-electron-mobility transistor (HEMT) with GaAs and GaAlAs, or the like.

The low-resistance regions 314a and 314b contain an element that imparts n-type conductivity, such as arsenic or phosphorus, or an element that imparts p-type conductivity, such as boron, in addition to a semiconductor material used for the semiconductor region 313.

The conductor 316 functioning as a gate electrode can be formed using a semiconductor material such as silicon containing the element that imparts n-type conductivity, such as arsenic or phosphorus, or the element that imparts p-type conductivity, such as boron, or a conductive material such as a metal material, an alloy material, or a metal oxide material.

Note that a material used for a conductor determines the work function; thus, selecting the material used for the conductor can adjust the threshold voltage of the transistor. Specifically, titanium nitride, tantalum nitride, or the like is preferably used for the conductor. Furthermore, in order to ensure the conductivity and embeddability of the conductor, a stacked layer of metal materials such as tungsten and aluminum is preferably used for the conductor. In particular, tungsten is preferable in terms of heat resistance.

Figure 28:
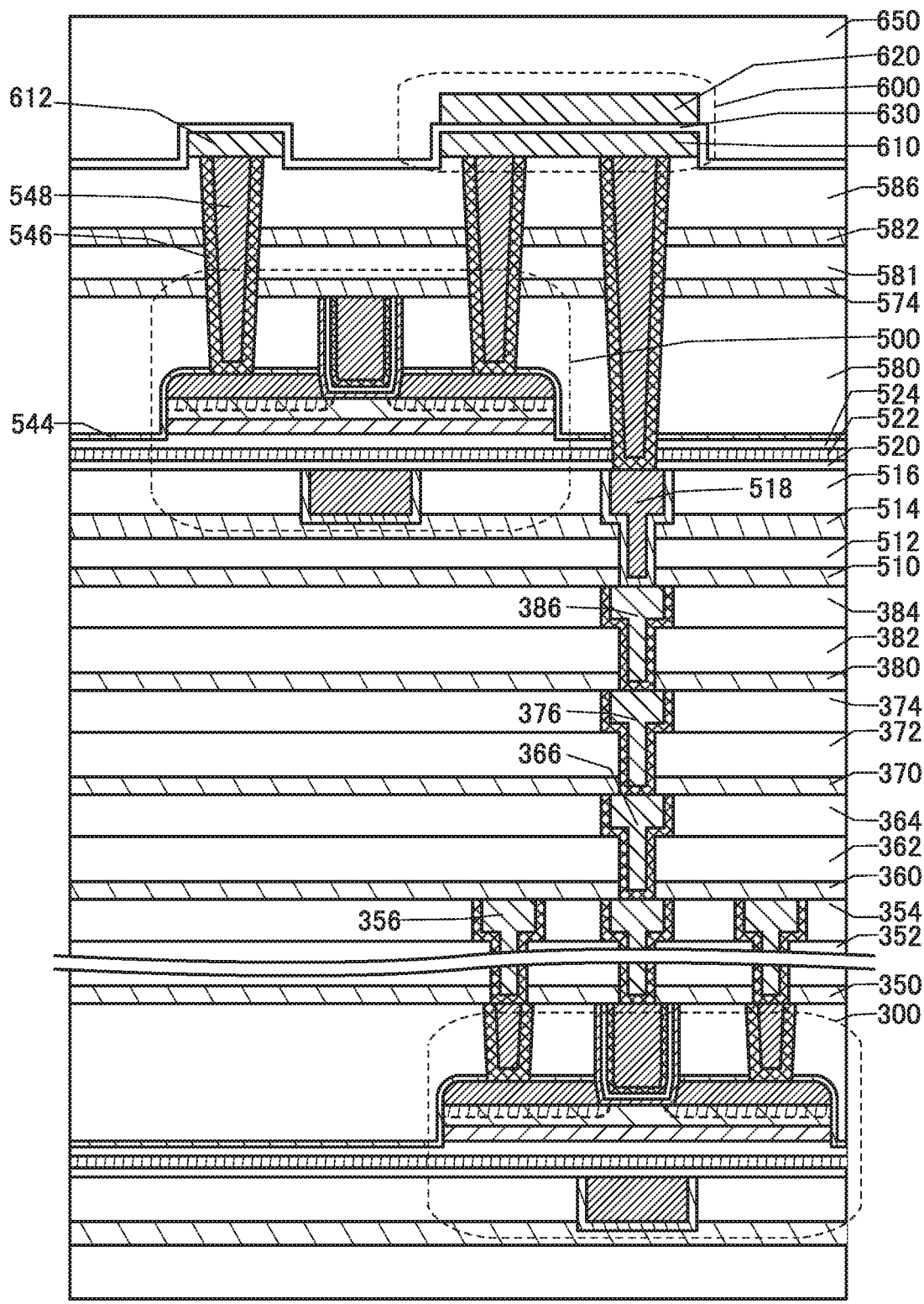
FIG. 28 is a cross-sectional view illustrating a structure example of a semiconductor device.

Note that the structure of the transistor 300 is not limited to that illustrated in FIG. 27, which is only an example, and an appropriate transistor may be used in accordance with a circuit configuration or a driving method. For example, in the case where all the transistors included in the semiconductor device are the OS transistors and have the same conductivity, the transistor 300 has a structure similar to that of the transistor 500 including an oxide semiconductor as illustrated in FIG. 28. Note that the transistor 500 is described in detail later.

An insulator 320, an insulator 322, an insulator 324, and an insulator 326 are stacked sequentially to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, or aluminum nitride.

Note that in this specification, silicon oxynitride refers to a material that contains oxygen at a higher proportion than nitrogen, and silicon nitride oxide refers to a material that contains nitrogen at a higher proportion than oxygen. Moreover, in this specification, aluminum oxynitride refers to a material that contains oxygen at a higher proportion than nitrogen, and aluminum nitride oxide refers to a material that contains nitrogen at a higher proportion than oxygen.

The insulator 322 may function as a planarization film for eliminating a level difference caused by the transistor 300 or the like underlying the insulator 322. For example, the top surface of the insulator 322 may be planarized by planarization treatment using a chemical mechanical polishing (CMP) method or the like to increase the level of planarity.

The insulator 324 is preferably formed using a film having a barrier property that prevents hydrogen and impurities from diffusing from the substrate 311, the transistor 300, or the like into a region where the transistor 500 is provided.

For the film having a barrier property against hydrogen, for example, silicon nitride formed by a CVD method can be used. Here, diffusion of hydrogen into a semiconductor element including an oxide semiconductor, such as the transistor 500, degrades the characteristics of the semiconductor element in some cases. Therefore, a film that reduces hydrogen diffusion is preferably provided between the transistor 500 and the transistor 300. Specifically, the film that reduces hydrogen diffusion is a film from which a small amount of hydrogen is released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10\times10^{15}$ atoms/cm$^2$, preferably less than or equal to $5\times10^{15}$ atoms/cm$^2$ in TDS analysis in a film-surface temperature range of 50° C. to 500° C., for example.

Note that the dielectric constant of the insulator 326 is preferably lower than that of the insulator 324. For example, the dielectric constant of the insulator 326 is preferably lower than 4, further preferably lower than 3. For example, the dielectric constant of the insulator 326 is preferably 0.7 times or less that of the insulator 324, further preferably 0.6 times or less that of the insulator 324. In the case where a material with a low dielectric constant is used for an interlayer film, the parasitic capacitance between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each function as a plug or a wiring. A plurality of conductors functioning as plugs or wirings are collectively denoted by the same reference numeral in some cases. Furthermore, in this specification and the like, a wiring and a plug connected to the wiring may be a single component. That is, part of a conductor functions as a wiring in some cases and part of a conductor functions as a plug in other cases.

As a material for each of the plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, an insulator 350, an insulator 352, and an insulator 354 are stacked sequentially in FIG. 27. Furthermore, a conductor 356 is formed in the insulator 350, the insulator 352, and the insulator 354. The conductor 356 functions as a plug or a wiring that is connected to the transistor 300. Note that the conductor 356 can be formed using a material similar to that for the conductor 328 and the conductor 330.

Note that for example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening of the insulator 350 having a barrier property against hydrogen. In such a structure, the transistor 300 and the transistor 500 can be separated by a barrier layer, so that the hydrogen diffusion from the transistor 300 into the transistor 500 can be inhibited.

Note that as the conductor having a barrier property against hydrogen, tantalum nitride is preferably used, for example. By stacking tantalum nitride and tungsten, which has high conductivity, hydrogen diffusion from the transistor 300 can be inhibited while the conductivity of a wiring is ensured. In this case, a tantalum nitride layer having a barrier property against hydrogen is preferably in contact with the insulator 350 having a barrier property against hydrogen.

A wiring layer may be provided over the insulator 354 and the conductor 356. For example, an insulator 360, an insulator 362, and an insulator 364 are stacked sequentially in FIG. 27. Furthermore, a conductor 366 is formed in the insulator 360, the insulator 362, and the insulator 364. The conductor 366 functions as a plug or a wiring. Note that the conductor 366 can be formed using a material similar to those for the conductor 328 and the conductor 330.

Note that for example, the insulator 360 is preferably formed using an insulator having a barrier property against hydrogen, like the insulator 324. Furthermore, the conductor 366 preferably includes a conductor having a barrier property against hydrogen. The conductor having a barrier property against hydrogen is formed particularly in an opening of the insulator 360 having a barrier property against hydrogen. In such a structure, the transistor 300 and the transistor 500 can be separated by a barrier layer, so that the hydrogen diffusion from the transistor 300 into the transistor 500 can be inhibited.

A wiring layer may be provided over the insulator 364 and the conductor 366. For example, an insulator 370, an insulator 372, and an insulator 374 are stacked sequentially in FIG. 27. Furthermore, a conductor 376 is formed in the insulator 370, the insulator 372, and the insulator 374. The conductor 376 functions as a plug or a wiring. Note that the conductor 376 can be formed using a material similar to those for the conductor 328 and the conductor 330.

Note that for example, the insulator 370 is preferably formed using an insulator having a barrier property against hydrogen, like the insulator 324. Furthermore, the conductor 376 preferably includes a conductor having a barrier property against hydrogen. The conductor having a barrier property against hydrogen is formed particularly in an opening of the insulator 370 having a barrier property against hydrogen. In such a structure, the transistor 300 and the transistor 500 can be separated by a barrier layer, so that the hydrogen diffusion from the transistor 300 into the transistor 500 can be inhibited.

A wiring layer may be provided over the insulator 374 and the conductor 376. For example, an insulator 380, an insulator 382, and an insulator 384 are stacked sequentially in FIG. 27. Furthermore, a conductor 386 is formed in the insulator 380, the insulator 382, and the insulator 384. The conductor 386 functions as a plug or a wiring. Note that the conductor 386 can be formed using a material similar to those for the conductor 328 and the conductor 330.

Note that for example, the insulator 380 is preferably formed using an insulator having a barrier property against hydrogen, like the insulator 324. Furthermore, the conductor 386 preferably includes a conductor having a barrier property against hydrogen. The conductor having a barrier property against hydrogen is formed particularly in an opening of the insulator 380 having a barrier property against hydrogen. In such a structure, the transistor 300 and the transistor 500 can be separated by a barrier layer, so that the hydrogen diffusion from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. The number of wiring layers similar to the wiring layer including the conductor 356 may be three or less, or five or more.

An insulator 510, an insulator 512, an insulator 514, and an insulator 516 are stacked sequentially over the insulator 384. A material having a barrier property against oxygen or hydrogen is preferably used for any of the insulator 510, the insulator 512, the insulator 514, and the insulator 516.

For example, each of the insulator 510 and the insulator 514 is preferably formed using a film having a barrier property that prevents hydrogen and impurities from diffusing from the substrate 311, a region where the transistor 300 is provided, or the like into a region where the transistor 500 is provided. Therefore, each of the insulator 510 and the insulator 514 can be formed using a material similar to that for the insulator 324.

For the film having a barrier property against hydrogen, for example, silicon nitride formed by a CVD method can be used. Here, diffusion of hydrogen into a semiconductor element including an oxide semiconductor, such as the transistor 500, degrades the characteristics of the semiconductor element in some cases. Therefore, a film that reduces hydrogen diffusion is preferably provided between the transistor 500 and the transistor 300. Specifically, the film that reduces hydrogen diffusion is a film from which a small amount of hydrogen is released.

For the film having a barrier property against hydrogen used for each of the insulator 510 and the insulator 514, for example, a metal oxide such as aluminum oxide, hafnium oxide, or tantalum oxide is preferably used.

In particular, aluminum oxide has an excellent blocking effect that prevents permeation of oxygen and impurities such as hydrogen and moisture which cause a change in electrical characteristics of the transistor. Accordingly, the use of aluminum oxide can prevent the entry of impurities such as hydrogen and moisture into the transistor 500 during and after a manufacturing process of the transistor. In addition, release of oxygen from the oxide contained in the transistor 500 can be prevented. Therefore, aluminum oxide is suitably used for a protective film of the transistor 500.

The insulator 512 and the insulator 516 can be formed using a material similar to that for the insulator 320, for example. In the case where a material with a relatively low dielectric constant is used for these insulators, the parasitic capacitance between wirings can be reduced. A silicon oxide film or a silicon oxynitride film can be used for the insulator 512 and the insulator 516, for example.

A conductor 518, a conductor (e.g., a conductor 503) included in the transistor 500, and the like are embedded in the insulator 510, the insulator 512, the insulator 514, and the insulator 516. Note that the conductor 518 functions as a plug or a wiring that is connected to the capacitor 600 or the transistor 300. The conductor 518 can be formed using a material similar to those for the conductor 328 and the conductor 330.

In particular, the conductor 518 in a region in contact with the insulator 510 and the insulator 514 is preferably a conductor having a barrier property against oxygen, hydrogen, and water. In such a structure, the transistor 300 and the transistor 500 can be separated by a layer having a barrier property against oxygen, hydrogen, and water, so that the hydrogen diffusion from the transistor 300 to the transistor 500 can be inhibited.

The transistor 500 is provided over the insulator 516.

As illustrated in FIGS. 29A and 29B, the transistor 500 includes the conductor 503 embedded in the insulator 514 and the insulator 516, an insulator 520 over the insulator 516 and the conductor 503, an insulator 522 over the insulator 520, an insulator 524 over the insulator 522, an oxide 530a over the insulator 524, an oxide 530b over the oxide 530a, a conductor 542a and a conductor 542b apart from each other over the oxide 530b, an insulator 580 over the conductor 542a and the conductor 542b and having an opening between the conductor 542a and the conductor 542b, an oxide 530c on a bottom surface and a side surface of the opening, an insulator 550 that is in contact with the oxide 530c, and a conductor 560 that is in contact with the insulator 550.

As illustrated in FIGS. 29A and 29B, an insulator 544 is preferably provided between the insulator 580 and the oxide 530a, the oxide 530b, the conductor 542a, and the conductor 542b. In addition, as illustrated in FIGS. 29A and 29B, the conductor 560 preferably includes a conductor 560a provided inside the insulator 550 and a conductor 560b embedded inside the conductor 560a. Moreover, as illustrated in FIGS. 29A and 29B, an insulator 574 is preferably provided over the insulator 580, the conductor 560, and the insulator 550.

Hereinafter, the oxide 530a, the oxide 530b, and the oxide 530c may be collectively referred to as an oxide 530.

The transistor 500 has, in the region where the channel is formed and its vicinity, a structure in which the oxide 530a, the oxide 530b, and the oxide 530c are stacked; however, the present invention is not limited thereto. For example, the transistor 500 may have a single-layer structure of the oxide 530b, a two-layer structure of the oxide 530b and the oxide 530a or 530c, or a stacked-layer structure of four or more layers. Although the conductor 560 has a two-layer structure in the transistor 500, the present invention is not limited thereto. For example, the conductor 560 may have a single-layer structure or a stacked-layer structure of three or more layers. Note that the structure of the transistor 500 is not limited to that in FIG. 27 and FIG. 29A, which is only an example, and an appropriate transistor may be used in accordance with a circuit configuration or a driving method.

Here, the conductor 560 functions as a gate electrode of the transistor and the conductor 542a and the conductor 542b function as a source electrode and a drain electrode. As described above, the conductor 560 is embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the footprint of the transistor 500. Accordingly, miniaturization and high integration of the semiconductor device can be achieved.

In addition, since the conductor 560 is formed in the region between the conductor 542a and the conductor 542b in a self-aligned manner, the conductor 560 has neither a region overlapping with the conductor 542a nor a region overlapping with the conductor 542b. Thus, parasitic capacitance between the conductor 560 and the conductors 542a and 542b can be reduced. As a result, the transistor 500 can have increased switching speed and excellent frequency characteristics.

The conductor 560 functions as a first gate (also referred to as a top gate) electrode in some cases. The conductor 503 functions as a second gate (also referred to as a bottom gate) electrode in some cases. In that case, by changing a potential supplied to the conductor 503 independently of a potential supplied to the conductor 560, the threshold voltage of the transistor 500 can be controlled. In particular, when a negative potential is supplied to the conductor 503, the threshold voltage of the transistor 500 can be higher than 0 V, and the off-state current can be reduced. Thus, a drain current when a potential supplied to the conductor 560 is 0 V can be smaller in the case where a negative potential is supplied to the conductor 503 than in the case where the negative potential is not supplied to the conductor 503.

The conductor 503 is provided to overlap with the oxide 530 and the conductor 560. Accordingly, in the case where potentials are supplied to the conductor 560 and the conductor 503, an electric field generated from the conductor 560 and an electric field generated from the conductor 503 are connected, so that the channel formation region in the oxide 530 can be covered. In this specification and the like, such a transistor structure in which the channel formation region is electrically surrounded by the electric fields of the first gate electrode and the second gate electrode is referred to as surrounded channel (s-channel) structure.

The conductor 503 has a structure similar to that of the conductor 518, in which a conductor 503a is formed in contact with an inner wall of the opening in the insulator 514 and the insulator 516 and a conductor 503b is formed inside the conductor 503a. Although the conductor 503a and the conductor 503b are stacked in the transistor 500, the present invention is not limited thereto. For example, the conductor 503 may have a single-layer structure or a stacked-layer structure of three or more layers.

The conductor 503a is preferably formed using a conductive material having a function of inhibiting diffusion of impurities such as a hydrogen atom, a hydrogen molecule, a water molecule, and a copper atom, that is, a conductive material through which the above impurities are less likely to pass. Alternatively, the conductor 503a is preferably formed using a conductive material having a function of inhibiting diffusion of oxygen (e.g., at least one of oxygen atoms, oxygen molecules, and the like), that is, a conductive material through which oxygen is less likely to pass. Note that in this specification, a function of inhibiting diffusion of impurities or oxygen means a function of inhibiting diffusion of any one or all of the above impurities and oxygen.

For example, when the conductor 503a has a function of inhibiting diffusion of oxygen, the conductivity of the conductor 503b can be prevented from being lowered because of oxidation.

In the case where the conductor 503 functions as a wiring, the conductor 503b is preferably formed using a conductive material with high conductivity that contains tungsten, copper, or aluminum as its main component. In that case, a conductor 505 is not necessarily provided. Note that the conductor 503b is a single layer in the drawing but may have a stacked-layer structure, for example, a stacked-layer structure of titanium, titanium nitride, and any of the above conductive materials.

The insulator 520, the insulator 522, the insulator 524, and the insulator 550 function as a second gate insulating film.

Here, an insulator containing oxygen more than that in the stoichiometric composition is preferably used as the insulator 524 in contact with the oxide 530. That is, an excess-oxygen region is preferably formed in the insulator 524. When such an insulator containing excess oxygen is provided in contact with the oxide 530, the amount of oxygen vacancies in the oxide 530 can be reduced, leading to an improvement in reliability of the transistor 500.

As the insulator including the excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS analysis. In the TDS analysis, the film-surface temperature is preferably higher than or equal to 100° C. and lower than or equal to 700° C., or higher than or equal to 100° C. and lower than or equal to 400° C.

In the case where the insulator 524 includes an excess-oxygen region, the insulator 522 preferably has a function of inhibiting diffusion of oxygen (e.g., oxygen atoms or oxygen molecules). That is, it is preferable that oxygen be less likely to pass through the insulator 522.

The insulator 522 preferably has a function of inhibiting diffusion of oxygen or impurities, in which case diffusion of oxygen contained in the oxide 530 to the insulator 520 side is prevented. The conductor 503 can be inhibited from reacting with oxygen in the insulator 524 or the oxide 530.

The insulator 522 preferably has a single-layer structure or a stacked-layer structure using an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate (SrTO$_3$), or (Ba,Sr)TiO$_3$ (BST). With miniaturization and high integration of a transistor, a problem such as generation of leakage current sometimes arises because of a thin gate insulating film. When a high-k material is used for an insulator functioning as the gate insulating film, a gate potential at the time of operating the transistor can be reduced while the physical thickness of the gate insulating film is kept.

It is particularly preferable to use an insulator containing an oxide of one or both of aluminum and hafnium, which is an insulating material having a function of inhibiting diffusion of impurities, oxygen, and the like, that is, an insulating material through which oxygen is less likely to pass. Aluminum oxide, hafnium oxide, an oxide containing aluminum and hafnium (hafnium aluminate), or the like is preferably used for the insulator containing an oxide of one or both of aluminum and hafnium. The insulator 522 formed of such a material functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the insulator.

It is preferable that the insulator 520 be thermally stable. For example, silicon oxide and silicon oxynitride are preferred because of their thermal stability. Furthermore, combination of an insulator which is a high-k material and silicon oxide or silicon oxynitride enables the insulator 520 to have a stacked-layer structure that is thermally stable and has a high dielectric constant.

Note that the transistor 500 in FIGS. 29A and 29B includes the insulator 520, the insulator 522, and the insulator 524 as the second gate insulating film having a three-layer structure; however, the second gate insulating film may have a single-layer structure, a two-layer structure, or a stacked-layer structure of four or more layers. In that case, the stacked layers are not necessarily formed of the same material and may be formed of different materials.

In the transistor 500, a metal oxide functioning as an oxide semiconductor is preferably used as the oxide 530 including a channel formation region. For example, as the oxide 530, a metal oxide such as an In-M-Zn oxide (M is one or more of aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, the In-M-Zn oxide that can be used as the oxide 530 is preferably a CAAC-OS or a CAC-OS described in Embodiment 5. An In—Ga oxide or an In—Zn oxide may be used as the oxide 530.

The metal oxide functioning as the channel formation region in the oxide 530 has a band gap greater than or equal to 2 eV, preferably greater than or equal to 2.5 eV. The use of a metal oxide having such a wide band gap can reduce the off-state current of a transistor.

When the oxide 530a is provided below the oxide 530b in the oxide 530, impurities can be inhibited from being diffused into the oxide 530b from the components formed below the oxide 530a. When the oxide 530c is provided over the oxide 530b, impurities can be inhibited from being diffused into the oxide 530b from the components formed above the oxide 530c.

The oxide 530 preferably has a stacked-layer structure of oxides which differ in the atomic ratio of metal elements. Specifically, the atomic ratio of the element M to constituent elements in the metal oxide used as the oxide 530a is preferably greater than that in the metal oxide used as the oxide 530b. Moreover, the atomic ratio of the element M to In in the metal oxide used as the oxide 530a is preferably greater than that in the metal oxide used as the oxide 530b. Moreover, the atomic ratio of In to the element M in the metal oxide used as the oxide 530b is preferably greater than that in the metal oxide used as the oxide 530a. The oxide 530c can be formed using a metal oxide that can be used as the oxide 530a or 530b.

The energy of the conduction band minimum of each of the oxide 530a and the oxide 530c is preferably higher than that of the oxide 530b. In other words, the electron affinity of each of the oxide 530a and the oxide 530c is preferably smaller than that of the oxide 530b.

Here, the energy level of the conduction band minimum is gradually varied at a junction portion of each of the oxides 530a, 530b, and 530c. In other words, the energy level of the conduction band minimum at a junction portion of each of the oxides 530a, 530b, and 530c is continuously varied or continuously connected. To vary the energy level gradually, the density of defect states in a mixed layer formed at the interface between the oxides 530a and 530b and the interface between the oxides 530b and 530c is preferably made low.

Specifically, when the oxides 530a and 530b or the oxides 530b and 530c contain the same element (as a main component) in addition to oxygen, a mixed layer with a low density of defect states can be formed. For example, in the case where the oxide 530b is an In—Ga—Zn oxide, it is preferable to use an In—Ga—Zn oxide, a Ga—Zn oxide, gallium oxide, or the like as each of the oxides 530a and 530c.

At this time, the oxide 530b serves as a main carrier path. When the oxides 530a and 530c have the above structure, the density of defect states at the interface between the oxides 530a and 530b and the interface between the oxides 530b and 530c can be made low. Thus, the influence of interface scattering on carrier conduction is small, and the transistor 500 can have high on-state current.

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, tantalum nitride, titanium nitride, tungsten nitride, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film such as a tantalum nitride film is preferable because it has a barrier property against hydrogen or oxygen.

Although the conductor 542a and the conductor 542b each have a single-layer structure in FIG. 29A, they may each have a stacked-layer structure of two or more layers. For example, a tantalum nitride film and a tungsten film may be stacked. Alternatively, a titanium film and an aluminum film may be stacked. Other examples include a two-layer structure in which an aluminum film is stacked over a tungsten film, a two-layer structure in which a copper film is stacked over a copper-magnesium-aluminum alloy film, a two-layer structure in which a copper film is stacked over a titanium film, and a two-layer structure in which a copper film is stacked over a tungsten film.

Other examples include a three-layer structure in which a titanium film or a titanium nitride film, an aluminum film or a copper film, and a titanium film or a titanium nitride film are stacked in this order and a three-layer structure in which a molybdenum film or a molybdenum nitride film, an aluminum film or a copper film, and a molybdenum film or a molybdenum nitride film are stacked in this order. Note that a transparent conductive material containing indium oxide, tin oxide, or zinc oxide may be used.

As illustrated in FIG. 29A, a region 543a and a region 543b are sometimes formed as low-resistance regions at and near the interface between the oxide 530 and the conductor 542a and the interface between the oxide 530 and the conductor 542b. In that case, the region 543a functions as one of a source region and a drain region, and the region 543b functions as the other of the source region and the drain region. A channel formation region is formed in a region between the region 543a and the region 543b.

When the conductor 542a and the conductor 542b are provided in contact with the oxide 530, the oxygen concentrations of the region 543a and the region 543b sometimes decrease. In addition, a metal compound layer that contains the metal contained in the conductor 542a and the conductor 542b and the component of the oxide 530 is sometimes formed in the region 543a and the region 543b. In such a case, the region 543a and the region 543b each have increased carrier density to be a low-resistance region.

The insulator 544 is provided to cover the conductor 542a and the conductor 542b and inhibits oxidation of the conductor 542a and the conductor 542b. The insulator 544 may be provided to cover the side surface of the oxide 530 and to be in contact with the insulator 524.

A metal oxide containing one or more of hafnium, aluminum, gallium, yttrium, zirconium, tungsten, titanium, tantalum, nickel, germanium, neodymium, lanthanum, magnesium, and the like can be used as the insulator 544. For the insulator 544, silicon nitride oxide or silicon nitride can be used, for example.

It is particularly preferable to use, as the insulator 544, an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film and thus is less likely to be crystallized by heat treatment in a later step. Therefore, it is preferable to use hafnium aluminate. Note that the insulator 544 is not necessarily provided when the conductor 542*a* and the conductor 542*b* are oxidation-resistant or do not significantly lose the conductivity even after absorbing oxygen. Design is determined as appropriate in consideration of required transistor characteristics.

The insulator 544 can inhibit impurities such as water and hydrogen contained in the insulator 580 from diffusing into the oxide 530*b* through the oxide 530*c* and the insulator 550. Moreover, the oxidation of the conductor 560 due to excess oxygen in the insulator 580 can be inhibited.

The insulator 550 functions as a first gate insulating film. The insulator 550 is preferably in contact with the inside (a top surface and a side surface) of the oxide 530*c*. The insulator 550 is preferably formed using an insulator which contains excess oxygen and from which oxygen is released by heating, like the insulator 524.

Specifically, any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide each containing excess oxygen can be used. In particular, silicon oxide and silicon oxynitride, which have thermal stability, are preferable.

When as the insulator 550, an insulator from which oxygen is released by heating is provided in contact with the top surface of the oxide 530*c*, oxygen can be effectively supplied from the insulator 550 to the channel formation region of the oxide 530*b* through the oxide 530*c*. Furthermore, as in the insulator 524, the concentration of impurities such as water and hydrogen in the insulator 550 is preferably lowered. The thickness of the insulator 550 is preferably greater than or equal to 1 nm and less than or equal to 20 nm.

Furthermore, in order that excess oxygen of the insulator 550 can be efficiently supplied to the oxide 530, a metal oxide may be provided between the insulator 550 and the conductor 560. The metal oxide preferably inhibits diffusion of oxygen from the insulator 550 into the conductor 560. Provision of the metal oxide that inhibits diffusion of oxygen inhibits diffusion of excess oxygen from the insulator 550 to the conductor 560. That is, a reduction in the amount of excess oxygen supplied to the oxide 530 can be suppressed. Moreover, oxidization of the conductor 560 due to excess oxygen can be suppressed. The metal oxide is formed using a material that can be used for the insulator 544.

Note that the insulator 550 may have a stacked-layer structure as in the second gate insulating film. With miniaturization and high integration of a transistor, a problem such as generation of leakage current sometimes arises because of a thin gate insulating film. Thus, when an insulator functioning as a gate insulating film has a stacked-layer structure of a high-k material and a thermally stable material, a gate potential at the time of operating the transistor can be reduced while the physical thickness of the gate insulating film is kept. Furthermore, the stacked-layer structure can be thermally stable and have a high dielectric constant.

Although the conductor 560 functioning as the first gate electrode has a two-layer structure in FIGS. 29A and 29B, the conductor 560 may have a single-layer structure or a stacked-layer structure of three or more layers.

The conductor 560*a* is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, the conductor 560*a* is preferably formed using a conductive material having a function of inhibiting diffusion of oxygen (e.g., at least one of oxygen atoms, oxygen molecules, and the like). When the conductor 560*a* has a function of inhibiting diffusion of oxygen, the conductivity of the conductor 560*b* can be prevented from being lowered because of oxidization due to oxygen in the insulator 550. As a conductive material having a function of inhibiting diffusion of oxygen, for example, tantalum, tantalum nitride, ruthenium, or ruthenium oxide is preferably used. The conductor 560*a* can be formed using an oxide semiconductor that can be used for the oxide 530. In that case, when the conductor 560*b* is formed by a sputtering method, the oxide semiconductor can have a reduced electric resistance and become a conductor. Such a conductor can be referred to as an oxide conductor (OC) electrode.

Furthermore, the conductor 560*b* is preferably formed using a conductive material containing tungsten, copper, or aluminum as its main component. The conductor 560*b* also functions as a wiring and thus is preferably a conductor having high conductivity. The conductor 560*b* may have a stacked-layer structure, for example, a stacked-layer structure of titanium, titanium nitride, and any of the above conductive materials.

The insulator 580 is provided over the conductor 542*a* and the conductor 542*b* with the insulator 544 positioned therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. In addition, silicon oxide and porous silicon oxide are particularly preferable because an excess-oxygen region can be formed easily in a later step.

When the insulator 580 which includes an excess-oxygen region and from which oxygen is released by heating is provided in contact with the oxide 530*c*, oxygen in the insulator 580 can be efficiently supplied to the oxide 530*a* and the oxide 530*b* through the oxide 530*c*. The concentration of impurities such as water and hydrogen in the insulator 580 is preferably lowered.

The opening of the insulator 580 is formed to overlap with a region between the conductor 542*a* and the conductor 542*b*. Thus, the conductor 560 is embedded in the opening of the insulator 580 and the region between the conductor 542*a* and the conductor 542*b*.

The gate length needs to be short for miniaturization of the semiconductor device without a reduction in the conductivity of the conductor 560. When the conductor 560 is made thick to achieve this, the conductor 560 might have a shape with a high aspect ratio. Even when having a shape with a high aspect ratio, the conductor 560 can be formed without collapsing during the process because the conductor 560 is embedded in the opening of the insulator 580 in this embodiment.

The insulator 574 is preferably provided in contact with the top surfaces of the insulator 580, the conductor 560, and the insulator 550. When the insulator 574 is formed by a sputtering method, the insulator 550 and the insulator 580 can include an excess-oxygen region. Therefore, oxygen can be supplied from the excess-oxygen region to the oxide 530.

For example, a metal oxide containing one or more of hafnium, aluminum, gallium, yttrium, zirconium, tungsten, titanium, tantalum, nickel, germanium, magnesium, and the like can be used as the insulator 574.

In particular, aluminum oxide has a high barrier property, so that even a thin aluminum oxide film having a thickness of greater than or equal to 0.5 nm and less than or equal to 3.0 nm can inhibit diffusion of hydrogen and nitrogen. Thus, aluminum oxide formed by a sputtering method can serve as not only an oxygen supply source but also a barrier film against impurities such as hydrogen.

The insulator 581 functioning as an interlayer film is preferably provided over the insulator 574. As in the insulator 524 or the like, the concentration of impurities such as water and hydrogen in the insulator 581 is preferably lowered.

A conductor 540a and a conductor 540b are provided in the openings formed in the insulator 581, the insulator 574, the insulator 580, and the insulator 544. The conductor 540a and the conductor 540b are provided to face each other with the conductor 560 positioned therebetween. The conductor 540a and the conductor 540b have a structure similar to that of a conductor 546 and a conductor 548 described later.

An insulator 582 is provided over the insulator 581. A material having a barrier property against oxygen or hydrogen is preferably used for the insulator 582. Thus, the insulator 582 can be formed using a material similar to that for the insulator 514. For the insulator 582, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent the entry of impurities such as hydrogen and moisture into the transistor 500 during and after a manufacturing process of the transistor. In addition, release of oxygen from the oxide contained in the transistor 500 can be prevented. Therefore, aluminum oxide is suitably used for a protective film of the transistor 500.

An insulator 586 is provided over the insulator 582. The insulator 586 can be formed using a material similar to that for the insulator 320. In the case where a material with a relatively low dielectric constant is used for the insulator, the parasitic capacitance between wirings can be reduced. For example, a silicon oxide film, a silicon oxynitride film, or the like can be used for the insulator 586.

The conductor 546, the conductor 548, and the like are embedded in the insulators 520, 522, 524, 544, 580, 574, 581, 582, and 586.

The conductor 546 and the conductor 548 function as plugs or wirings that are connected to the capacitor 600, the transistor 500, or the transistor 300. The conductor 546 and the conductor 548 can be formed using a material similar to those for the conductor 328 and the conductor 330.

The capacitor 600 is provided above the transistor 500. The capacitor 600 includes a conductor 610, a conductor 620, and an insulator 630.

A conductor 612 may be provided over the conductor 546 and the conductor 548. The conductor 612 functions as a plug or a wiring that is connected to the transistor 500. The conductor 610 functions as the electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in FIG. 27; however, one embodiment of the present invention is not limited thereto, and a stacked-layer structure of two or more layers may be used. For example, between a conductor having a barrier property and a conductor having high conductivity, a conductor which is highly adhesive to the conductor having a barrier property and the conductor having high conductivity may be formed.

The conductor 620 is provided to overlap with the conductor 610 with the insulator 630 positioned therebetween. Note that the conductor 620 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 620 is formed concurrently with another component such as a conductor, copper (Cu), aluminum (Al), or the like which is a low-resistance metal material is used.

An insulator 650 is provided over the conductor 620 and the insulator 630. The insulator 650 can be formed using a material similar to that for the insulator 320. The insulator 650 may function as a planarization film that covers a roughness thereunder.

With the use of the structure, a change in electrical characteristics can be prevented and reliability can be improved in a semiconductor device that includes a transistor including an oxide semiconductor. A semiconductor device that includes a transistor including an oxide semiconductor can be miniaturized or highly integrated.

<Structure Example of Transistor>

The structure of the transistor 500 in the semiconductor device described in this embodiment is not limited to the above structure. Structure examples of the transistor 500 will be described below. Note that transistors described below are modification examples of the above-described transistor; therefore, different portions are mainly described and the same portions are not described below in some cases.

<<Structure Example 1 of Transistor>>

Figure 30A:
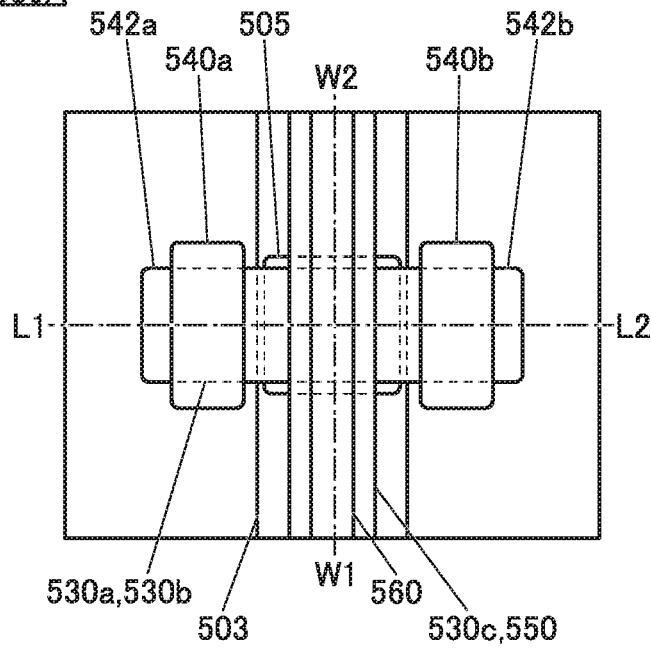
FIGS. 30A to 30C are a top view and cross-sectional views illustrating a structure example of a transistor.
Figure 30C:
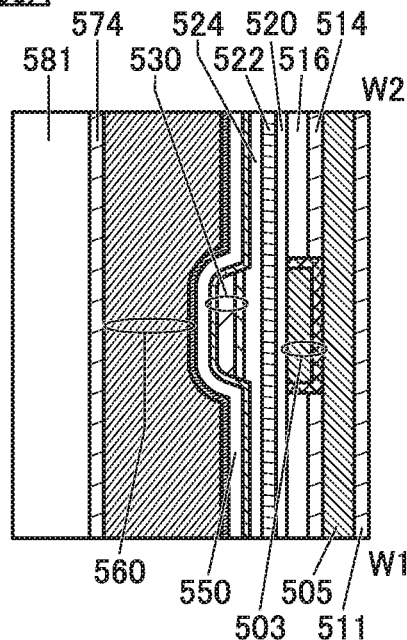
Figure 30B:
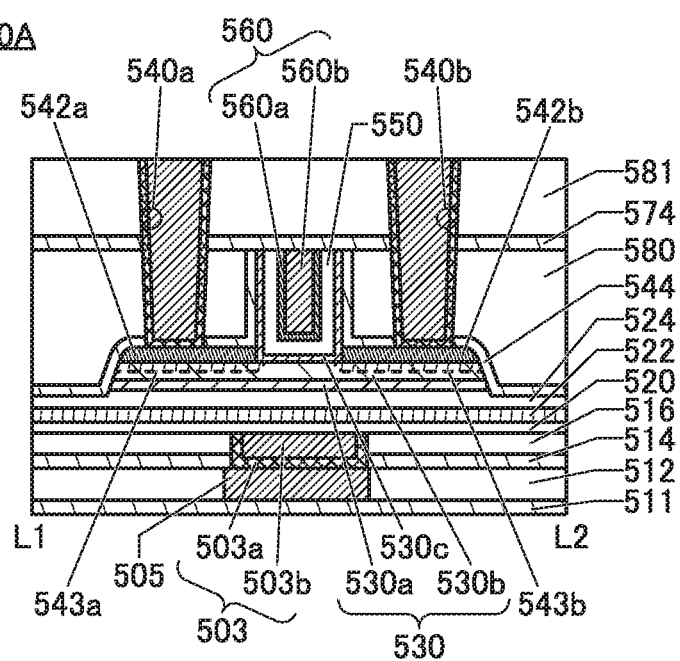

A structure example of a transistor 500A is described with reference to FIGS. 30A to 30C. FIG. 30A is a top view of the transistor 500A. FIG. 30B is a cross-sectional view taken along the dashed-dotted line L1-L2 in FIG. 30A. FIG. 30C is a cross-sectional view taken along the dashed-dotted line W1-W2 in FIG. 30A. Note that for simplification of the drawing, some components are not illustrated in the top view in FIG. 30A.

The transistor 500A illustrated in FIGS. 30A to 30C includes an insulator 511 functioning as an interlayer film and the conductor 505 functioning as a wiring in addition to the components of the transistor 500 illustrated in FIG. 29A.

In the transistor 500A illustrated in FIGS. 30A to 30C, the oxide 530c, the insulator 550, and the conductor 560 are provided in the opening of the insulator 580 with the insulator 544 positioned therebetween. The oxide 530c, the insulator 550, and the conductor 560 are provided between the conductor 542a and the conductor 542b.

The insulator 511 can have a single-layer structure or a stacked-layer structure using an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST). Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the insulator.

For example, the insulator 511 preferably functions as a barrier film for inhibiting impurities such as water and hydrogen from entering the transistor 500A from the substrate side. Accordingly, the insulator 511 is preferably formed using an insulating material having a function of inhibiting diffusion of impurities such as a hydrogen atom, a hydrogen molecule, a water molecule, and a copper atom, that is, an insulating material through which the above impurities are less likely to pass. Alternatively, the insulator 511 is preferably formed using an insulating material having a function of inhibiting diffusion of oxygen (e.g., at least one of oxygen atoms, oxygen molecules, and the like), that is, an insulating material through which oxygen is less likely to pass. Alternatively, for example, aluminum oxide, silicon nitride, or the like may be used for the insulator 511. With this structure, impurities such as hydrogen and water can be inhibited from being diffused to the transistor 500A side from the substrate side through the insulator 511.

For example, the dielectric constant of the insulator 512 is preferably lower than that of the insulator 511. In the case where a material with a low dielectric constant is used for an interlayer film, the parasitic capacitance between wirings can be reduced.

The conductor 505 is embedded in the insulator 512. Here, the top surface of the conductor 505 can be substantially level with the top surface of the insulator 512. Note that the conductor 505 having a single-layer structure is shown; however, the present invention is not limited thereto. For example, the conductor 505 may have a multilayer structure of two or more layers. The conductor 505 is preferably formed using a conductive material with high conductivity that contains tungsten, copper, or aluminum as its main component.

The insulator 514 and the insulator 516 function as interlayer films like the insulator 511 or the insulator 512. For example, the insulator 514 preferably functions as a barrier film for inhibiting impurities such as water and hydrogen from entering the transistor 500A from the substrate side. With this structure, impurities such as hydrogen and water can be inhibited from being diffused to the transistor 500A side from the substrate side through the insulator 514. The dielectric constant of the insulator 516 is preferably lower than that of the insulator 514, for example. In the case where a material having a low dielectric constant is used for an interlayer film, the parasitic capacitance between wirings can be reduced.

The insulator 522 preferably has a barrier property. The insulator 522 having a barrier property functions as a layer that inhibits entry of impurities such as hydrogen from the periphery of the transistor 500A into the transistor 500A.

The oxide 530c is preferably provided in the opening of the insulator 580 with the insulator 544 positioned therebetween. In the case where the insulator 544 has a barrier property, the diffusion of impurities from the insulator 580 into the oxide 530 can be inhibited.

A barrier layer may be provided over the conductor 542a and the conductor 542b. A material having a barrier property against oxygen or hydrogen is preferably used for the barrier layer. With this structure, the conductor 542a and the conductor 542b can be inhibited from being oxidized when the insulator 544 is formed.

A metal oxide can be used for the barrier layer, for example. In particular, an insulating film having a barrier property against oxygen or hydrogen, such as an aluminum oxide film, a hafnium oxide film, or a gallium oxide film, is preferably used. Alternatively, silicon nitride formed by a CVD method may be used.

With the use of the barrier layer, the range of choices for the materials of the conductor 542a and the conductor 542b can be expanded. For example, the conductor 542a and the conductor 542b can be formed using a material with a low oxidation resistance and high conductivity, such as tungsten or aluminum. Furthermore, a conductor that can be easily formed or processed can be used, for example.

The insulator 550 functions as a first gate insulating film. The insulator 550 is preferably provided in the opening of the insulator 580 with the oxide 530c and the insulator 544 positioned therebetween.

Each of the conductor 540a and the conductor 540b can be formed to have a single-layer structure or a stacked-layer structure using a conductive material such as a metal material, an alloy material, a metal nitride material, or a metal oxide material, like the conductor 503. For example, a high-melting-point material having both heat resistance and conductivity, such as tungsten or molybdenum, is preferably used. Alternatively, a low-resistance conductive material such as aluminum or copper is preferably used. The use of a low-resistance conductive material can reduce wiring resistance.

For example, when the conductor 540a and the conductor 540b each have a stacked-layer structure of tantalum nitride or the like, which is a conductor having a barrier property against hydrogen and oxygen, and tungsten, which has high conductivity, diffusion of impurities from the outside can be inhibited while the conductivity of a wiring is ensured.

The above structure makes it possible to provide a semiconductor device including a transistor that contains an oxide semiconductor and has high on-state current. Alternatively, a semiconductor device including a transistor that contains an oxide semiconductor and has low off-state current can be provided. Alternatively, a semiconductor device that has small variation in electrical characteristics, i.e., stable electrical characteristics, and has high reliability can be provided.

<<Structure Example 2 of Transistor>>

Figure 31A:
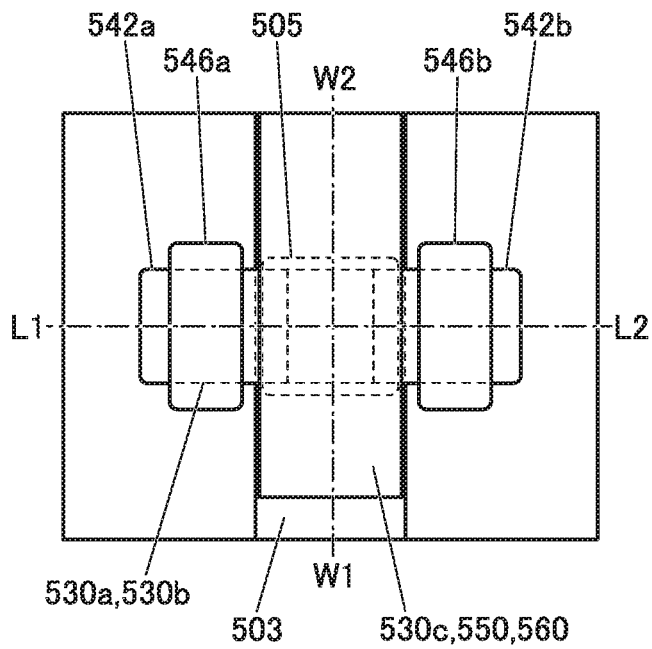
FIGS. 31A to 31C are a top view and cross-sectional views illustrating a structure example of a transistor.
Figure 31C:
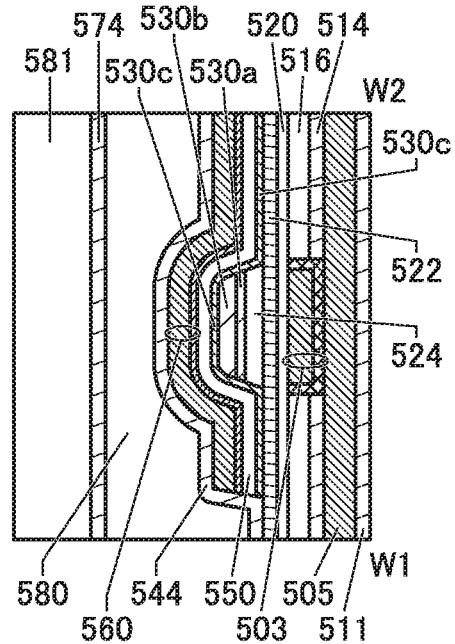
Figure 31B:
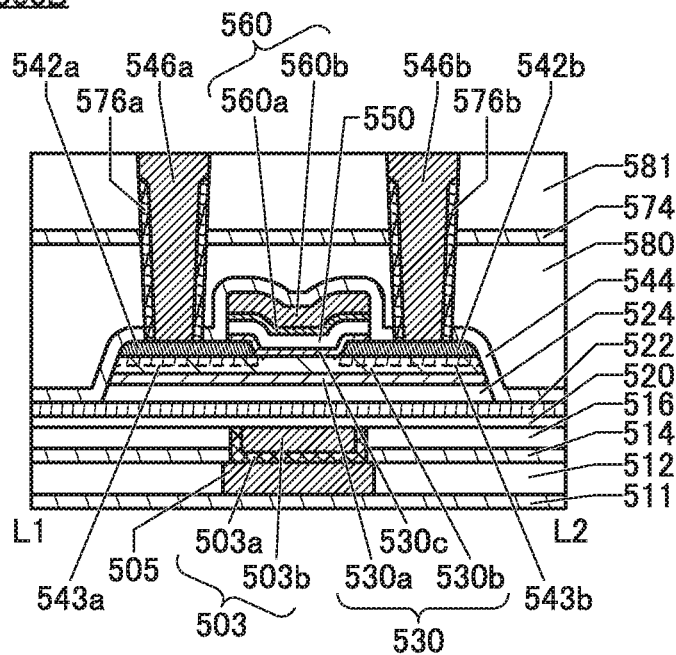

A structure example of a transistor 500B is described with reference to FIGS. 31A to 31C. FIG. 31A is a top view of the transistor 500B. FIG. 31B is a cross-sectional view taken along the dashed-dotted line L1-L2 in FIG. 31A. FIG. 31C is a cross-sectional view taken along the dashed-dotted line W1-W2 in FIG. 31A. Note that for simplification of the drawing, some components are not illustrated in the top view in FIG. 31A.

The transistor 500B is a modification example of the transistor 500A. Thus, differences from the transistor 500A are mainly described to avoid repeated description.

The transistor 500B includes a region where the conductor 542a or the conductor 542b, the oxide 530c, the insulator 550, and the conductor 560 overlap with each other. With this structure, a transistor with high on-state current and a transistor with high controllability can be provided.

The conductor 560 functioning as the first gate electrode includes the conductor 560a and the conductor 560b over the conductor 560a. Like the conductor 503a, the conductor 560a is preferably formed using a conductive material having a function of inhibiting diffusion of impurities such as a hydrogen atom, a hydrogen molecule, a water molecule, and a copper atom. Alternatively, the conductor 560a is preferably formed using a conductive material having a function of inhibiting diffusion of oxygen (e.g., at least one of oxygen atoms and oxygen molecules).

When the conductor 560a has a function of inhibiting oxygen diffusion, the range of choices for the materials of the conductor 560b can be expanded. That is, the conductor 560a prevents the oxidation of the conductor 560b and a decrease in the conductivity of the conductor 560b.

The insulator 544 is preferably provided to cover the top and side surfaces of the conductor 560, the side surface of the insulator 550, and the side surface of the oxide 530c.

The insulator 544 can inhibit the oxidation of the conductor 560. In addition, the insulator 544 can inhibit diffusion of impurities such as water and hydrogen contained in the insulator 580 into the transistor 500B.

The structure of a contact plug in the transistor 500B is different from that of a contact plug in the transistor 500A. In the transistor 500B, an insulator 576a having a barrier property is provided between the insulator 580 and the conductor 546a serving as the contact plug, and an insulator 576b having a barrier property is provided between the insulator 580 and the conductor 546b serving as the contact plug. With the insulator 576a and the insulator 576b, the conductor 546 can be inhibited from reacting with oxygen in the insulator 580; thus, the oxidation of the conductor 546 can be prevented.

Furthermore, with the use of the insulator 576a and the insulator 576b having a barrier property, the range of choices for the materials of the conductor used as the plug or the wiring can be expanded. The use of a metal material having an oxygen absorbing property and high conductivity for the conductor 546a and the conductor 546b, for example, can provide a semiconductor device with low power consumption. Specifically, a material with a low oxidation resistance and high conductivity, such as tungsten or aluminum, can be used. Furthermore, a conductor that can be easily formed or processed can be used, for example.

<<Structure Example 3 of Transistor>>

Figure 32A:
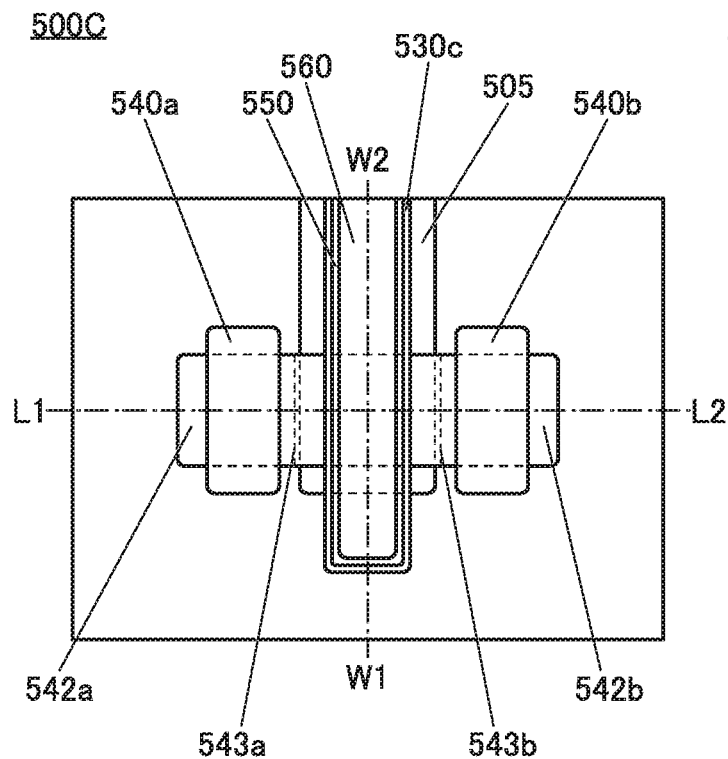
FIGS. 32A to 32C are a top view and cross-sectional views illustrating a structure example of a transistor.
Figure 32C:
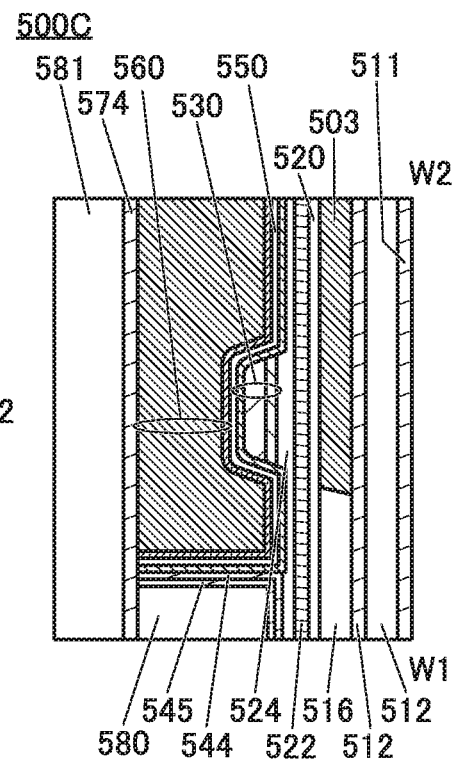
Figure 32B:
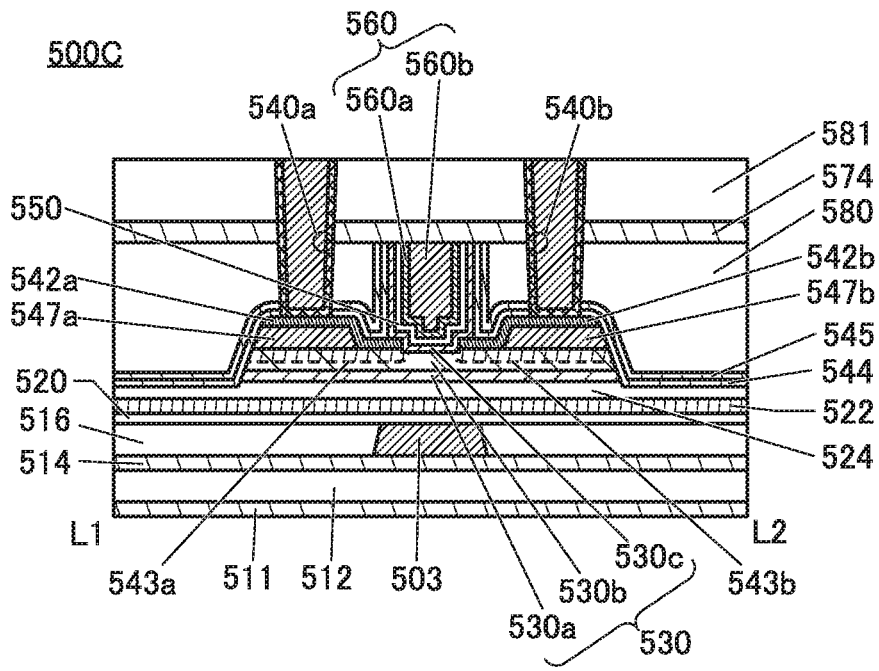

A structure example of a transistor 500C is described with reference to FIGS. 32A to 32C. FIG. 32A is a top view of the transistor 500C. FIG. 32B is a cross-sectional view taken along the dashed-dotted line L1-L2 in FIG. 32A. FIG. 32C is a cross-sectional view taken along the dashed-dotted line W1-W2 in FIG. 32A. Note that for simplification of the drawing, some components are not illustrated in the top view in FIG. 32A.

The transistor 500C is a modification example of the transistor 500A. Thus, differences from the transistor 500A are mainly described to avoid repeated description.

The transistor 500C illustrated in FIGS. 32A to 32C includes a conductor 547a between the conductor 542a and the oxide 530b, and a conductor 547b between the conductor 542b and the oxide 530b. The conductor 542a is on the top surface of the conductor 547a and extends beyond the side surface on the conductor 560 side of the conductor 547a, the conductor 542b is on the top surface of the conductor 547b and extends beyond the side surface on the conductor 560 side of the conductor 547b, and the conductor 547a and the conductor 547b each include a region in contact with the top surface of the oxide 530b. Here, the conductor 547a and the conductor 547b are formed using any of the conductors that can be used as the conductor 542a and the conductor 542b. Furthermore, the conductor 547a and the conductor 547b are preferably thicker than at least the conductor 542a and the conductor 542b.

In the transistor 500C in FIGS. 32A to 32C having such a structure, the conductor 542a and the conductor 542b can be closer to the conductor 560 than those in the transistor 500A are. Furthermore, the end portions of the conductor 542a and the conductor 542b can overlap with the conductor 560. Accordingly, an effective channel length of the transistor 500C can be shortened; thus, the transistor 500C can have high on-state current and improved frequency characteristics.

The conductor 547a and the conductor 547b are preferably provided to overlap with the conductor 542a and the conductor 542b, respectively. With such a structure, the conductor 547a and the conductor 547b functioning as stoppers can prevent over-etching of the oxide 530b by etching for forming the openings where the conductor 540a and the conductor 540b are to be embedded.

In the transistor 500C in FIGS. 32A to 32C, an insulator 545 is provided over and in contact with the insulator 544. The insulator 544 preferably functions as a barrier insulating film for inhibiting excess oxygen or impurities such as water and hydrogen from entering the transistor 500C from the insulator 580 side. The insulator 545 can be formed using the insulator that can be used as the insulator 544. The insulator 544 may be formed using, for example, a nitride insulator such as aluminum nitride, aluminum titanium nitride, titanium nitride, silicon nitride, or silicon nitride oxide.

The transistor 500C in FIGS. 32A to 32C is different from the transistor 500A in FIGS. 30A to 30C in that the conductor 503 has a single-layer structure. In that case, an insulating film to be the insulator 516 is formed over the patterned conductor 503, and the upper portion of the insulating film is removed by a CMP method or the like until the top surface of the conductor 503 is exposed. Here, the conductor 503 preferably has favorable planarity. For example, the average surface roughness (Ra) of the top surface of the conductor 503 is less than or equal to 1 nm, preferably less than or equal to 0.5 nm, and further preferably less than or equal to 0.3 nm. This allows improving the planarity of the insulator formed over the conductor 503 and increasing the crystallinity of the oxide 530b and the oxide 530c.

<<Structure Example 4 of Transistor>>

Figure 33A:
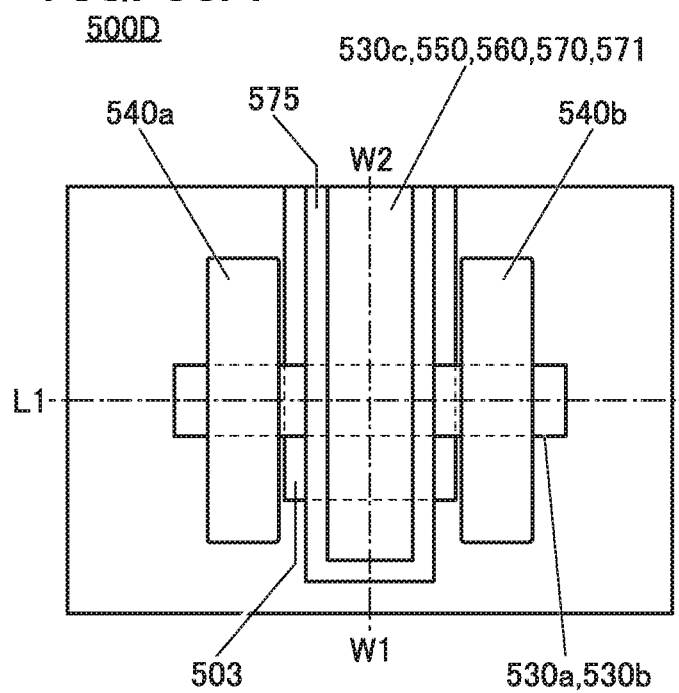
FIGS. 33A to 33C are a top view and cross-sectional views illustrating a structure example of a transistor.
Figure 33C:
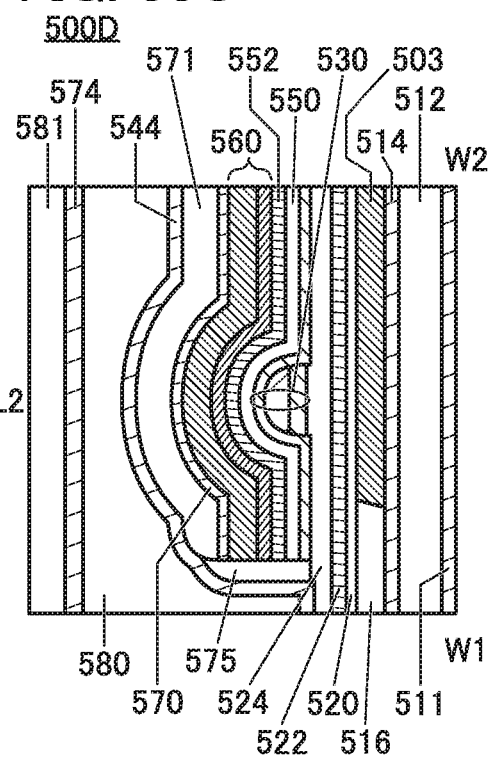
Figure 33B:
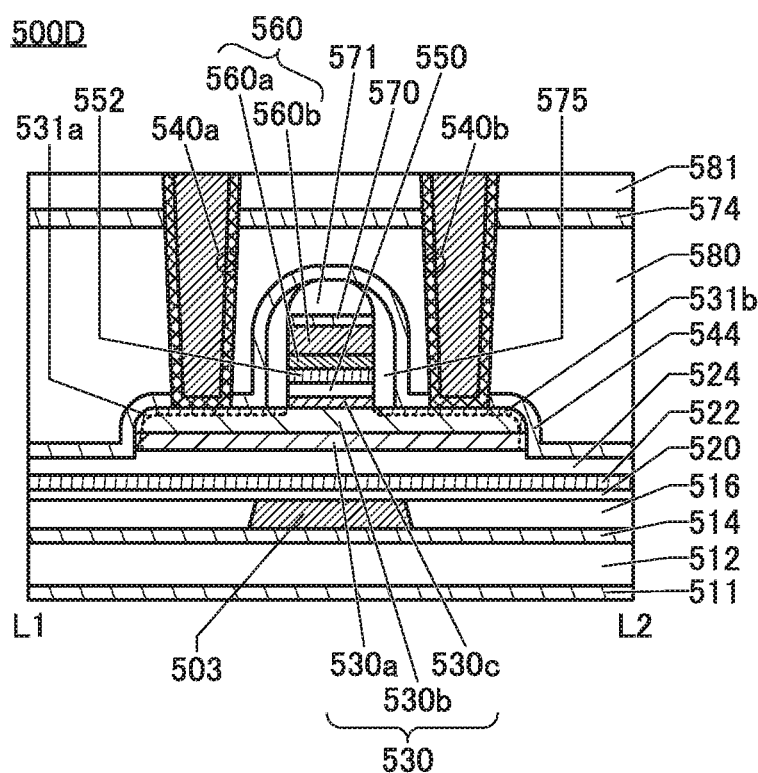

A structure example of a transistor 500D is described with reference to FIGS. 33A to 33C. FIG. 33A is a top view of the transistor 500D. FIG. 33B is a cross-sectional view taken along the dashed-dotted line L1-L2 in FIG. 33A. FIG. 33C is a cross-sectional view taken along the dashed-dotted line W1-W2 in FIG. 33A. Note that for simplification of the drawing, some components are not illustrated in the top view in FIG. 33A.

The transistor 500D is a modification example of any of the above transistors. Thus, differences from the above transistors are mainly described to avoid repeated description.

The transistor 500D illustrated in FIGS. 33A to 33C is different from the transistor 500, the transistor 500A, the transistor 500B, and the transistor 500C in that the conductor 542*a* and the conductor 542*b* are not provided and a region 531*a* and a region 531*b* are provided on part of the exposed surface of the oxide 530*b*. One of the region 531*a* and the region 531*b* functions as a source region, and the other functions as a drain region.

In the transistor 500D, the conductor 505 is not provided and the conductor 503 functioning as the second gate also functions as a wiring, as in the transistor 500C illustrated in FIGS. 32A to 32C. The insulator 550 is provided over the oxide 530*c*, and a metal oxide 552 is provided over the insulator 550. The conductor 560 is provided over the metal oxide 552, and an insulator 570 is provided over the conductor 560. An insulator 571 is provided over the insulator 570.

The metal oxide 552 preferably has a function of inhibiting oxygen diffusion. When the metal oxide 552 that inhibits oxygen diffusion is provided between the insulator 550 and the conductor 560, diffusion of oxygen into the conductor 560 is inhibited. That is, a reduction in the amount of oxygen supplied to the oxide 530 can be suppressed. Moreover, oxidization of the conductor 560 due to oxygen can be suppressed.

Note that the metal oxide 552 may function as part of the first gate. For example, an oxide semiconductor that can be used as the oxide 530 can be used as the metal oxide 552. In that case, when the conductor 560 is formed by a sputtering method, the metal oxide 552 can have a reduced electric resistance and become a conductor. Such a conductor can be referred to as an oxide conductor (OC) electrode.

The metal oxide 552 functions as part of the gate insulating film in some cases. Therefore, when silicon oxide, silicon oxynitride, or the like is used for the insulator 550, a metal oxide that is a high-k material with a high dielectric constant is preferably used as the metal oxide 552. Such a stacked-layer structure can be thermally stable and can have a high dielectric constant. Accordingly, a gate potential that is supplied during operation of the transistor can be reduced while the physical thickness of the gate insulating film is kept. In addition, an equivalent oxide thickness (EOT) of an insulating layer functioning as the gate insulating film can be reduced.

Although the metal oxide 552 in the transistor 500D is shown as a single layer, the metal oxide 552 may have a stacked-layer structure of two or more layers. For example, a metal oxide functioning as part of a gate electrode and a metal oxide functioning as part of a gate insulating film may be stacked.

With the metal oxide 552 functioning as a gate electrode, the on-state current of the transistor 500D can be increased without a reduction in the influence of the electric field generated from the conductor 560. With the metal oxide 552 functioning as a gate insulating film, the distance between the conductor 560 and the oxide 530 is kept by the physical thicknesses of the insulator 550 and the metal oxide 552, so that leakage current between the conductor 560 and the oxide 530 can be reduced. Thus, with the stacked-layer structure of the insulator 550 and the metal oxide 552, the physical distance between the conductor 560 and the oxide 530 and the intensity of electric field applied from the conductor 560 to the oxide 530 can be easily adjusted as appropriate.

Specifically, the oxide semiconductor that can be used for the oxide 530 can also be used for the metal oxide 552 when the resistance of the oxide semiconductor is reduced. Alternatively, a metal oxide containing one or more of hafnium, aluminum, gallium, yttrium, zirconium, tungsten, titanium, tantalum, nickel, germanium, magnesium, and the like can be used as the metal oxide 552.

It is particularly preferable to use an insulating layer containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film and thus is less likely to be crystallized by heat treatment in a later step. Therefore, it is preferable to use hafnium aluminate. Note that the metal oxide 552 is not necessarily provided. Design is determined as appropriate in consideration of required transistor characteristics.

The insulator 570 is preferably formed using an insulating material having a function of inhibiting the passage of oxygen and impurities such as water and hydrogen. For example, aluminum oxide or hafnium oxide is preferably used. In that case, oxidization of the conductor 560 due to oxygen from above the insulator 570 can be inhibited. Moreover, entry of impurities such as water and hydrogen from above the insulator 570 into the oxide 530 through the conductor 560 and the insulator 550 can be inhibited.

The insulator 571 functions as a hard mask. By provision of the insulator 571, the conductor 560 can be processed to have the side surface that is substantially perpendicular. Specifically, an angle formed by the side surface of the conductor 560 and a surface of the substrate can be greater than or equal to 75° and less than or equal to 100°, preferably greater than or equal to 80° and less than or equal to 95°.

The insulator 571 may be formed using an insulating material having a function of inhibiting the passage of oxygen and impurities such as water and hydrogen so that the insulator 571 also functions as a barrier layer. In that case, the insulator 570 is not necessarily provided.

The insulator 570, the conductor 560, the metal oxide 552, the insulator 550, and the oxide 530*c* are selectively removed using the insulator 571 as a hard mask, so that the side surfaces of the insulator 570, the conductor 560, the metal oxide 552, the insulator 550, and the oxide 530*c* are substantially aligned with each other and part of the surface of the oxide 530*b* can be exposed.

In the transistor 500D, the region 531*a* and the region 531*b* are provided on part of the exposed surface of the oxide 530*b*. One of the region 531*a* and the region 531*b* functions as the source region, and the other functions as the drain region.

The region 531*a* and the region 531*b* can be formed by, for example, introducing an impurity element such as phosphorus or boron to the exposed surface of the oxide 530*b* by an ion implantation method, an ion doping method, a plasma immersion ion implantation method, plasma treatment, or the like. In this embodiment and the like, an impurity element refers to an element other than main component elements.

The region 531*a* and the region 531*b* can also be formed in the following manner: a metal film is formed after part of the surface of the oxide 530*b* is exposed and then the element in the metal film is diffused into the oxide 530*b* by heat treatment.

The regions of the oxide 530*b* into which the impurity element is introduced have decreased electric resistivity. Accordingly, the region 531*a* and the region 531*b* are each referred to as an impurity region or a low-resistance region in some cases.

With the use of the insulator 571 and/or the conductor 560 as a mask, the region 531a and the region 531b can be formed in a self-aligned manner. In that case, the conductor 560 does not overlap with the region 531a and/or the region 531b; thus, parasitic capacitance can be reduced. Furthermore, an offset region is not formed between the channel formation region and the source region or the drain region (the region 531a or the region 531b). The formation of the region 531a and the region 531b in a self-aligned manner achieves an increase in the on-state current, a reduction in the threshold voltage, and an improvement in the operation frequency, for example.

In order to further reduce the off-state current, the offset region may be provided between the channel formation region and the source region or the drain region. The offset region is a region which has high electric resistivity and into which the impurity element is not introduced. The offset region can be formed by introducing the impurity element after the formation of the insulator 575. In that case, the insulator 575 serves as a mask, like the insulator 571 or the like. Thus, the impurity element is not introduced into a region of the oxide 530b that overlaps with the insulator 575, and the electric resistivity of the region can be kept high.

In the transistor 500D, the insulator 575 is provided on the side surfaces of the insulator 570, the conductor 560, the metal oxide 552, the insulator 550, and the oxide 530c. The insulator 575 is preferably an insulator having a low dielectric constant. For example, the insulator 575 is preferably silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, the insulator 575 is preferably silicon oxide, silicon oxynitride, silicon nitride oxide, and porous silicon oxide because an excess-oxygen region can be easily formed in the insulator 575 in a later step. In addition, silicon oxide and silicon oxynitride are preferable because of their thermal stability. The insulator 575 preferably has a function of diffusing oxygen.

The transistor 500D includes the insulator 544 over the insulator 575 and the oxide 530. The insulator 544 is preferably formed by a sputtering method. The insulator formed by a sputtering method can be an insulator containing few impurities such as water and hydrogen. For example, aluminum oxide is preferably used for the insulator 544.

Note that an oxide film formed by a sputtering method may extract hydrogen from the component on which the oxide film is formed. Thus, when the insulator 544 absorbs hydrogen and water from the oxide 530 and the insulator 575, the hydrogen concentrations in the oxide 530 and the insulator 575 can be reduced.

<<Structure Example 5 of Transistor>>

Figure 34A:
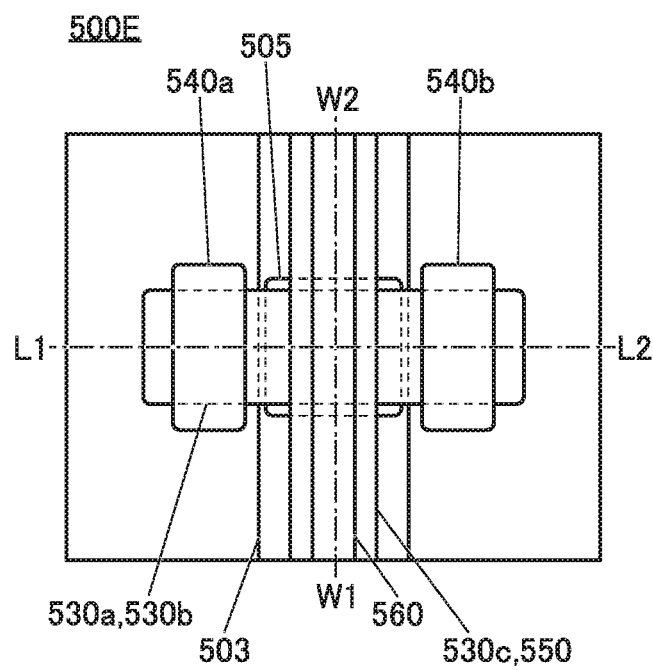
FIGS. 34A to 34C are a top view and cross-sectional views illustrating a structure example of a transistor.
Figure 34C:
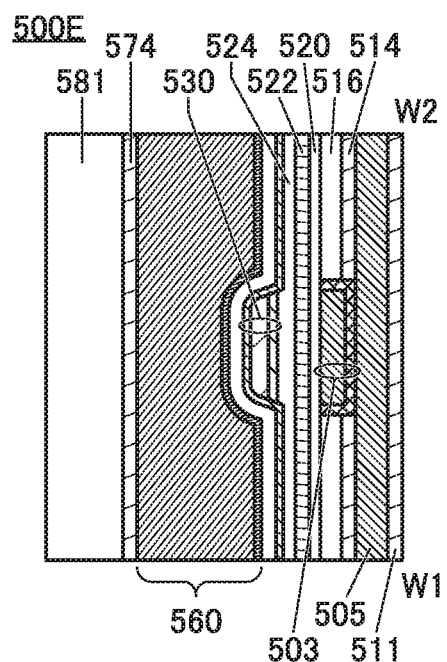
Figure 34B:
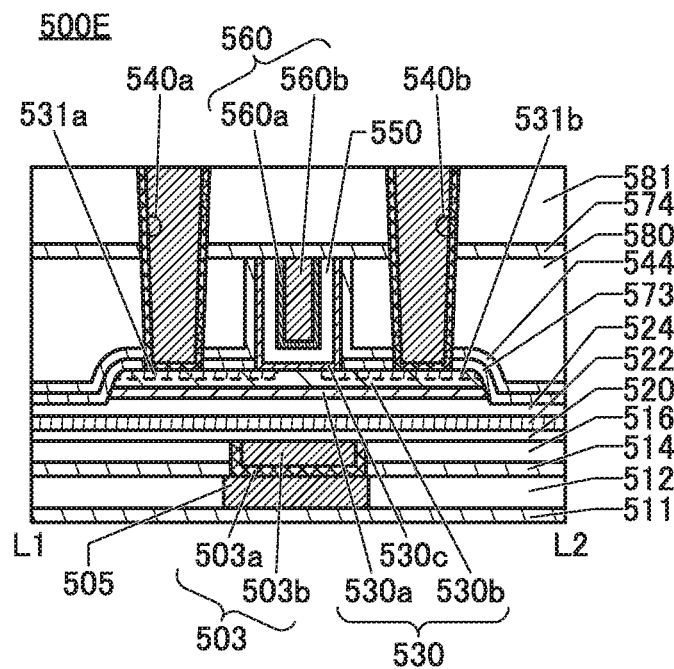

A structure example of a transistor 500E is described with reference to FIGS. 34A to 34C. FIG. 34A is a top view of the transistor 500E. FIG. 34B is a cross-sectional view taken along the dashed-dotted line L1-L2 in FIG. 34A. FIG. 34C is a cross-sectional view taken along the dashed-dotted line W1-W2 in FIG. 34A. Note that for simplification of the drawing, some components are not illustrated in the top view in FIG. 34A.

The transistor 500E is a modification example of any of the above transistors. Thus, differences from the above transistors are mainly described to avoid repeated description.

In FIGS. 34A to 34C, the conductor 542a and the conductor 542b are not provided and the region 531a and the region 531b are provided on part of the exposed surface of the oxide 530b, as in the transistor 500D. One of the region 531a and the region 531b functions as the source region, and the other functions as the drain region. An insulator 573 is provided between the oxide 530b and the insulator 544.

The region 531a and the region 531b illustrated in FIG. 34B are regions of the oxide 530b to which any of the following elements is added. The region 531a and the region 531b can be formed using a dummy gate, for example.

Specifically, the dummy gate is provided over the oxide 530b, and an element that can reduce the resistance of part of the oxide 530b is added using the dummy gate as a mask. Thus, the element is added to a region of the oxide 530 that does not overlap with the dummy gate, whereby the region 531a and the region 531b are formed. For the addition of the element, an ion implantation method by which an ionized source gas is subjected to mass separation and then added, an ion doping method by which an ionized source gas is added without mass separation, a plasma immersion ion implantation method, or the like can be used.

Typical examples of an element that can reduce the resistance of part of the oxide 530b include boron and phosphorus. Moreover, hydrogen, carbon, nitrogen, fluorine, sulfur, chlorine, titanium, a rare gas, or the like may be used. Typical examples of a rare gas element include helium, neon, argon, krypton, and xenon. The concentration of such an element can be measured by secondary ion mass spectrometry (SIMS) or the like.

In particular, boron and phosphorus can be added in the apparatus used in a manufacturing line for a Si transistor containing amorphous silicon, low-temperature polysilicon, or the like in a semiconductor layer; thus, the use of such an apparatus used in a manufacturing line can reduce the resistance of part of the oxide 530b. That is, part of a manufacturing line for a Si transistor can be used in the manufacturing process of the transistor 500E.

Next, an insulating film to be the insulator 573 and an insulating film to be the insulator 544 may be formed over the oxide 530b and the dummy gate. When the insulating film to be the insulator 573 and the insulating film to be the insulator 544 are stacked, a region where the region 531a or the region 531b, the oxide 530c, and the insulator 550 overlap with each other can be provided.

Specifically, after an insulating film to be the insulator 580 is provided over the insulating film to be the insulator 544, chemical mechanical polishing (CMP) treatment is performed on the insulating film to be the insulator 580, so that part of the insulating film to be the insulator 580 is removed and the dummy gate is exposed. Then, when the dummy gate is removed, part of the insulator 573 that is in contact with the dummy gate is preferably also removed. Thus, the insulator 544 and the insulator 573 are exposed on the side surface of the opening of the insulator 580, and the region 531a and the region 531b provided on the oxide 530b are partly exposed on the bottom surface of the opening. After that, an oxide film to be the oxide 530c, an insulating film to be the insulator 550, and a conductive film to be the conductor 560 are formed in this order in the opening, and the oxide film to be the oxide 530c, the insulating film to be the insulator 550, and the conductive film to be the conductor 560 are partly removed by CMP treatment or the like until the insulator 580 is exposed, whereby the transistor illustrated in FIGS. 34A to 34C can be formed.

Note that the insulator 573 and the insulator 544 are not necessarily provided. Design is determined as appropriate in consideration of required transistor characteristics.

The transistor illustrated in FIGS. 34A to 34C includes neither the conductor 542a nor the conductor 542b; thus, the cost can be reduced.

<<Structure Example 6 of Transistor>>

Although FIG. 29A illustrates the structure example in which the conductor 560 functioning as the gate is formed inside the opening of the insulator 580, a structure may be employed in which the insulator is provided over the conductor, for example. A structure example of such a transistor is illustrated in FIGS. 35A and 35B and FIGS. 36A and 36B.

Figure 35A:
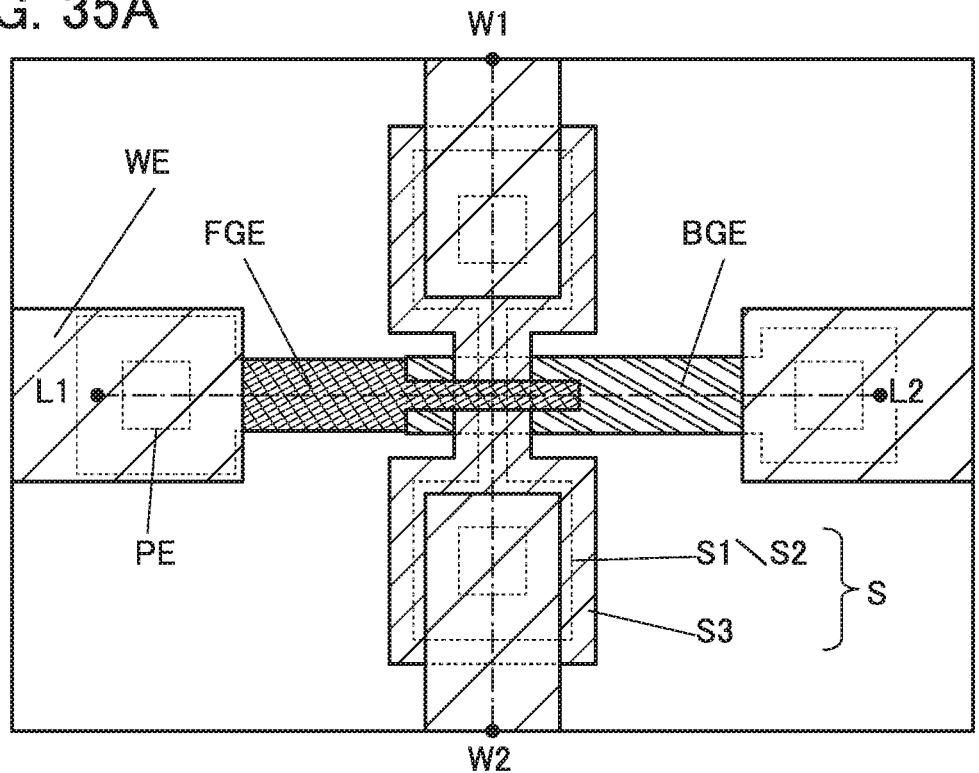
FIGS. 35A and 35B are a top view and a perspective view illustrating a structure example of a transistor.
Figure 35B:
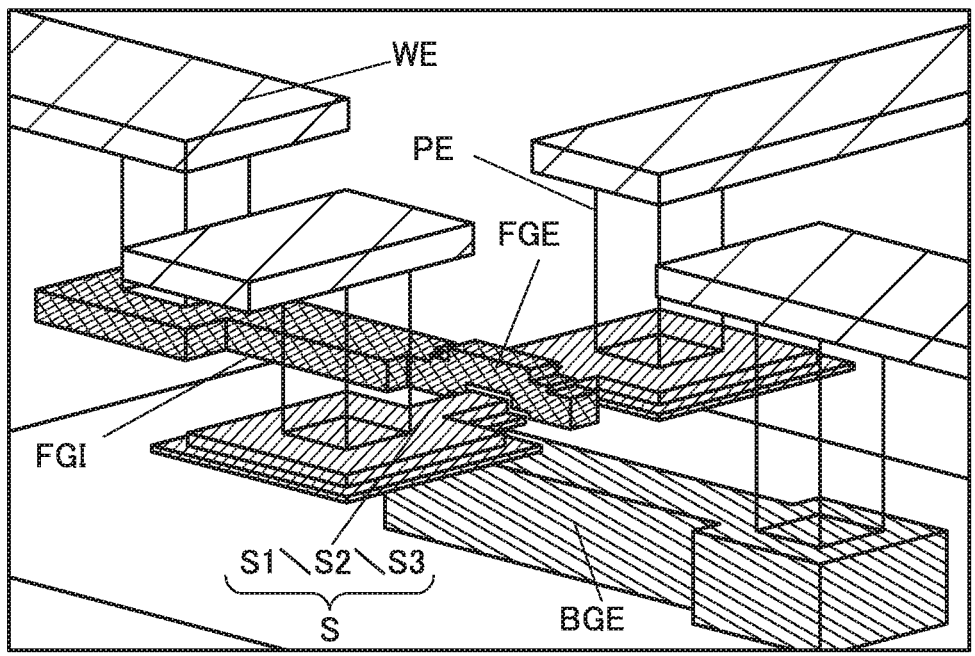
Figure 36A:
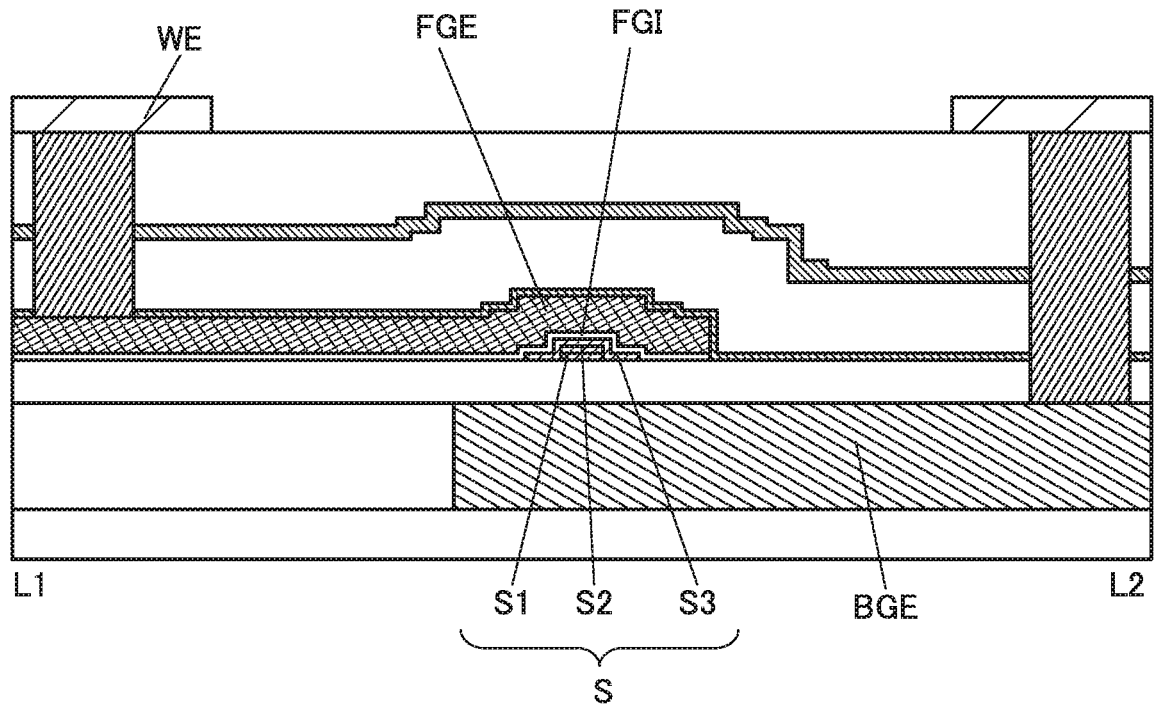
FIGS. 36A and 36B are cross-sectional views illustrating a structure example of a transistor.
Figure 36B:
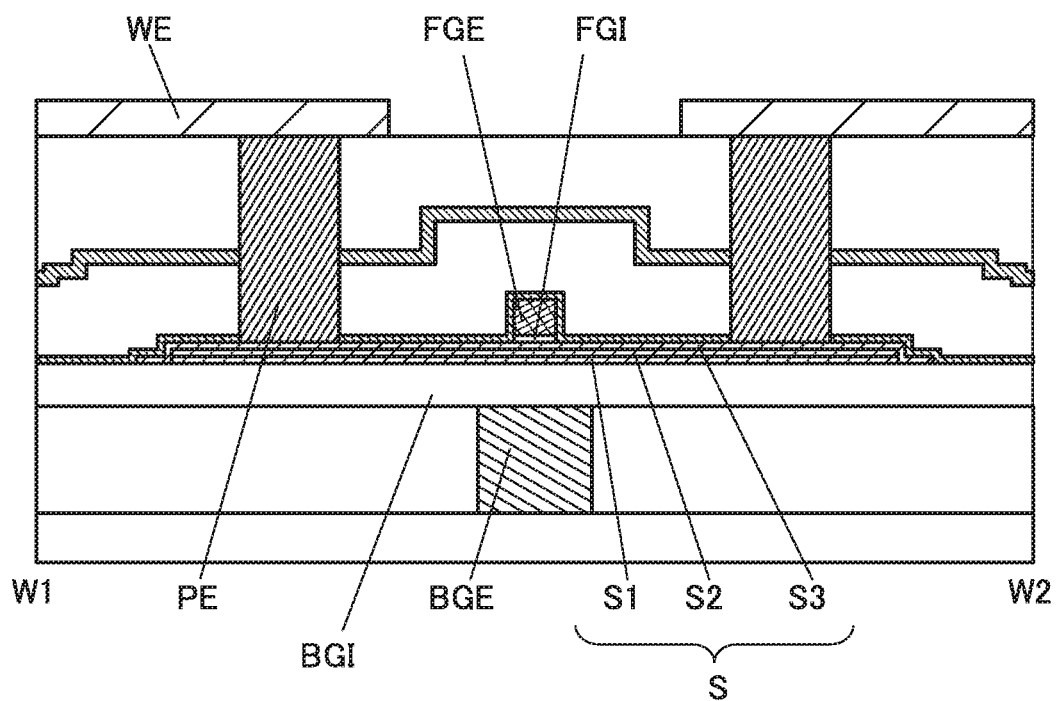

FIG. 35A is a top view of the transistor, and FIG. 35B is a perspective view of the transistor. FIG. 36A is a cross-sectional view taken along the line L1-L2 in FIG. 35A, and FIG. 36B is a cross-sectional view taken along the line W1-W2 in FIG. 35A.

The transistor illustrated in FIGS. 35A and 35B and FIGS. 36A and 36B includes a conductor BGE functioning as a back gate, an insulator BGI functioning as a gate insulating film, an oxide semiconductor S, an insulator FGI functioning as a gate insulating film, a conductor FGE functioning as a front gate, and a conductor WE functioning as a wiring. A conductor PE functions as a plug for connecting the conductor WE to the oxide semiconductor S, the conductor BGE, or the conductor FGE. Note that here, the oxide semiconductor S includes three oxides S1, S2, and S3, for example.

<Structure Example of Capacitor>

Figure 37A:
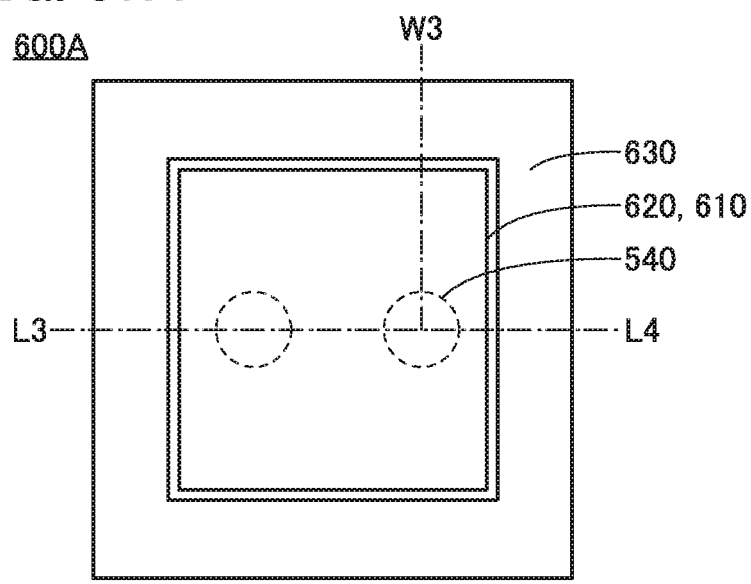
FIGS. 37A to 37C are a top view and perspective views illustrating a structure example of a capacitor.
Figure 37B:
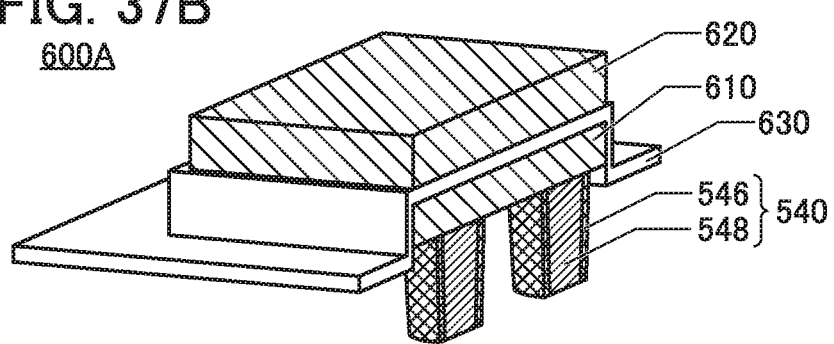
Figure 37C:
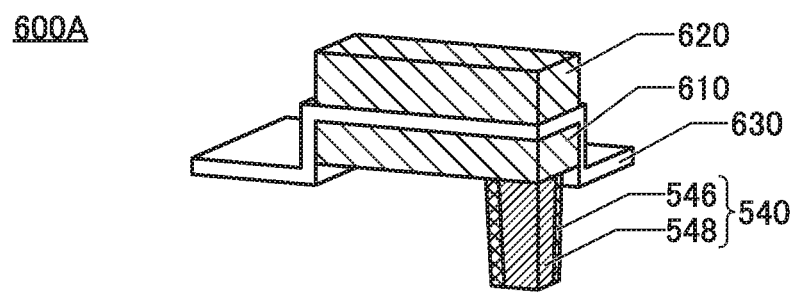

FIGS. 37A to 37C illustrate a capacitor 600A as an example of the capacitor 600 that can be used in the semiconductor device illustrated in FIG. 27. FIG. 37A is a top view of the capacitor 600A, FIG. 37B is a perspective view showing a cross section taken along the dashed-dotted line L3-L4 in the capacitor 600A, and FIG. 37C is a perspective view showing a cross section taken along the dashed-dotted line W3-W4 in the capacitor 600A.

The conductor 610 functions as one of a pair of electrodes of the capacitor 600A, and the conductor 620 functions as the other of the pair of electrodes of the capacitor 600A. The insulator 630 functions as a dielectric between the pair of electrodes.

The bottom portion of the conductor 610 in the capacitor 600A is electrically connected to the conductor 546 and the conductor 548. The conductor 546 and the conductor 548 function as plugs or wirings for connection to another circuit component. In FIGS. 37A to 37C, the conductor 546 and the conductor 548 are collectively denoted by the conductor 540.

In FIGS. 37A to 37C, for simplification of the drawing, the insulator 586 in which the conductor 546 and the conductor 548 are embedded and the insulator 650 covering the conductor 620 and the insulator 630 are not illustrated.

Although the capacitor 600 illustrated in FIG. 27 and FIG. 28 and the capacitor 600A illustrated in FIGS. 37A to 37C are each a planar capacitor, the shape of the capacitor is not limited thereto. For example, the capacitor 600 may be a cylindrical capacitor 600B illustrated in FIGS. 38A to 38C.

Figure 38A:
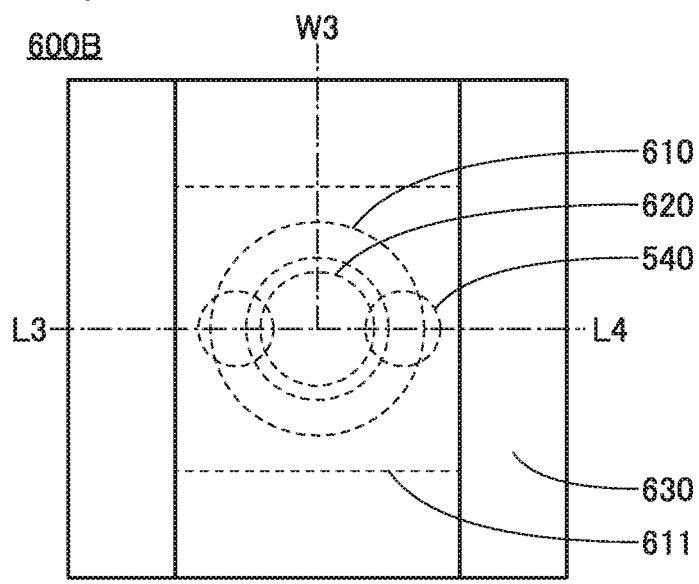
FIGS. 38A to 38C are a top view and perspective views illustrating a structure example of a capacitor.
Figure 38B:
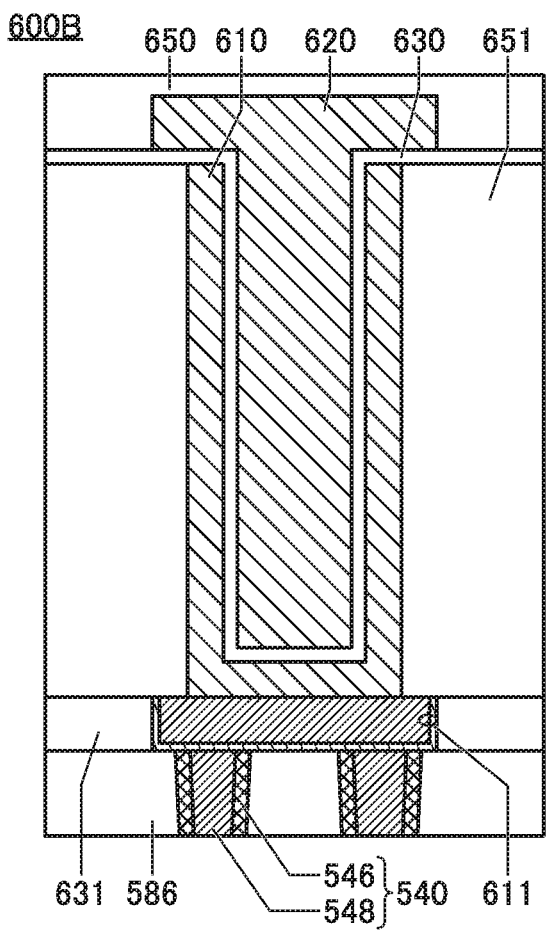
Figure 38C:
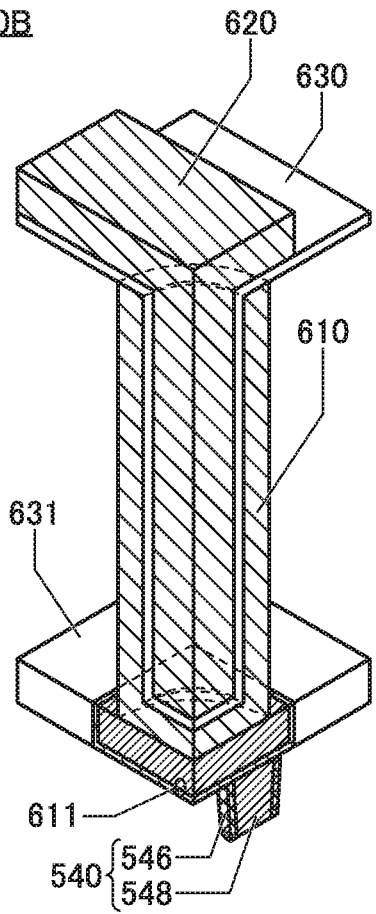

FIG. 38A is a top view of the capacitor 600B, FIG. 38B is a cross-sectional view taken along the dashed-dotted line L3-L4 in the capacitor 600B, and FIG. 38C is a perspective view showing a cross section taken along the dashed-dotted line W3-W4 in the capacitor 600B.

The capacitor 600B in FIG. 38B includes an insulator 631 over the insulator 586 in which the conductor 540 is embedded, an insulator 651 having an opening, the conductor 610 functioning as one of the pair of electrodes, and the conductor 620 functioning as the other of the pair of electrodes.

For simplification of the drawing, the insulator 586, the insulator 650, and the insulator 651 are not illustrated in FIG. 38C.

The insulator 631 can be formed using a material similar to that for the insulator 586, for example.

A conductor 611 is embedded in the insulator 631 so as to be electrically connected to the conductor 540. The conductor 611 can be formed using a material similar to those for the conductor 330 and the conductor 518, for example.

The insulator 651 can be formed using a material similar to that for the insulator 586, for example.

The insulator 651 has the opening as described above, and the opening overlaps with the conductor 611.

The conductor 610 is formed on the bottom portion and the side surface of the opening. In other words, the conductor 621 overlaps with the conductor 611 and is electrically connected to the conductor 611.

Note that the opening is formed in the insulator 651 by etching or the like, and then, the conductor 610 is formed by a sputtering method, an ALD method, or the like. After that, the conductor 610 formed over the insulator 651 is removed by a CMP method or the like while the conductor 610 in the opening is left.

The insulator 630 is positioned over the insulator 651 and the conductor 610. Note that the insulator 630 functions as a dielectric between the pair of electrodes in the capacitor.

The conductor 620 is formed over the insulator 630 so as to fill the opening of the insulator 651.

The insulator 650 is formed to cover the insulator 630 and the conductor 620.

The cylindrical capacitor 600B in FIGS. 38A to 38C can have larger capacitance than the planar capacitor 600A. Thus, for example, with the use of the capacitor 600B as the capacitor C01, the capacitor C01m, or the like described in any of the above embodiments, voltage between the terminals of the capacitor can be maintained for a long time.

Note that this embodiment can be combined with any of the other embodiments in this specification as appropriate.

Embodiment 5

In this embodiment, the compositions of a cloud-aligned composite oxide semiconductor (CAC-OS) and a c-axis aligned crystalline oxide semiconductor (CAAC-OS) which are metal oxides that can be used in the OS transistor described in any of the above embodiments will be described. Note that in this specification and the like, CAC refers to an example of a function or a material composition, and CAAC refers to an example of a crystal structure.

<Composition of Metal Oxide>

A CAC-OS or a CAC metal oxide has a conducting function in part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the above-described conducting function, and the insulating regions have the above-described insulating function.

In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different band gaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or CAC metal oxide is used in a channel formation region of a transistor, high current drive capability in the on state of the transistor, that is, high on-state current and high field-effect mobility, can be obtained.

In other words, the CAC-OS or the CAC metal oxide can be called a matrix composite or a metal matrix composite.

<Structure of Metal Oxide>

Oxide semiconductors are classified into a single-crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that the distortion is a portion where the direction of a lattice arrangement changes between a region with a regular lattice arrangement and another region with a regular lattice arrangement in a region in which nanocrystals are connected.

The shape of the nanocrystal is basically hexagon. However, the shape is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of distortion in the CAAC-OS. That is, formation of a grain boundary is inhibited because of the distortion of lattice arrangement. This is probably because the CAAC-OS can tolerate distortion owing to a low density of arrangement of oxygen atoms in the a-b plane direction, an interatomic bond distance changed by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M of the (M,Zn) layer is replaced with indium, the layer can also be referred to as an (In,M,Zn) layer. Also, when indium in the In layer is replaced with the element M, the layer can be referred to as an (In,M) layer.

The CAAC-OS is an oxide semiconductor with high crystallinity. On the other hand, in the CAAC-OS, a clear grain boundary cannot be observed; thus, a reduction in electron mobility due to the grain boundary is less likely to occur. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability. In addition, the CAAC-OS is stable with respect to high temperatures in the manufacturing process (what is called thermal budget). Therefore, the use of the CAAC-OS for the OS transistor can extend a degree of freedom of the manufacturing process.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, the nc-OS cannot be distinguished from an a-like OS or an amorphous oxide semiconductor, depending on an analysis method.

An a-like OS has a structure between those of the nc-OS and the amorphous oxide semiconductor. The a-like OS has a void or a low-density region. That is, the a-like OS has low crystallinity as compared with the nc-OS and the CAAC-OS.

An oxide semiconductor can have various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the oxide semiconductor is used for a transistor will be described.

When the oxide semiconductor is used for a transistor, the transistor can have high field-effect mobility. In addition, the transistor can have high reliability.

An oxide semiconductor with low carrier density is preferably used for the transistor. In order to reduce the carrier density of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. For example, an oxide semiconductor whose carrier density is lower than $8\times10^{11}/cm^3$, preferably lower than $1\times10^{11}/cm^3$, further preferably lower than $1\times10^{10}/cm^3$, and higher than or equal to $1\times10^{-9}/cm^3$ is used.

A highly purified intrinsic or substantially highly purified intrinsic oxide semiconductor film has a low density of defect states and accordingly has a low density of trap states in some cases.

Charges trapped by the trap states in the oxide semiconductor take a long time to be released and may behave like fixed charges. Thus, a transistor whose channel formation region is formed in an oxide semiconductor having a high density of trap states has unstable electrical characteristics in some cases.

To obtain stable electrical characteristics of the transistor, reducing the concentration of impurities in the oxide semiconductor is effective. In order to reduce the concentration of impurities in the oxide semiconductor, the concentration of impurities in a film which is adjacent to the oxide semiconductor is also preferably reduced. Examples of the impurities include hydrogen, nitrogen, alkali metal, alkaline earth metal, iron, nickel, and silicon.

<Impurity>

Here, the influence of impurities in the oxide semiconductor will be described.

When silicon or carbon, which is one of Group 14 elements, is contained in the oxide semiconductor, defect states are formed in the oxide semiconductor. Thus, the concentration of silicon or carbon in the oxide semiconductor and around an interface with the oxide semiconductor (measured by secondary ion mass spectrometry (SIMS)) is set to lower than or equal to $2 \times 10^{18}$ atoms/cm$^3$, preferably lower than or equal to $2 \times 10^{17}$ atoms/cm$^3$.

When the oxide semiconductor contains alkali metal or alkaline earth metal, defect states are formed and carriers are generated in some cases. Thus, a transistor including an oxide semiconductor that contains alkali metal or alkaline earth metal is likely to be normally on. Therefore, it is preferable to reduce the concentration of alkali metal or alkaline earth metal of the oxide semiconductor. Specifically, the concentration of alkali metal or alkaline earth metal in the oxide semiconductor measured by SIMS is set to lower than or equal to $1 \times 10^{18}$ atoms/cm$^3$, preferably lower than or equal to $2 \times 10^{16}$ atoms/cm$^3$.

When the oxide semiconductor contains nitrogen, the oxide semiconductor easily becomes n-type because of generation of electrons serving as carriers and an increase in carrier density. Thus, a transistor whose semiconductor includes an oxide semiconductor that contains nitrogen is likely to be normally on. For this reason, the amount of nitrogen in the oxide semiconductor is preferably reduced as much as possible; the nitrogen concentration of the oxide semiconductor measured by SIMS is set to, for example, lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in an oxide semiconductor reacts with oxygen bonded to a metal atom to be water, and thus causes an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally on. Accordingly, it is preferable that the amount of hydrogen in the oxide semiconductor be reduced as much as possible. Specifically, the hydrogen concentration of the oxide semiconductor measured by SIMS is set to lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

When an oxide semiconductor with sufficiently reduced impurity concentration is used for a channel formation region in a transistor, the transistor can have stable electrical characteristics.

Note that this embodiment can be combined with any of the other embodiments in this specification as appropriate.

Embodiment 6

In this embodiment, a semiconductor wafer provided with the semiconductor device or the like described in any of the above embodiments and examples of an electronic component including the semiconductor device are described.

<Semiconductor Wafer>

First, an example of a semiconductor wafer provided with a semiconductor device or the like is described with reference to FIG. 39A.

Figure 39A:
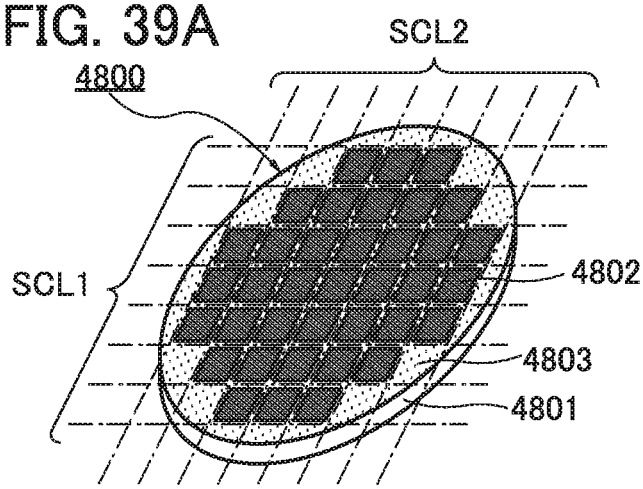
FIGS. 39A to 39D are perspective views illustrating examples of a semiconductor wafer and an electronic component.

A semiconductor wafer 4800 illustrated in FIG. 39A includes a wafer 4801 and a plurality of circuit portions 4802 provided on the top surface of the wafer 4801. A portion without the circuit portions 4802 on the top surface of the wafer 4801 is a spacing 4803 that is a region for dicing.

The semiconductor wafer 4800 can be formed by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

Next, a dicing step is performed. The dicing is carried out along scribe lines SCL1 and scribe lines SCL2 (sometimes referred to as dicing lines or cutting lines) indicated by dashed-dotted lines. To perform the dicing step easily, the spacing 4803 is preferably arranged such that a plurality of scribe lines SCL1 are parallel to each other, a plurality of scribe lines SCL2 are parallel to each other, and the scribe lines SCL1 and the scribe lines SCL2 intersect each other perpendicularly.

Figure 39B:
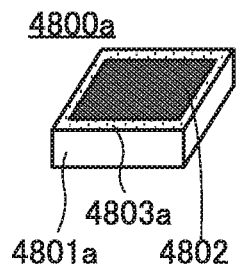

With the dicing step, a chip 4800a shown in FIG. 39B can be cut out from the semiconductor wafer 4800. The chip 4800a includes a wafer 4801a, the circuit portion 4802, and a spacing 4803a. Note that it is preferable to make the spacing 4803a as small as possible. Here, it is preferred that the width of the spacing 4803 between adjacent circuit portions 4802 be substantially the same as the length of margin for cutting the scribe line SCL1 or the scribe line SCL2.

The shape of the element substrate of one embodiment of the present invention is not limited to the shape of the semiconductor wafer 4800 illustrated in FIG. 39A. For example, the element substrate may be a rectangular semiconductor wafer. The shape of the element substrate can be changed as appropriate, depending on a process for fabricating an element and an apparatus for fabricating an element.

<Electronic Component>

Next, examples of an electronic component including the chip 4800a are described with reference to FIGS. 39C and 39D.

Figure 39C:
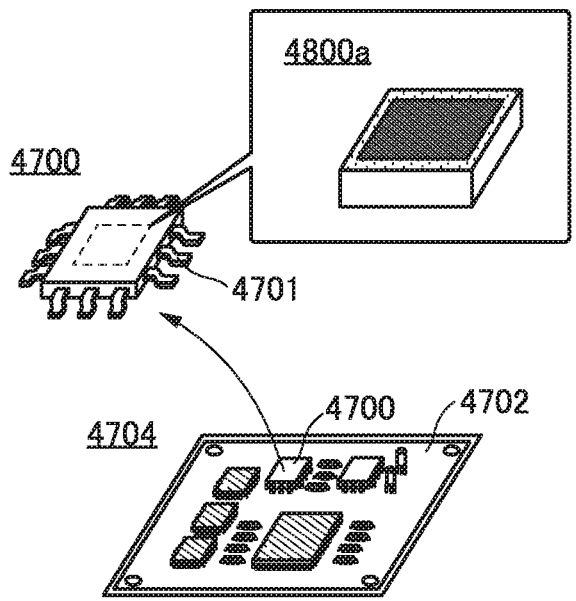

FIG. 39C is a perspective view of an electronic component 4700 and a substrate (a circuit board 4704) on which the electronic component 4700 is mounted. The electronic component 4700 in FIG. 39C includes a lead 4701 and the chip 4800a, and functions as an IC chip or the like. In particular, in this specification and the like, the electronic component 4700 including the semiconductor device such as the arithmetic circuit 110 described in any of the above embodiments is referred to as a brain-morphic processor.

The electronic component 4700 can be formed by, for example, a wire bonding step of electrically connecting the lead 4701 of a lead frame to an electrode over the chip 4800a with a metal fine line (wire), a molding step of performing sealing with an epoxy resin or the like, a plating step on the lead 4701 of the lead frame, and a printing step on a surface of the package. Ball bonding, wedge bonding, or the like can be used for the wire bonding step. Although a quad flat package (QFP) is used as the package of the electronic component 4700 in FIG. 39C, the mode of the package is not limited thereto.

The electronic component 4700 is mounted on a printed circuit board 4702, for example. A plurality of such IC chips are combined and electrically connected to each other on the printed circuit board 4702; thus, the circuit board 4704 is completed.

Figure 39D:
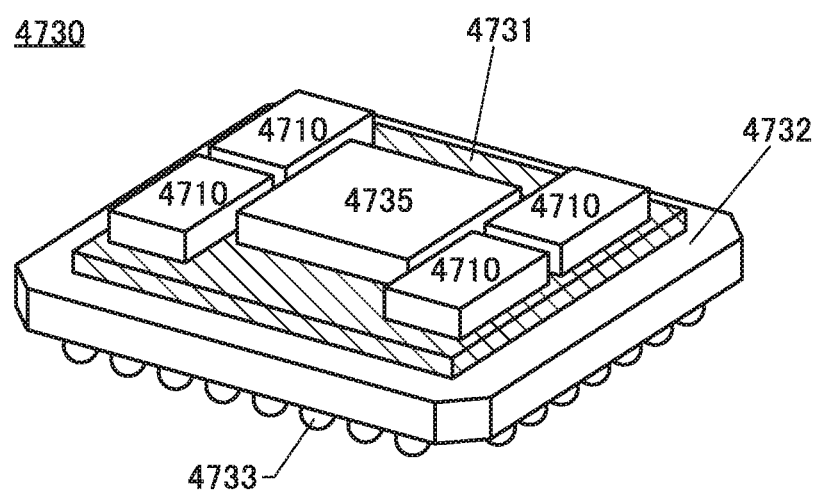

FIG. 39D is a perspective view of an electronic component 4730. The electronic component 4730 is an example of a system in package (SiP) or a multi-chip module (MCM). In the electronic component 4730, an interposer 4731 is provided over a package substrate 4732 (printed circuit board), and a semiconductor device 4735 and a plurality of semiconductor devices 4710 are provided over the interposer 4731.

The electronic component 4730 includes the semiconductor devices 4710. Examples of the semiconductor devices 4710 include the semiconductor device described in any of the above embodiments and a high bandwidth memory (HBM). An integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches to each other. The plurality of wirings are provided to have a single-layer structure or a multilayer structure. The interposer 4731 has a function of electrically connecting an integrated circuit provided on the interposer 4731 to an electrode provided on the package substrate 4732. Accordingly, the interposer is sometimes referred to as a rewiring substrate or an intermediate substrate. A through electrode may be provided in the interposer 4731 and used for electrically connecting the integrated circuit to the package substrate 4732. In the case of a silicon interposer, a through-silicon via (TSV) can also be used as the through electrode.

A silicon interposer is preferably used as the interposer 4731. The silicon interposer can be manufactured at lower cost than an integrated circuit because the silicon interposer is not necessarily provided with an active element. Moreover, the wirings of the silicon interposer can be formed through a semiconductor process; thus, formation of minute wirings that is difficult in a resin interposer is easily achieved.

In order to achieve a wide memory bandwidth, many wirings need to be connected to an HBM. Therefore, minute wirings are required to be formed densely on an interposer on which an HBM is mounted. For this reason, it is preferable that a silicon interposer be used as the interposer on which an HBM is mounted.

In an SiP, an MCM, or the like using a silicon interposer, a decrease in reliability due to a difference in expansion coefficient between an integrated circuit and the interposer is less likely to occur. Furthermore, the surface of a silicon interposer has high planarity, so that poor connection between the silicon interposer and an integrated circuit provided thereon is less likely to occur. It is particularly preferable to use a silicon interposer for a 2.5D package (2.5D mounting) in which a plurality of integrated circuits are arranged side by side on an interposer.

A heat sink (radiator plate) may be provided to overlap with the electronic component 4730. In that case, the integrated circuits provided on the interposer 4731 are preferably level with each other. In the electronic component 4730 of this embodiment, the semiconductor devices 4710 and the semiconductor device 4735 are preferably level with each other, for example.

An electrode 4733 for mounting the electronic component 4730 on another substrate may be provided on the bottom portion of the package substrate 4732. FIG. 39D illustrates an example in which the electrode 4733 is formed of solder balls. The solder balls are provided in a matrix on the bottom portion of the package substrate 4732, whereby a ball grid array (BGA) can be achieved. Alternatively, the electrode 4733 may be formed of conductive pins. The conductive pins are provided in a matrix on the bottom portion of the package substrate 4732, whereby a pin grid array (PGA) can be achieved.

The electronic component 4730 can be mounted on another substrate in various manners, not limited to the BGA and the PGA. For example, a staggered pin grid array (SPGA), a land grid array (LGA), a quad flat package (QFP), a quad flat J-leaded package (QFJ), or a quad flat non-leaded package (QFN) can be employed.

Note that this embodiment can be combined with other embodiments in this specification as appropriate.

Embodiment 7

Figure 40:
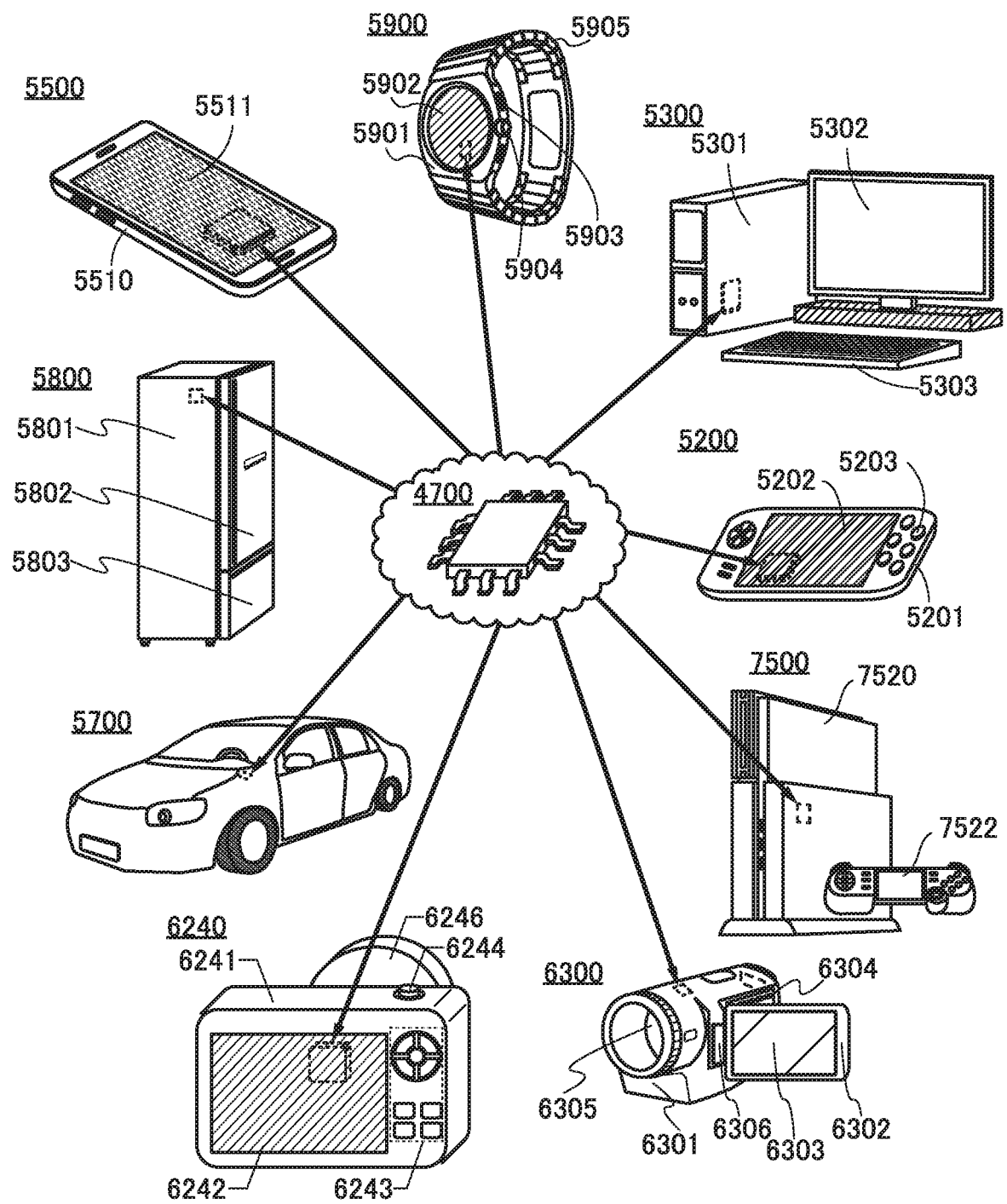
FIG. 40 is a perspective view illustrating examples of electronic devices.

In this embodiment, examples of electronic devices each including the semiconductor device described in any of the above embodiments are described. FIG. 40 illustrates electronic devices each including the electronic component 4700 that includes the semiconductor device.

[Mobile Phone]

An information terminal 5500 illustrated in FIG. 40 is a mobile phone (smartphone), which is a type of information terminal. The information terminal 5500 includes a housing 5510 and a display portion 5511. As input interfaces, a touch panel is provided in the display portion 5511 and a button is provided in the housing 5510.

The information terminal 5500 can execute an application utilizing artificial intelligence with the use of the semiconductor device described in any of the above embodiments. Examples of the application utilizing artificial intelligence include an application for interpreting a conversation and displaying its content on the display portion 5511; an application for recognizing the letters, figures, and the like input to the touch panel of the display portion 5511 by a user and displaying them on the display portion 5511; and an application for biometric authentication using fingerprints, voice prints, or the like.

[Wearable Terminal]

FIG. 40 illustrates a smart watch 5900 as an example of a wearable terminal. The smart watch 5900 includes a housing 5901, a display portion 5902, an operation button 5903, an operator 5904, a band 5905, and the like.

The wearable terminal can execute an application utilizing artificial intelligence with the use of the semiconductor device described in any of the above embodiments, like the information terminal 5500. Examples of the application utilizing artificial intelligence include an application that manages the health condition of the user of the wearable terminal and a navigation system that selects and guides to the optimal route on the basis of the input of the destination.

[Information Terminal]

FIG. 40 illustrates a desktop information terminal 5300. The desktop information terminal 5300 includes a main body 5301 of the information terminal, a display 5302, and a keyboard 5303.

The desktop information terminal 5300 can execute an application utilizing artificial intelligence with the use of the semiconductor device described in any of the above embodiments, like the information terminal 5500 described above. Examples of the application utilizing artificial intelligence include design-support software, text correction software, and automatic menu making software. Furthermore, with the use of the desktop information terminal 5300, novel artificial intelligence can be developed.

Note that although FIG. 40 illustrates the smartphone and the desktop information terminal as examples of the electronic device, one embodiment of the present invention can also be applied to an information terminal other than the smartphone or the desktop information terminal. Examples of the information terminal other than the smartphone or the desktop information terminal include a personal digital assistant (PDA), a laptop information terminal, and a workstation.

[Household Appliance]

FIG. 40 illustrates an electric refrigerator-freezer 5800 as an example of a household appliance. The electric refrigerator-freezer 5800 includes a housing 5801, a door for a refrigerator 5802, a door for a freezer 5803, and the like.

When the semiconductor device described in any of the above embodiments is used for the electric refrigerator-freezer 5800, the electric refrigerator-freezer 5800 including artificial intelligence can be obtained. Utilizing the artificial intelligence enables the electric refrigerator-freezer 5800 to have a function of automatically making a menu on the basis of food stuffs stored in the electric refrigerator-freezer 5800 and their consume-by dates, a function of automatically adjusting the temperature to be appropriate for the food stuffs stored in the electric refrigerator-freezer 5800, and the like.

Although the electric refrigerator-freezer is described here as an example of a household appliance, other examples of a household appliance include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machine]

FIG. 40 illustrates a portable game machine 5200 as an example of a game machine. The portable game machine 5200 includes a housing 5201, a display portion 5202, a button 5203, and the like.

FIG. 40 illustrates a stationary game machine 7500 as an example of a game machine. The stationary game machine 7500 includes a main body 7520 and a controller 7522. The controller 7522 can be connected to the main body 7520 with or without a wire. Although not illustrated in FIG. 40, a display portion that displays a game image, a touch panel or a stick serving as an input interface besides the button, a rotating knob, a sliding knob, and the like can be included in the controller 7522. The shape of the controller 7522 is not limited to that in FIG. 40 and may be changed variously depending on the genres of games. For example, in a shooting game such as a first person shooter (FPS) game, a gun-shaped controller can be used. For example, in a music game or the like, a controller having a shape of a music instrument, audio equipment, or the like can be used. Furthermore, the stationary game machine may include a camera, a depth sensor, a microphone, and the like so that the game player can play a game using a gesture and/or a voice instead of a controller.

An image displayed on the game machine can be output from a display device such as a television device, a personal computer display, a game display, or a head-mounted display.

The portable game machine 5200 including the semiconductor device described in any of the above embodiments can have low power consumption. Furthermore, heat generation from a circuit can be reduced owing to low power consumption; therefore, the influence of heat generation on the circuit, the peripheral circuit, and the module can be reduced.

Furthermore, when the semiconductor device described in any of the above embodiments is used for the portable game machine 5200, the portable game machine 5200 including artificial intelligence can be obtained.

In general, progress of a game, actions and words of game characters, and expressions of a phenomenon in the game are programed in the game; however, the use of artificial intelligence in the portable game machine 5200 enables expression not limited by the game program. For example, questions posed by the player, progress of the game, time, and actions and words of the game characters can be changed for various expressions.

In addition, the artificial intelligence can construct a virtual game player and thus, a game that needs a plurality of players can be played by only one human game player with the portable game machine 5200, with the use of a virtual game player constructed by the artificial intelligence as an opponent.

Although FIG. 40 illustrates the portable game machine as an example of a game machine, the electronic device of one embodiment of the present invention is not limited thereto. Examples of the electronic device of one embodiment of the present invention include a home stationary game machine, an arcade game machine installed in an entertainment facility (a game center, an amusement park, or the like), and a throwing machine for batting practice installed in sports facilities.

[Moving Vehicle]

The semiconductor device described in any of the above embodiments can be used for an automobile, which is a moving vehicle, and around a driver's seat in an automobile.

FIG. 40 illustrates an automobile 5700 as an example of a moving vehicle.

An instrument panel that provides various kinds of information by displaying a speedometer, a tachometer, a mileage, a fuel meter, a gearshift indicator, air-conditioning settings, and the like is provided around the driver's seat in the automobile 5700. In addition, a display device showing the above information may be provided around the driver's seat.

In particular, the display device can provide the view obstructed by the pillar or the like, the blind areas for the driver's seat, and the like to the driver by displaying an image taken by an imaging device (not illustrated) provided for the automobile 5700. That is, displaying an image taken by the imaging device provided on the exterior of the automobile 5700 eliminates blind areas and enhances safety.

Since the semiconductor device described in any of the above embodiments can be used as the components of artificial intelligence, the semiconductor device can be used for the automatic driving system of the automobile 5700. The semiconductor device can also be used for a system for navigation, risk prediction, or the like. The display device may display navigation information, risk prediction information, and the like.

Although the automobile is described as an example of a moving vehicle in the above, the moving vehicle is not limited to the automobile. Examples of the moving vehicle include a train, a monorail train, a ship, and a flying object (a helicopter, an unmanned aircraft (drone), an airplane, or a rocket). These moving vehicles can include a system utilizing artificial intelligence with the use of the semiconductor device of one embodiment of the present invention.

[Camera]

The semiconductor device described in any of the above embodiments can be used for a camera.

FIG. 40 illustrates a digital camera 6240 as an example of an imaging device. The digital camera 6240 includes a housing 6241, a display portion 6242, operation buttons 6243, a shutter button 6244, and the like, and an attachable lens 6246 is attached to the digital camera 6240. Although the lens 6246 of the digital camera 6240 illustrated here is detachable from the housing 6241 for replacement, the lens 6246 may be incorporated into the housing 6241. A stroboscope, a viewfinder, or the like may be additionally provided in the digital camera 6240.

The digital camera 6240 including the semiconductor device described in any of the above embodiments can have low power consumption. Furthermore, heat generation from a circuit can be reduced owing to low power consumption; therefore, the influence of heat generation on the circuit, the peripheral circuit, and the module can be reduced.

Furthermore, when the semiconductor device described in any of the above embodiments is used for the digital camera 6240, the digital camera 6240 including artificial intelligence can be obtained. Utilizing the artificial intelligence enables the digital camera 6240 to have a function of automatically recognizing a subject such as a face or an object, a function of adjusting a focus on the subject, a function of automatically using a flash in accordance with environments, a function of toning a taken image, and the like.

[Video Camera]

The semiconductor device described in any of the above embodiments can be used for a video camera.

FIG. 40 illustrates a video camera 6300 as an example of an imaging device. The video camera 6300 includes a first housing 6301, a second housing 6302, a display portion 6303, operation keys 6304, a lens 6305, a joint 6306, and the like. The operation keys 6304 and the lens 6305 are provided in the first housing 6301, and the display portion 6303 is provided in the second housing 6302. The first housing 6301 and the second housing 6302 are connected to each other with the joint 6306, and an angle between the first housing 6301 and the second housing 6302 can be changed with the joint 6306. Images displayed on the display portion 6303 may be changed in accordance with the angle at the joint 6306 between the first housing 6301 and the second housing 6302.

When images taken by the video camera 6300 are recorded, the images need to be encoded in accordance with a data recording format. With the use of artificial intelligence, the video camera 6300 can perform the pattern recognition by artificial intelligence in encoding of the images. The pattern recognition is utilized to calculate a difference in the human, the animal, the object, and the like between continuously taken image data, so that the data can be compressed.

[Extension Device for Personal Computer]

The semiconductor device described in any of the above embodiments can be used for a calculator such as a personal computer (PC) and an extension device for an information terminal.

Figure 41A:
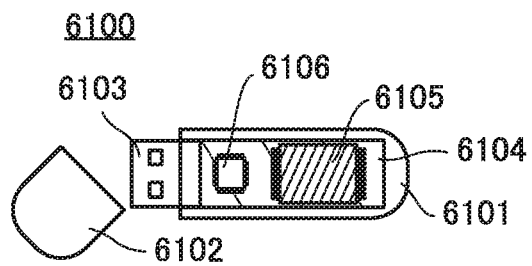
FIGS. 41A to 41C are perspective views each illustrating an example of an electronic device.

FIG. 41A illustrates, as an example of the extension device, a portable extension device 6100 that includes a chip capable of arithmetic processing and is externally provided on a PC. The extension device 6100 can perform arithmetic processing using the chip when connected to the PC with a universal serial bus (USB) or the like. FIG. 41A illustrates the portable extension device 6100; however, the extension device of one embodiment of the present invention is not limited thereto. For example, a relatively large extension device including a cooling fan or the like may be provided.

The extension device 6100 includes a housing 6101, a cap 6102, a USB connector 6103, and a substrate 6104. The substrate 6104 is held in the housing 6101. The substrate 6104 is provided with a circuit for driving the semiconductor device or the like described in any of the above embodiments. For example, the substrate 6104 is provided with a chip 6105 (e.g., the semiconductor device described in any of the above embodiments, the electronic component 4700, and a memory chip) and a controller chip 6106. The USB connector 6103 functions as an interface for connection to an external device.

The use of the extension device 6100 for the PC and the like can increase the arithmetic processing properties of the PC. Thus, a PC with insufficient processing capability can perform arithmetic operation of artificial intelligence, moving image processing, and the like.

[Broadcasting System]

The semiconductor device described in any of the above embodiments can be used for a broadcasting system.

Figure 41B:
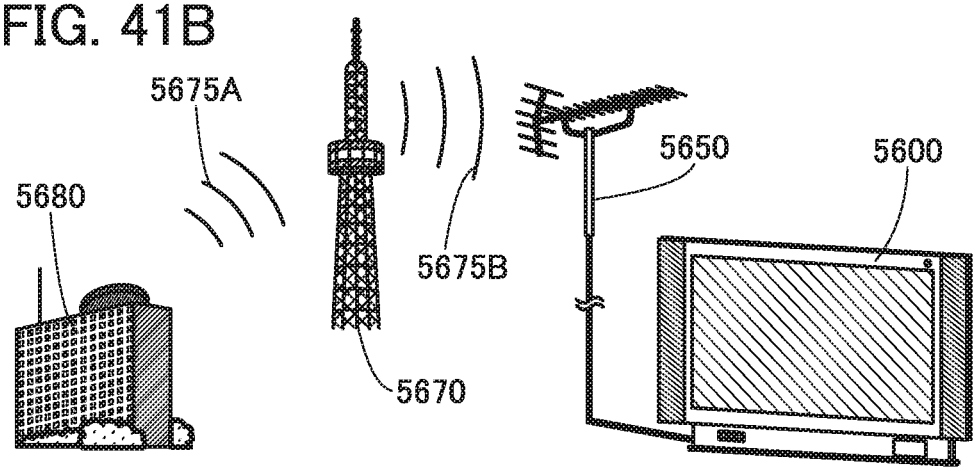

FIG. 41B schematically illustrates data transmission in a broadcasting system. Specifically, FIG. 41B illustrates a path in which a radio wave (a broadcast signal) transmitted from a broadcast station 5680 is delivered to a television receiver (TV) 5600 of each household. The TV 5600 includes a receiving device (not illustrated), and the broadcast signal received by an antenna 5650 is transmitted to the TV 5600 through the receiving device.

Although an ultra-high frequency (UHF) antenna is illustrated as the antenna 5650 in FIG. 41B, a BS/110° CS antenna, a CS antenna, or the like can also be used.

A radio wave 5675A and a radio wave 5675B are broadcast signals for terrestrial broadcasting, and a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting illustrated in FIG. 41B and may be satellite broadcasting using an artificial satellite, data broadcasting using an optical line, or the like.

The above-described broadcasting system may utilize artificial intelligence by including the semiconductor device described in any of the above embodiments. When the broadcast data is transmitted from the broadcast station 5680 to the TV 5600 of each household, the broadcast data is compressed by an encoder. The antenna 5650 receives the compressed broadcast data, and then the compressed broadcast data is decompressed by a decoder in the receiving device in the TV 5600. With the use of the artificial intelligence, for example, display pattern included in the image can be recognized in motion compensation prediction, which is one of the compressing methods of the encoder. In addition, in-frame prediction can also be performed utilizing artificial intelligence, for example. Furthermore, for example, when the broadcast data with low resolution is received and displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K, 8K) broadcasting which needs a large amount of broadcast data.

As an application of artificial intelligence in the TV 5600, a recording device including artificial intelligence may be provided in the TV 5600. With such a structure, the artificial intelligence in the recording device can learn the user's preference, so that TV programs that suit for the user's preference can be recorded automatically.

[Authentication System]

The semiconductor device described in any of the above embodiments can be used for an authentication system.

Figure 41C:
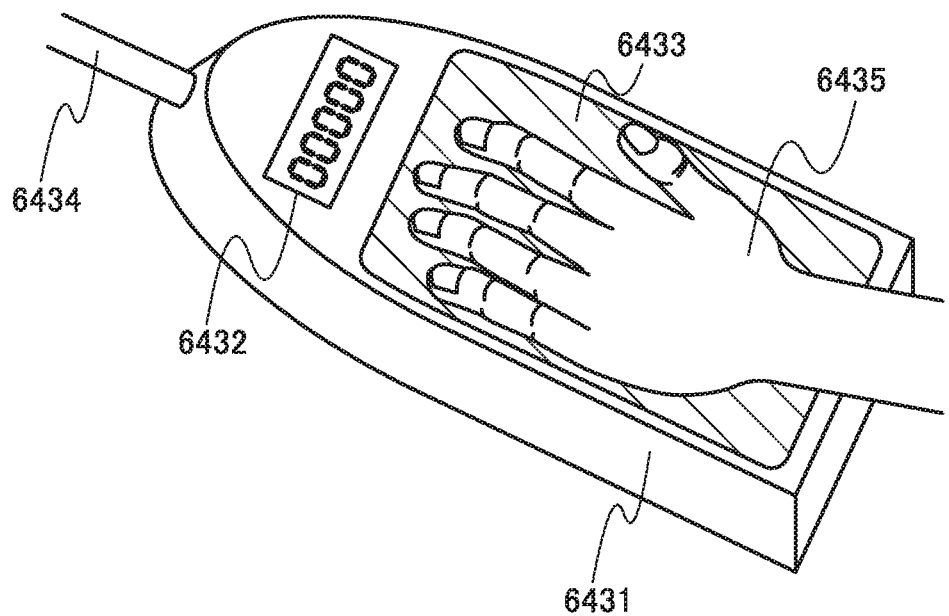

FIG. 41C illustrates a palm print authentication device including a housing 6431, a display portion 6432, a palm print reading portion 6433, and a wiring 6434.

In FIG. 41C, a palm print of a hand 6435 is obtained by a palm print authentication device. The obtained palm print is subjected to the pattern recognition utilizing artificial intelligence, so that personal authentication of the palm print can be performed. Thus, a system that performs highly secure authentication can be constructed. Without limitation to the palm print authentication device, the authentication system of one embodiment of the present invention may be a device that performs biological authentication by obtaining biological information of fingerprints, veins, faces, iris, voice prints, genes, physiques, or the like.

Note that this embodiment can be combined with any of the other embodiments in this specification as appropriate.

This application is based on Japanese Patent Application Serial No. 2018-124122 filed with Japan Patent Office on Jun. 29, 2018, the entire contents of which are hereby incorporated by reference.

What is claimed is:

1. A semiconductor device comprising a first circuit, the first circuit comprising:
a switching circuit comprising:
a first transistor comprising a first gate and a second gate;
a second transistor comprising a third gate and a fourth gate; and
a first inverter circuit; and
a second inverter circuit, a third inverter circuit, and a fourth inverter circuit,
wherein the first gate of the first transistor is electrically connected to an input terminal of the first inverter circuit,
wherein the third gate of the second transistor is electrically connected to an output terminal of the first inverter circuit,
wherein one of a source and a drain of the first transistor is electrically connected to an output terminal of the second inverter circuit,
wherein one of a source and a drain of the second transistor is electrically connected to an output terminal of the third inverter circuit,
wherein the other of the source and the drain of the first transistor and the other of the source and the drain of the second transistor are electrically connected to an input terminal of the fourth inverter circuit,
wherein the switching circuit is configured to change time from output of a signal from the output terminal of the second inverter circuit to input of the signal to the input terminal of the fourth inverter circuit in response to a potential of the second gate of the first transistor, and
wherein the switching circuit is configured to change time from output of a signal from the output terminal of the third inverter circuit to input of the signal to the input terminal of the fourth inverter circuit in response to a potential of the fourth gate of the second transistor.

2. The semiconductor device according to claim 1,
wherein the first circuit further comprises a fifth inverter circuit, and
wherein the switching circuit is configured to control electrical connections between the output terminal of the second inverter circuit and one of the input terminal of the fourth inverter circuit and an input terminal of the fifth inverter circuit, and between the output terminal of the third inverter circuit and the other of the input terminals of the fourth inverter circuit and the fifth inverter circuit in response to a signal input to the switching circuit.

3. The semiconductor device according to claim 1,
wherein the switching circuit further comprises a holding unit, and
wherein the holding unit is configured to hold a potential of the second gate of the first transistor.

4. The semiconductor device according to claim 1,
wherein the switching circuit further comprises a holding unit comprising a third transistor and a capacitor, and
wherein one of a source and a drain of the third transistor is electrically connected to the second gate of the first transistor and the capacitor.

5. The semiconductor device according to claim 1, wherein each of the first transistor and the second transistor comprises a metal oxide in a channel formation region.

6. The semiconductor device according to claim 1, wherein the semiconductor device is configured to perform arithmetic operation of a neural network.

7. A semiconductor device comprising a first circuit, the first circuit comprising:
a switching circuit comprising:
a first transistor comprising a first gate and a second gate;
a second transistor comprising a third gate and a fourth gate; and
a first inverter circuit; and
a second inverter circuit and a third inverter circuit,
wherein the first gate of the first transistor is electrically connected to an input terminal of the first inverter circuit,
wherein the third gate of the second transistor is electrically connected to an output terminal of the first inverter circuit,
wherein one of a source and a drain of the first transistor is electrically connected to an output terminal of the second inverter circuit,
wherein one of a source and a drain of the second transistor is electrically connected to an output terminal of the third inverter circuit,
wherein the other of the source and the drain of the first transistor is electrically connected to a first output terminal,
wherein the switching circuit is configured to change time from output of a signal from the output terminal of the second inverter circuit to input of the signal to the first output terminal in response to a potential of the second gate of the first transistor, and wherein the switching circuit is configured to change time from output of a signal from the output terminal of the third inverter circuit to input of the signal to the first output terminal in response to a potential of the fourth gate of the second transistor.

8. The semiconductor device according to claim 7, wherein the switching circuit is configured to control electrical connections between the output terminal of the second inverter circuit and one of the first output terminal and a second output terminal, and between the output terminal of the third inverter circuit and the other of the first output terminal and the second output terminal in response to a signal input to the switching circuit.

9. The semiconductor device according to claim 7,
wherein the switching circuit further comprises a holding unit, and
wherein the holding unit is configured to hold a potential of the second gate of the first transistor.

10. The semiconductor device according to claim 7,
wherein the switching circuit further comprises a holding unit comprising a third transistor and a capacitor, and
wherein one of a source and a drain of the third transistor is electrically connected to the second gate of the first transistor and the capacitor.

11. The semiconductor device according to claim 7, wherein each of the first transistor and the second transistor comprises a metal oxide in a channel formation region.

12. The semiconductor device according to claim 7, wherein the semiconductor device is configured to perform arithmetic operation of a neural network.

\* \* \* \* \*